US006333656B1

(12) United States Patent
Schober

(10) Patent No.: US 6,333,656 B1
(45) Date of Patent: Dec. 25, 2001

(54) FLIP-FLOPS

(75) Inventor: Robert C. Schober, Huntington Beach, CA (US)

(73) Assignee: NanoPower Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/528,966

(22) Filed: Mar. 22, 2000

Related U.S. Application Data

(62) Division of application No. 09/447,499, filed on Nov. 23, 1999, now Pat. No. 6,198,324, which is a continuation of application No. PCT/US99/26820, filed on Nov. 11, 1999.
(60) Provisional application No. 60/109,958, filed on Nov. 25, 1998.

(51) Int. Cl.[7] ............................................... H03K 3/3562
(52) U.S. Cl. ............................................ 327/202; 327/203
(58) Field of Search ................................... 327/202, 203, 327/208–212, 218

(56) References Cited

U.S. PATENT DOCUMENTS

| 3,751,683 | 8/1973  | Drost ............................ 327/217 |
| 3,845,330 | 10/1974 | Colonel ......................... 327/218 |
| 4,093,878 | 6/1978  | Paschal et al. ................. 327/198 |
| 4,209,715 | 6/1980  | Aoki ............................. 327/218 |
| 4,227,097 | 10/1980 | Piguet ........................... 327/210 |
| 4,334,157 | 6/1982  | Ferris ........................... 327/218 |
| 4,356,411 | 10/1982 | Suzuki et al. .................. 327/203 |
| 4,390,987 | 6/1983  | Best .............................. 370/537 |
| 4,499,560 | 2/1985  | Brice ............................ 365/228 |
| 4,554,467 | 11/1985 | Vaughn .......................... 327/211 |
| 4,591,737 | 5/1986  | Campbell ....................... 327/202 |
| 4,703,200 | 10/1987 | Zangara ......................... 327/211 |

(List continued on next page.)

FOREIGN PATENT DOCUMENTS

| 1-37114    | 2/1989 | (JP) . |
| WO 93/19528 | 9/1993 | (WO) . |

OTHER PUBLICATIONS

W.C. Athas, J. "L." Svensson, N. Tzartzanis, "A Resonant Signal Driver for Two–Phase, Almost–Non–Overlapping Clocks", IEEE International Symposium on Circuits and Systems, May 1996, pp. 12–15.

(List continued on next page.)

*Primary Examiner*—Tuan T. Lam
(74) *Attorney, Agent, or Firm*—Blakely, Sokoloff, Taylor & Zafman LLP; Jordan M. Becker

(57) ABSTRACT

Techniques for providing improved memory flip-flops and other logic circuits are described. A flip-flop uses only one p-channel transistor to drive the output node strongly to achieve fast results. To reduce diffusion area, parallel logic is substantially eliminated and only series branches are used, in critical areas. This allows all pull-up transistors and/or all pull-down transistors to be formed from contiguous active areas. The D-to-Q path is reduced, and the clock is used to control the output. The clock becomes the dominant controller of the output when it is located closest to the output. Placing the clock devices closest to the clocked nodes reduces clock skew. The rising D response time and falling D response time are caused to be as close as possible to reduce the overall cycle time. To reduce parasitics in the circuit, complex-gates are used which are asymmetric. Even multiples of series branches per gate are used to share contacts and eliminate breaks in the layout diffusion. Adding complex-gates to a circuit while using asymmetric gates for smaller layouts achieves additional functionality. One component of the clock, along with the master drive circuit, is used to drive the slave latch of a flip-flop to avoid inserting additional gates into the logic of the fast output path. Reset and set circuitry is designed to be outside the critical path of the clock, and outside the slave latch, to provide rapid Q output response time to the clock and D inputs.

5 Claims, 47 Drawing Sheets

U.S. PATENT DOCUMENTS

| | | | |
|---|---|---|---|
| 4,724,343 | | 2/1988 | Le Roux et al. ........................ 326/64 |
| 4,841,168 | | 6/1989 | Kubota .................................. 327/202 |
| 4,950,920 | | 8/1990 | Hara et al. ............................. 327/257 |
| 4,999,528 | | 3/1991 | Keech .................................... 327/198 |
| 5,036,221 | | 7/1991 | Brucculeri et al. ..................... 326/94 |
| 5,045,801 | | 9/1991 | Mowery ................................. 327/198 |
| 5,212,411 | | 5/1993 | Asazawa ................................ 327/203 |
| 5,281,865 | | 1/1994 | Yamashita et al. ................... 327/185 |
| 5,391,935 | | 2/1995 | Gersbach et al. ..................... 327/198 |
| 5,473,526 | | 12/1995 | Svensson et al. ....................... 363/60 |
| 5,489,865 | | 2/1996 | Colvin, Sr. ............................ 327/198 |
| 5,532,634 | | 7/1996 | Sato ...................................... 327/216 |
| 5,559,478 | | 9/1996 | Athas et al. .................... 331/117 FE |
| 5,576,645 | | 11/1996 | Farwell .................................. 327/94 |
| 5,633,606 | * | 5/1997 | Gaudet et al. ........................ 327/202 |
| 5,646,567 | * | 7/1997 | Felix ..................................... 327/202 |
| 5,668,490 | | 9/1997 | Mitra et al. ........................... 327/203 |
| 5,748,522 | | 5/1998 | Piguet et al. .......................... 365/154 |
| 5,760,627 | * | 6/1998 | Gregor et al. ........................ 327/215 |
| 5,784,384 | * | 7/1998 | Maeno .................................. 714/726 |
| 5,821,791 | | 10/1998 | Gaibotti et al. ....................... 327/202 |
| 5,898,330 | * | 4/1999 | Klass .................................... 327/210 |
| 5,905,393 | | 5/1999 | Rinderknecht et al. .............. 327/202 |
| 5,986,490 | | 1/1999 | Hwang et al. ........................ 327/202 |
| 5,999,030 | * | 12/1999 | Inoue .................................... 327/202 |
| 6,023,179 | * | 2/2000 | Klass .................................... 327/211 |

OTHER PUBLICATIONS

Christian Piguet, et al., "A Metal–Oriented Layout Structure for CMOS Logic", IEEE Journal of Solid–State Circuits, vol. SC–19, No. 3, Jun. 1984, pp. 425, 428–436.

Christian Piguet, "Logic Synthesis of Race–Free Asynchronous CMOS Circuits", IEEE Journal of Solid–State Circuits, vol. 26, No. 3, Mar. 1991, pp. 371–380.

Vincent von Kaenel, et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1722.

J.M. Masgonty, et al., "Technology–and Power–SupplyIndependent Cell Library", IEEE Custom Integrated Circuits Conference, 1991, pp. 25.5.1–25.5.4.

C. Piguet, et al., "Low–Power Low–Voltage Digital CMOS Cell Design", Proc. PATNOS '94, Barcelona, Oct. 17–19, 1994, pp. 132–139.

C. Piguet, "Supplementary Condition for STG–Designed Speed–Independent Circuits", source unknown, pp. 1–5.

Christian Piguet, et al., "Low–Power Design of 8–b Embedded CoolRisc Microcontroller Cores", IEEE Journal of Solid–State Circuits, vol. 32, No. 7, Jul. 1997, pp. 1067–1078.

C. Piguet and J. Zahnd, "Signal–Transition Graph–based Design of Speed–Independent CMOS Circuits", source unknown, 4 pages.

Chrisitan Piguet, "Low–Power and Low–Voltage CMOS Digital Design", MicroElectronic Engineering 39, 1997, pp. 179–208.

* cited by examiner

| # | INPUTS | | | | OUTPUT |
|---|---|---|---|---|---|
| | D | C | B | A | Y |
| 0 | 0 | 0 | 0 | 0 | 1 |
| 1 | 0 | 0 | 0 | 1 | 0 |
| 2 | 0 | 0 | 1 | 0 | 1 |
| 3 | 0 | 0 | 1 | 1 | 0 |
| 4 | 0 | 1 | 0 | 0 | 1 |
| 5 | 0 | 1 | 0 | 1 | 1 |
| 6 | 0 | 1 | 1 | 0 | 1 |
| 7 | 0 | 1 | 1 | 1 | 1 |
| 8 | 1 | 0 | 0 | 0 | 1 |
| 9 | 1 | 0 | 0 | 1 | 1 |
| 10 | 1 | 0 | 1 | 0 | 0 |
| 11 | 1 | 0 | 1 | 1 | 0 |
| 12 | 1 | 1 | 0 | 0 | 1 |
| 13 | 1 | 1 | 0 | 1 | 1 |
| 14 | 1 | 1 | 1 | 0 | 0 |
| 15 | 1 | 1 | 1 | 1 | 1 |
FIG. 12A
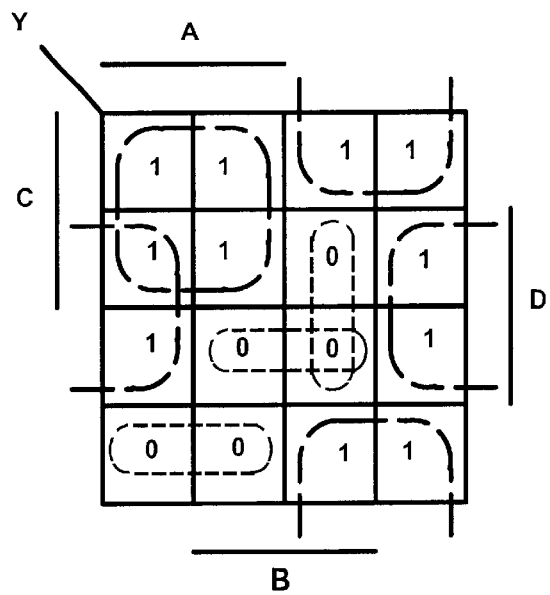
FIG. 12B
FIG. 12C
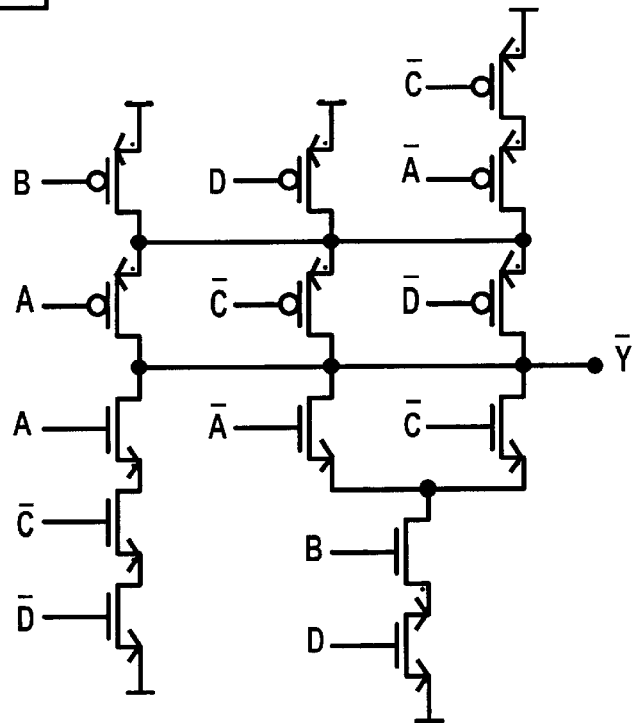
FIG. 12D

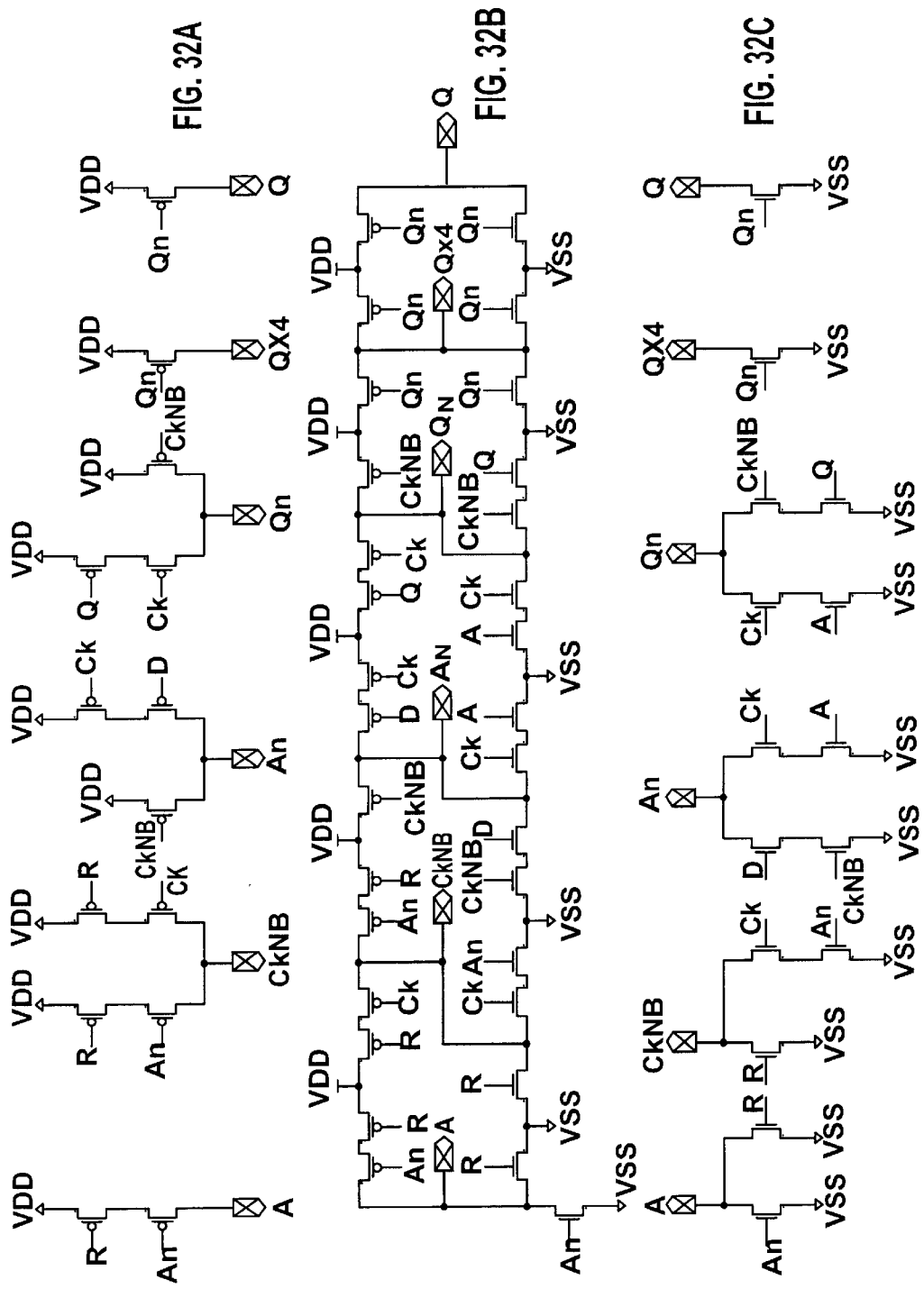

FLIP-FLOPS

This application is a divisional of U.S. patent application Ser. No. 09/447,499, entitled, "Improved Flip-Flops", filed on Nov. 23, 1999, U.S. Pat. No. 6,198,324, which is incorporated by reference herein, and which claims the benefit of U.S. Provisional Patent Application No. 60/109,958, entitled "Memory Flip-Flop and Latch," filed on Nov. 25, 1998, and which is a continuation of International Patent Application No. US99/26820, filed on Nov. 11, 1999 under the Patent Cooperation Treaty (PCT).

FIELD OF THE INVENTION

The present invention relates generally to semiconductor integrated circuits. More particularly, the present invention relates to techniques for providing improved flip-flops, latches, and other logic circuits, and techniques for improving the layouts of such circuits.

BACKGROUND OF THE INVENTION

Flip-flops are the general-purpose data storage element used in digital electronic circuitry. Flip-flops are important to the design of digital circuits, because they are the general-purpose clocked storage elements that make sequential and state logic design feasible. Some of the uses of flip-flops include storage of logic states, parameters, and digital control signals. Microprocessors, for example, typically contain thousands of flip-flops. A few well-known types of flip-flops include D, set, reset, set-reset, JK, toggle enable, and scan type flip-flops.

Because flip-flops may affect the integrated circuits in which they are used, it is highly desirable to improve their design and performance. Flip-flops may affect the integrated circuits in which they are used in the following ways:

1. The switching speed of flip-flops is a fundamental limiting factor of logic circuits. Flip-flop setup and hold times along with clock-to-output times are fundamental limits in setting the maximum logic clocking speed. Because the setup and hold times to store a logic 0 value or a logic 1 value are different, it is generally desirable to minimize the difference in order to reduce the overall switching time of the. flip-flop.

2. Flip-flops are used to set the basic design speed of an integrated circuit cell library from which digital circuits are made. The flip-flop maximum toggle rate defines the maximum clock frequency of the library.

3. Flip-flops define the speed and phase noise of digital phase locked loops;

4. The time gap between the latest usable setup time and the subsequent earliest hold time defines a metastable window. Reducing the length of this metastable window improves the performance of state logic and other synchronous applications.

5. The flip-flop layout configuration defines the cell "height" (rail-to-rail distance) of an entire integrated circuit cell library. An asynchronously resetable edge-triggered data flip-flop is perhaps the most often used large cell in a digital library. Reducing the digital library cell height, as determined by the flip-flop height, directly reduces the chip area and results in less interconnect parasitic effects.

6. The transient power consumption of a flip-flop is instrumental in setting the width of the power busses required in the cell library's layout so that adequate power can be supplied for a given transient voltage drop.

7. The energy a flip-flop consumes during toggling and the load it places on the clock input line is a significant contributor to the overall circuit power dissipation.

8. The flip-flop switching speed defines the time window in which transient current passes through its complementary switching devices. Faster switching produces less pass through charge for lower power operation. Low activity within the flip-flop when it is clocked but not toggled also reduces power consumption.

9. Race conditions during flip-flop toggling add to the pass-through current. Eliminating the race tends to eliminate the current component.

10. Switched capacitance internal to the flip-flop is a major transient current component. A flip-flop in which switched capacitance is minimized has less switching current while achieving high switching speeds.

11. The ratio of the transistor switching strength to the amount of the switched parasitic capacitance determines the flip-flop's internal speed.

12. A small number of series gate delays from the data (D) input of a flip-flop to the output (Q) is desirable for fast setup and hold times. A small number of series gate delays from clock (CK) to output (Q) provides fast flip-flop response time.

13. A balance in the delay paths from the data (D) and clock (CK) inputs to the output (Q) reduces the asymmetric delay times. The difference between the positive and negative going response times should be included in the flip-flop's switching time specification. It also biases the probability the switching response to random inputs for circuits that synchronize random signals.

14. A small number of series devices driving the output path, especially weaker p-channel devices, increases the output drive and thus reduces transition time.

15. A minimum of two series transistors is required to implement a logic function. By using this number of series transistors as a maximum in a flip-flop, its power, speed, area, and low voltage performance are improved.

16. The low voltage performance of a flip-flop generally defines the minimum operating voltage of logic circuitry. This not only allows low voltage operation, but greatly saves power dissipation by a square law given by $P \sim V^2$.

17. The static power dissipation of ultra low power integrated circuits is from the "off" state leakage current of the metal-oxide semiconductor (MOS) transistor leakage currents as well as the MOS diffusion areas. It is desirable to minimize these parameters.

18. Advanced flip-flop configurations can simplify the logic that is connected to them. This extends the logic circuit operation and functionality and reduces the delay and total area consumed.

For these and other reasons, it is desirable to have improved flip-flop configurations and design techniques and related digital logic circuitry.

Flip-flops are generally made of latches. Latches typically form the master or slave half of an edge-triggered flip-flop, or both. Thus, a flip-flop is often constructed from a master latch and a slave latch, in which the output of the master latch is the input of the slave latch, and the output of the slave latch provides the output of the flip-flop. Instead of being edge-sensitive to the clock control input, latches are level sensitive to a clock equivalent control input customarily called "enable." When the enable control signal is active, the latch accepts the logic-input signal on the data line. During this time, the data input signal is passed through to the output Q, which is known as the pass-through state of the latch. When the enable control signal is in the inactive condition, the data input line is locked out of the latch, and the Q output reflects the logic state contained in the latch at the time the enable signal was taken low. Latches have a similar impact as flip-flops on the integrated circuits in which they are used. They are often used in an array such as a register file, where they have a special data path layout that shares resources. Special design and layout considerations enhance their use in this.

FIG. 1 shows a very simple form of a static latch cell, which is a pair of cross-coupled inverters. Overdriving the latch outputs, using additional transistors, performs the set and reset control. This approach with address selection transistors can be used to form static Random Access Memory (RAM) cells. FIG. 2 shows a Set-Reset latch formed by replacing the inverters of FIG. 1 with NOR logic gates. Replacing the inverters with NAND logic gates forms an active-low SetN-ResetN cross-coupled latch. Note that with respect to the Q and Qn outputs, the NAND gate SetN and ResetN inputs are on the opposite gates from the NOR gate Set-Reset latch.

The design of the flip-flop is the fundamental starting point of an integrated circuit library. First, the desired speed/power-consumption tradeoff is chosen. The flip-flop is then designed to meet this criterion using an estimated output loading. This output loading is based on the routing complexity and the expected integrated circuit core size. The proportions of the flip-flop and other cell sizes, which are being designed in this process, set this in turn. Iterative processes of estimation, simulation, and back-annotation are used to arrive at the solution. Through the cell library design, the speed and power consumption are set, and thus, the speed and power performance of the library are set along with the entire integrated circuit. Thus, the flip-flop is the dominant factor in the size and performance of a digital or mixed mode integrated circuit.

Interconnect parasitic effects have become more dominant as integrated circuit process feature size has decreased. The pitch is closer, but the interconnect is becoming relatively thicker to keep cross sectional resistance low as required for the high speed. This combination greatly increases the internodal parasitic capacitance. Many layers of metal for interconnect and power distribution are commonplace making this interconnect parasitic loading the real limiting factor. Hence, reduced chip size is a very desirable commodity. The goal is to make the library more dense, and density of the flip-flop is therefore a key to accomplishing this, since the flip-flop sets the cell row pitch of the library. The goal is to use of the entire occupied chip area for compact active area and to minimize employment of chip area used just for interconnections inside or outside of the cells. Cells that are rarely used should be kept at the same cell height by making them wider to accomplish interconnection. Shared active area power between cells increases density and their use can be incorporated into routers.

When the two clock phases of the sequential latches in a flip-flop get too close together, there can be a critical "race" between the master latch and the slave latch that is produced by the data and the clock that controls them. Suppose that the master latch is in the mode of holding the flip-flop-input data acquired from the previous clock phase. In this mode, the slave latch is in its transparent (or pass-through) mode. This means that the slave latch passes the data being held by the master latch through to the flip-flop's Q output. When the clock state is reversed, the master latch switches from its hold mode to its acquire new data (or pass-through) mode. At the same time the slave latch changes from acquiring the master latch's output data to its hold mode. The slave latch must switch to its hold mode first or the flip-flop's Q output can change state here in the middle of its cycle. In other words, the slave latch must switch to its hold mode before the master latch switches to its sample mode and passes new data through to the slave latch Q output.

Various approaches can be used to control this race condition. For example, separate non-overlapping clock signals can be used to separate the clocking times of the master and slave latches from each other. This is not normally practical due to the extra interconnect and signal generation required, as well as the extra time it takes to guarantee its operation in its worst case conditions. Alternatively, flip-flops can be designed with an internal speed bias to drive this race condition to the correct direction. This bias must be guaranteed to produce the correct results in the worst-case conditions, including slow clock transitions and minimum operating power supply voltage. It often has to operate correctly as a battery is depleted. Third, the logic within the flip-flop can be designed to eliminate the race. This may be the most desirable approach. Here, the flip-flop's internal logic steps through two sequential states. The first state places the slave latch into the hold mode. Then, from this logic state, proceed to another logic state that switches the master latch to its acquire mode. This sequential state operation guarantees that this critical race is avoided. In other words, the master output signal, where the race occurs, is preventing activating the slave by gating it with the clock. This type of design has been referred to as a "race-free" flip-flop. It is desirable to have improved race-free flip-flop designs.

Low voltage performance is an important feature of flip-flops. As process dimensions are reduced, the physical dimensions that separate two voltages decrease. The gate oxide thickness is decreased along with the active area dimensions making up transistors. Accordingly, the electric field approaches the dielectric breakdown limit of the $SiO_2$ gate insulator between gate and drain. To avoid breakdown, the power supply voltage must be limited. For current technology, this scaling means that for a 0.1 micron source-drain spacing, the physical voltage that the transistor can tolerate is limited to 1.0 volt. In order to switch quickly and efficiently, CMOS transistor thresholds are normally set to be one quarter of the power supply voltage to provide a n-channel threshold, a p-channel threshold, plus an additional amount of voltage to guarantee high saturated drive of these transistors during their active switching operation. If the power supply voltage is lowered below one volt, not only is there insufficient voltage for circuit headroom, but there is not even enough voltage to fully turn the transistors on.

One possible approach is to lower the threshold voltages by shifting the device characteristics in voltage for lower thresholds. This results in transistors that do not fully turn off. The MOS drain current around the off state is exponentially related to the gate voltage. Here, the MOS device is in the weak inversion region of operation. To decrease the voltage distance between off and on transistor operation, the slope (or gain) of the transistors must be increased. Higher gain MOS devices have always been a device design goal, so that approach will not likely be fruitful. Some processes, such as Silicon-On-Insulator (SOI), can increase the weak inversion slope factor (gain), which lowers the off state leakage current, but device designs that address this are not presently known. Only minor effects can be made to increase the slope of the turn-on curve, such as the back gate from the well body below the device. The outcome is that circuits that perform better at low voltage are extremely important. Flip-flops can also be subject to internal race conditions. In particular, note that the output of an edge-triggered flip-flop is not valid when there is a transition of the output logic states. As mentioned above, flip-flops are typically made up of two latches, e.g., a master latch and a slave latch. The master latch is used to sample the input data signal. The slave latch is used to hold the output so that it is valid at all times except for logic transitions. In order to accomplish this, the two latches are clocked out of phase from each other. Two non-overlapping clock signals need to be used for this, one for the master and one for the slave. These non-overlapping clock signals have the disadvantage of requiring generation and distribution of two clock signals, along with their complements. Their worst-case timing tolerances limit the maximum clocking rate and thus the flip-flops maximum useful speed, not to mention the relatively large area, power, and complexity incurred in achieving this.

Another important type of device commonly used in electronic circuitry is the complex-gate. Complex-gates are device-level simplifications of combinations of logic gates used to derive a logic output function. Complex-gates reduce the number of switching devices and internal nodes within the gate. FIGS. 3D and 3F show an example of a complex-gate, representing a selector (multiplexer). In particular, FIG. 3D shows a logic gate representation and FIG. 3F shows a schematic representation, in which the intermediate nodes are removed. FIGS. 3A, 3B and 3C show a graphical reduction from the standard logic into a complex-gate. FIG. 3E is a schematic diagram of the selector for the non-complex-gate implementation.

Nodes within the complex-gate which appear in the logic diagram and are not used as outputs are often eliminated. The advantages of eliminating complex-gate internal nodes include the following:

1. Propagation delay from any input to the output is one gate delay instead of multiple gate delays. This results in faster gates, although the more complicated complex-gate delay is somewhat slower than a single gate delay.

2. Equalization of propagation delays—There is only one complex-gate propagation delay from any input to the output. Normal gate combinations of the same logic function have a variable number of gate delays from different inputs to the final output. However, different inputs can have different output drive strengths if the individual complex-gate transistors are not sized to compensate for this.

3. Elimination of node bounce as logic signals propagate through the levels of logic in the array of gates that are being replaced by a complex-gate—Temporary intermediate logic states exist from propagation delays through the array of gates. By eliminating the nodes within the array of gates through conversion to a complex-gate, there are no nodes to bounce. This technique lowers the power consumption from the additional nodes, especially when the lack of gate output bouncing is realized.

4. Lower power consumption and faster speed due to only one output node and no internal nodes of the complex-gate.

5. Lower power consumption, smaller area, and faster speed offered by fewer switching devices within the complex-gate.

6. Lower power consumption and faster speed offered by less internal interconnect within the complex-gate—Strap connections that form internal nodes by connecting the n- and p-channel devices together are eliminated.

7. Tighter gate structure layout—This is particularly advantageous in newer technologies. They offer many levels of interconnect to get logic signals into the complex-gate. These newer technologies define the logic cell area primarily by the active area on which the gates are formed, since the internal interconnect within the gate layout is above, in the multiple-level metal interconnect. In the older one- and two-metal level integrated circuit processes, the use of large complex-gates was restricted by the routing congestion of a high concentration of input wires into the complex-gates. With numerous levels of routing interconnect, this restriction is eliminated, and the advantages of complex-gates can be fully realized.

8. In some newer technologies such as silicon on insulator (SOI), the spacing between complementary devices is eliminated, since there are no wells for isolation. Complex-gates can take better advantage of this to reduce the cell area and internal cell interconnect.

Complex-gates have not been widely used in the past, because the advantage of reduced cell layout area is often offset by the congestion of signals routed to the complex-gate when the cell is used. An array of gates distribute interconnect, preventing this. However, when multiple levels of metal interconnect are considered, complex-gates become more attractive. This is especially true when it is realized that the active area used by the gates is greatly reduced by the use of a complex-gate. In addition, a high density of cell I/O pins placed within a multi-level metal complex-gate cell does not necessarily increase the cell area. Previously, each complex-gate input needed a Metal-2 track width to enter the cell in a two-metal system. Because of this, most integrated circuit logic cell libraries do not contain many and larger complex-gates. Thus, the art of complex-gates has not been well developed.

SUMMARY OF THE INVENTION

Another aspect of the present invention is a flip-flop that is settable or resetable in response to a control input. The flip-flop includes a master latch, a logic gate, and a slave latch. The master latch receives an input of the flip-flop and the control input. The logic gate is coupled to receive an output of the master latch and the control input. The slave latch is coupled to the master latch and an output of the logic gate but does not receive the control input for setting or resetting the flip-flop.

Yet another aspect of the present invention is another flip-flop that is settable or resetable in response to a control input and includes a master latch, a logic gate, and a slave latch. The master latch, the logic gate, and the slave latch are each responsive to a clock signal. The master latch and the logic gate each include a first transistor branch for pulling a corresponding node to a first logic level in response to an active edge of the clock signal. In addition, the master latch and the logic gate each also include a second transistor branch for pulling the corresponding node to a second logic level in response to an inactive edge of the clock signal. In each of the master latch and the logic gate, the control input for setting or resetting the flip-flop is input to the second transistor branch but not the first transistor branch.

Still another aspect of the present invention is a scan flip-flop that includes a slave latch and a master latch that has a built-in scan selector for switching the flip-flop between a scan mode and a non-scan mode in response to a scan control input.

Another aspect of the present invention is a flip-flop that includes an output buffer, a master latch, and a slave latch, in which the slave latch requires only one p-channel pull-up transistor to drive its output signal to the output buffer.

Yet another aspect of the present invention is a set-reset flip-flop that has a master latch receiving an input of the flip-flop, and a slave latch coupled to an output of the master latch. Each of the master latch and the slave latch includes a number of pull-up transistor branches for pulling at least one corresponding node up to a first logic level and a number of pull-down transistor branches for pulling each of the nodes down to a second logic level. Each of the pull-up transistor branches and each of the pull-down transistor branches in each of the master latch and the slave latch includes no more than two transistors that have their source-drain paths connected in series.

Other features of the present invention will be apparent from the description which follows.

BRIEF DESCRIPTION OF THE DRAWINGS

The present invention is illustrated by way of example by the accompanying drawings, in which like references indicate similar elements, and in which:

FIGS. 12A through 12D show the development of a conventional complex-gate from a truth table definition of the example logic function, through a Karnaugh Map reduction, a logic gate description, and a transistor schematic;

FIGS. 32A through 32C show a modified schematic representation of the flip-flop of FIG. 15 that may be used to achieve an improved layout;

DETAILED DESCRIPTION

Figure 1:
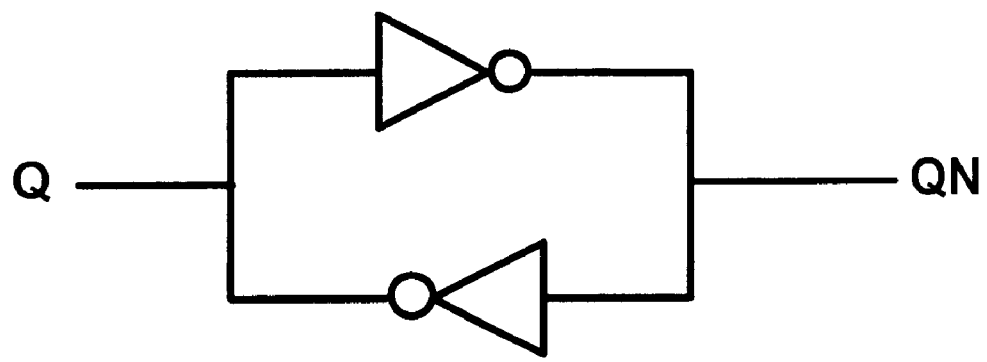
FIG. 1 shows a simple form of a static latch cell.

This description includes improved flip-flops, latches, and other circuits, and techniques for providing improved layouts of such circuits.

I. Overview

In one embodiment described herein, a flip-flop uses only one p-channel transistor to drive the output node positive as strongly as possible, and two series n-channel transistors for a similar negative drive to achieve fast results from the circuit. In order to minimize diffusion, parallel logic switching elements are eliminated in many embodiments, and only series branches are used in critical areas. The data input (D) to output (Q) path delay is substantially reduced, and the clock is used to directly control the output. In serial devices, the clock becomes the dominant controller of the output if it is optionally located closest to the output node. Placing the clock transistors next to the output and clocked nodes reduces clock delay. The rising and falling D response times are constructed to operate with similar delays in their respective directions to reduce the overall cycle time. To reduce parasitics in the circuit, complex-gates are used which make use of series-only switching elements; the switching elements may be asymmetric, in that the pull-up network is not the DeMorgan's complement (series-parallel complement) of the pull-down network, but a logical complement. The clock is logically NAND gated with the master latch output to drive the critical pull-up slave latch output branch through a single p-channel transistor instead of the physical combination of p-channel transistors. This avoids using additional transistors into the logic pull-up branch for the fastest output pull-up.

Even numbers of series branches are used to prevent breaks in active area (diffusion), resulting in continuous chains of transistors within the flip-flop cell. Dual-finger, "U", or "donut" transistors may be used to keep active area contiguous and reduce output nodal capacitance. This approach facilitates a minimum-spaced, orderly placement of transistors that can be efficiently connected to the complementary transistors. Devices are ordered for direct connection in most cases. The flip-flop is designed to have similar stack length for both n-channel and p-channel transistors. This technique efficiently uses the area within a cell, resulting in minimum parasitics and cell area.

Reset and set devices are kept out of the critical output-driving branches of the slave latch complex-gate for maximum performance at an overall small size. These critical output-driving transistors do not have to increase in width to accommodate the additional reset/set series impedance of previous art.

In more-developed embodiments, the reset and set control signals are kept out of the critical driving branches of the slave latch by overruling the internal clock to connect the master to the slave latch. Here the reset/set master data is passed through to the slave latch in a normal manner. The method of implementing this does not add series transistors to active edge clock logic driving branches. In a reduced device count version of this technology, a race-free flip-flop is reset at a single point by controlling only the output of the race-free NAND gate.

The incoming clock is buffered with a minimum size inverter to lessen the load on the clock line. This approach produces a slower but controlled critical clock active rising edge. This edge is followed by a fast clock-bar (clock-not) signal, which starts its negative swing early. This minimizes the delay between the clock signals and has the later clock-bar signal overtake the earlier clock signal near the active midpoint amplitude of its switching waveform. This produces essentially a zero-delay inverter for the critical edge. Ratioing and special constructs of the pull-down transistor enhance this "coincident-clock" design. These and other considerations, such as donut shaped transistors, produce all four essentially identical setup and hold times for both zero and one conditions resulting in high in-circuit flip-flop speed with minimal error rates.

A negative going edge for the clock input pin is chosen as the active edge for certain embodiments. This is done because the n-channel transistors in the clock distribution tree tend to pull this clock down about three times faster than equivalent size p-channel transistors can pull this clock up.

The active pull-up branch of the slave latch output is reduced from the normal two or more series devices to a single pull-up device. To balance this drive strength, two series pull-down devices are used. To accomplish this, the normal pull-up series devices are moved from the output gate back into the clock inverter. The similar device from the master latch is also pulled into the clock inverter, where they become the same device. In this way, the inverted clock signal is eliminated, resulting in a flip-flop with a single-phase clock that has its race hazard with the master latch output eliminated. Through this technique, slow clocks incurred in very low voltage operation, or for other reasons, do not cause an error in flip-flop operation. This operation is race-free and this class of flip-flops is therefore called "race-free."

Metastable response time is significantly reduced within these flip-flop structure designs. This is because internal circuit operates rapidly, races are eliminated, input to output delays are short, and the methods of passing the master signals to the slave latch force it to a rapid decision.

Additional flip-flop input logic may be included in the master latch so as to decrease the overall circuit complexity by using complex-gates. Such logic can include: scan logic, toggle enable functions, input multiplexers, J–K functions, synchronous reset and set, and miscellaneous complex-gate functions preceding the D input.

Eliminating unused elements of the cell yields reduced versions of the flip-flop. This occurs when the flip-flops are used in restricted ways, such as logical one-shots, clock synchronizers, phase comparators, etc. These configurations are optimized further due to their limited operation. An example is when the D input is tied to a logical one to pick up the first clock and ignore additional clocks, and then cleared for the next operation through the asynchronous-reset.

The data path through the flip-flop is arranged to produce a first Q output, which is inverted and has substantial drive. This provides a very quick Qn output. A highly buffered Q output is obtained with only one additional gate delay. Because there is substantial drive strength it is possible to have a buffer larger than normal without a loss in speed, to drive output lines fast.

The reset and set functions may be reversed when the input data logical sense is reversed thus making the flip-flop a Dn flip-flop or likewise an inverter can be added to the data input. This allows for a choice of optimum flip-flop operation.

The techniques described herein provide for the generation of improved electronic circuit layouts, particularly with respect to edge-triggered, D flip-flop circuits. The described techniques provide the following advantages, among others:

1. Reduced layout areas. This factor enables a greater number of circuits per unit area on the integrated circuit chip or enables the reduction of overall chip size. A smaller size for the reduced layout areas reduces the size of the entire cell library, all circuits of which have the same height.

2. Increased circuit speeds. By reducing the size of the overall layout and providing for improvements such as symmetric circuit layout and a Coincident Clock Generator, the setup and hold time for flip-flop circuits can be significantly reduced. However, it will be recognized that increasing the speed of circuits generally increases the heat output of the chip. The thermal effects of heat generally are undesirable, since they limit the size of the chip package and reduce the reliability of the chip.

3. Reduced power consumption. The improved layout permitted by the described techniques reduces power consumption in at least two ways. First, the improved layout directly affects a cell by reducing parasitic effects within the cell due to junctions and interconnects within the cell. Second, the improved layout generally reduces the cell height and thus reduces the overall CHIP area required for routing cells and interconnects.

As described above, a flip-flop is a self-contained circuit in which the circuit designer has control over the elements. In order to improve the performance of a circuit such as a flip-flop, designers must generally increase device sizes within the circuit to internally drive the circuit with respect to internal parasitic effects. Normally, the internal parasitics of a cell increases in direct proportion to the size of transistors in the cell. The techniques described herein provide for the optimization of the internal logic design of a flip-flop to maximize the drive, minimize the parasitics, and improve the response.

The techniques described herein include the following, in connection with MOS technology (note that the described techniques also apply to dynamic circuits):

1. Use only one p-channel transistor to drive the unbuffered output. By avoiding series p-channels, it is possible to drive the output node as strongly as possible to achieve fast results from the circuit. It is generally acceptable to have two n-channels in series, since combined they have a drive strength about equal to one p-channel.

2. Use a single-stage inverter to buffer the flip-flop output. This inverter is driven by the single active p-channel circuit. Further, build this inverter out of an even number of poly fingers, in order to incorporate it within a contiguous active area of the flip-flop cell.

3. Reduce or eliminate series parallel logic. In order to minimize diffusion, since it typically has the most capacitance, parallel logic is substantially reduced or eliminated and only series branches are used in critical areas.

4. Reduce the D to Q path. By reducing the D to Q path to the minimum number of stages, it is possible to achieve faster overall cycle times. However, although the overall cycle time may be shortened, there may be an increase in the metastable time of the circuit due to a minimum number of series stage gains. Metastable time generally includes the time for the setup and hold to complete for the critical elements the circuit. Metastable time is worsened by the race time that causes both N and P-outputs to be on at the same time.

5. Use the clock to directly control the output. By placing the clock transistor closest to the output and using only the minimum number of devices in the output transistor stack, the parasitics that are active during critical transition times are reduced. The clock becomes the dominant controller of the output if it is located closest to the output. This is meaningful in ensuring that the output result is available as soon as possible once the clock signal has arrived.

6. In race-free flip-flops, place the clock inverter transistors next to the gated clock node. By optimally placing the clock transistors next to the gated clock node, it is possible to reduce clock skew.

7. Drive the critical edge of the inverted clock signal as fast as possible. This makes the critical direction of the inverted clock catch up to the earlier clock signal at the halfway voltage where the output switching is at its most active threshold point. This effectively makes a zero-delay inverted for the critical edge only.

8. On the inverted clock node, the sum of many small considerations can be significant: Minimize the load capacitance on the inverted clock node by means of dual, "donut", U-shaped, or L-shaped transistors (i.e., the gate polys) with minimum output node diffusion, minimize internal hook up capacitance, and use minimum width complementary transistors with minimum output diffusion area. Also, internal routing of this inverted clock node next to signals that aid rather than hinder through inter-node capacitive coupling the active clock transition. To aid in understanding this inter-node coupling, it is noted that in at least one embodiment of the race-free flip-flop core design, this inverted clock signal's active negative-going edge occurs only when the Qn output is pulled up, while in the symmetric-serial flip-flop core, the active-low clock signal is an inversion of the clock.

9. Ratio the inverted clock driver so that the effective inverter threshold is as close to the input starting voltage as possible. This causes the inverted clock transition to begin much earlier, to help produce the zero-delay inverter.

10. Provide a final coincident clock generator adjustment by ratioing (i.e., selecting gate width and length ratios for the transistors of) the input clock buffer, so that the internal buffered clock is a controlled amount slower than normal inverter to allow the next internal (inverted clock) to catch up at the half-way voltage, to approach an ideal complementary clock at their critical edges. This is fundamental to symmetric D=1 and D=0 setup and hold responses as well as lowering the pass through current consumed in the output transistor stack where a large part of the dynamic power is dissipated.

11. Design the rising D response time and falling D response time to be as close to each other as possible with respect to the clock. Since the difference between the rising time and the falling time is lost time, the overall cycle time can be reduced by having the resulting flip-flop output from the rising D time and falling D time be as close as possible. Layout parasitics can also be used to help equalize the times.

12. By having the input data (D) transistors close to the master latch output node, the latest possible D input is latched for the fastest D to Q setup and hold times.

13. Maximize the active direction slope of the internal inverted clock signal. This signal is typically driven at least twice as fast in the active direction as compared to the non-active direction.

14. Use asymmetric complex-gates that increase the use of serially connected switches. As described elsewhere in this application, complex-gates are active, as opposed to transmission gates which are passive, and have lower device resistance due to the full gate to source drive voltage not being reduced by the threshold voltage. This is aided by the fact that complex-gates have gain, while transmission gates have attenuation. Use of asymmetric complex-gates reduces parasitic effects within the circuit. Adding complex-gates to a circuit, and using asymmetric gates for smaller layouts may achieve additional design flexibility.

15. Use one component of the clock combined with the master latch output, to drive the slave pull-up. Since one stage of the clock has only the slave tracking the master, using one component of the clock along with the master latch output avoids inserting additional gates into the logic of the fast output path.

16. Use a low internal activity flip-flop to save power.

17. Use the reset and/or set signal to override the inverted clock signal for connecting the master latch output to the slave latch input so that the reset or set master latch data is passed to the slave latch. This avoids the use of additional gates in the slave latch which perform the reset and/or set function.

18. Limit the number of series transistors to two. This produces strong drive strengths relative to load capacitance within the cell. In some more integrated types of cells, such as scan multiplexed flip-flops, this approach is not practical. The second type of tradeoff is to limit the p-channel transistors to two while using three or four n-channel devices, because the n-channel devices produce higher drive strengths per size of transistor, due to their higher mobility.

Complementary Switching Devices

The current high volume production integrated circuit technology is mainly Complementary Metal Oxide Semiconductor (CMOS) technology. This technology is made up of complementary switching MOS transistors: N-channel MOS transistors are functionally switches that are turned on when their input is in the high or "1" logic state and off or an open circuit state when their input is in a low or "0" logic state. In order to operate at voltage levels that can turn the transistors on and off and prevent forward biasing their n-channel device source-drain diodes, they are used in the pull-down side of MOS switching circuits (i.e., to pull a voltage down to ground or some other reference voltage). P-channel MOS devices operate in a complementary manner. They are effectively switches that are turned on when their input is in the low or "0" logic state and off or an open circuit state when their input is in a high or "1" logic state. In order to be able to turn them on and off and prevent forward biasing their p-channel device source-drain diodes, they must be used in the "pull-up" side of MOS switching circuits (i.e., to pull a voltage up to a positive supply voltage or other voltage level).

When the inputs and outputs of n- and p-channel devices are tied together, they form an inverter (a logic "1" input produces a logic "0" output and a logic "0" input produces a logic "1" output). Because they operate as complements to each other, they can be wired together in this manner. From this principle, logic gate outputs are inverting. The complementary aspects also have the advantage of always having one or the other of the devices in their off or open circuit condition. This maintains an open circuit from one power supply to the other except during the brief switching time. Only an infinitesimal off condition leakage current exists. This is normally small enough to be ignored. With no DC path, the static current drain is eliminated resulting in a low DC power consumption. The remaining AC power drain component results from switching between logic states: 1) when the logic states are changed, the capacitance on the circuit nodes has to be charged or discharged as appropriate, and 2) there is a brief time when both switches are turned on resulting in transient current component through the MOS transistors.

Complex switching functions are defined by connecting together series and parallel combinations of these MOS switches. N-channel transistors are turned on with a logic "1" input. Hence, in a logic gate, the n-channel series-parallel circuit defines the logic function. The n-channel MOS transistors are connected in such a manner as to provide a path from the output to the low or "0" logic power supply. When the function is true, n-channel devices are turned on to provide a conduction path to this low power supply. Conversely, the p-channel devices supply a path to the high or "1" power supply when the logic input function is false. This p-channel pull-up (top portion of the gate) is constructed from the DeMorgan's complement of the n-channel pull-down (bottom of the gate). By using the complement array of transistors, one array of MOS transistors will be off while the other array is on, so as to not produce a DC path from one supply to the other.

From the simple to the complex, these arrangements of MOS transistors are used to construct logic inverters, buffers, ordinary logic gates, multi-functional logic gates (commonly known as complex-gates), multiplexers, demultiplexers, transmission gates, transmission gate logic, data latches, edge triggered flip-flops, adders, and higher order functions including computer Arithmetic Logic Units (ALUs).

Logic Gates

Simple logic gates are an extension of the inverter, and therefore, they are realized in the inverting form. Here, the output is active low for the active combinations of logic inputs. NOR gates have parallel pull-down switches for each of the logic-input signals, and series pull-up for the series-parallel complement for the pull-up switches. NAND gates are the opposite—series pull-down switches and parallel pull-up switches.

There are more complicated forms of logic gates like exclusive OR, exclusive NOR, majority gates, parity gates, selectors/multiplexers, adders, and various AND-OR gate combinations. These can be implemented with a combination of simple gates or using complex-gate arrangements.

Complex-Gates

Figure 3A:
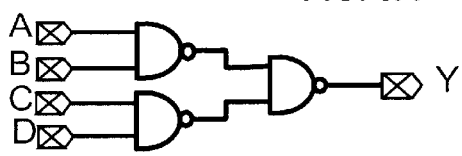
FIGS. 3A through 3C show a graphical reduction of logic used for a selector into a complex-gate.
Figure 3B:
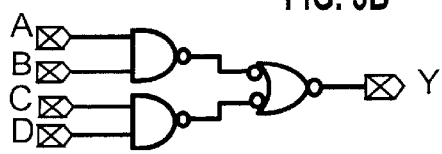
Figure 3C:
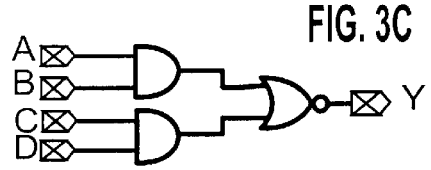
Figure 3D:
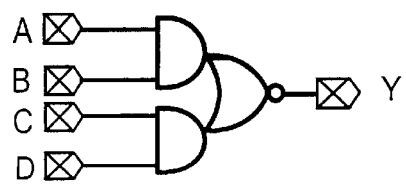
FIG. 3D is a complex-gate resulting logic symbol.
Figure 3E:
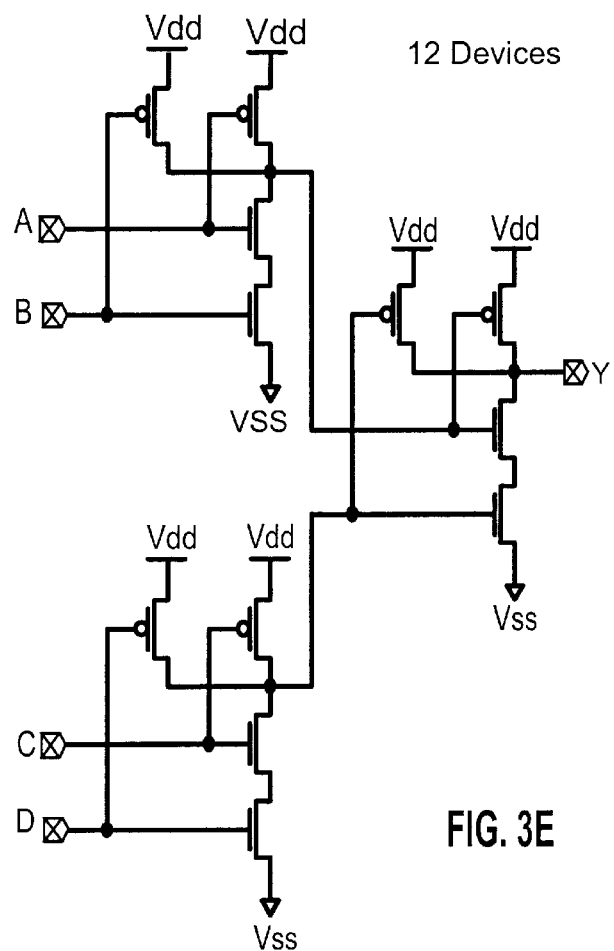
FIG. 3E is a schematic diagram of a selector.
Figure 3F:
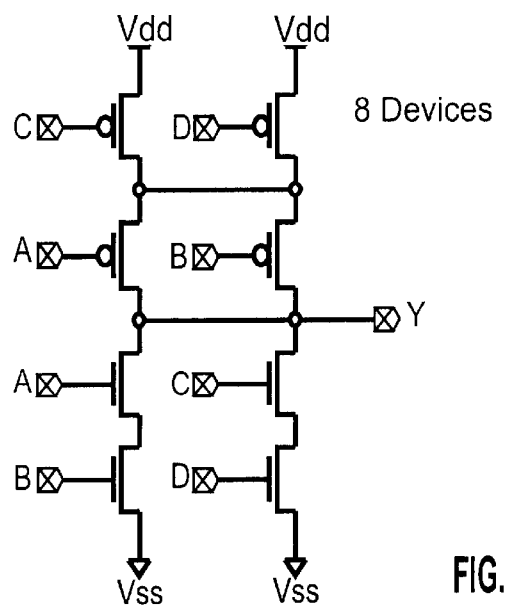
FIG. 3F is a schematic diagram of a selector configured as a complex-gate.

A complex-gate is the equivalent of a group of AND/OR gates that do not have their intermediate logic signals taped for intermediate outputs. An example of a complex gate is shown in FIGS. 3D and 3F. Since these internal nodes between the gates do not exit the logic function, their physical nodes can be eliminated through a combination of series and parallel switches. Not only are the total nodes reduced, but also the total number of switches is reduced. Intermediate node bounce is eliminated. As with simple logic gates, their output is also realized in the inverted form or negative true for the satisfied combination of logic input signals.

Latches

A simple form of latch is a cross-coupled pair of inverters, such as shown in FIG. 1. A latch has the capability of remembering the logic state it is in as long as power is applied. Going around the loop in FIG. 1, the output of the first inverter is applied as the input to the second inverter, and the output of the second inverter is applied as the input to the first inverter. If one of these signals is in a high logic state, the other must be in the low logic state to satisfy the inverting function of each inverter. Either inverter output can be taken as an output.

In order to change the logic state of this latch, one of the outputs must be overdriven. For this to be feasible, the latch output drive must be significantly weaker than the overdriving signal strength. Static memory cells operate in this manner.

Figure 2:
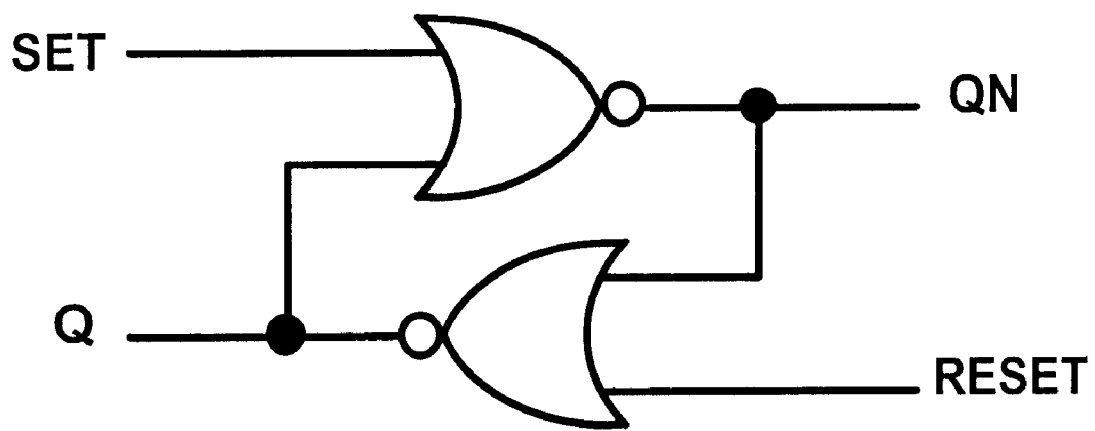
FIG. 2 shows a Set-Reset latch formed by replacing the inverters of FIG. 1 with NOR logic gates.

If a gate replaces the inverters, the new inputs can be used to change the state of the latch. FIG. 2 shows examples of this configuration known as a Set-Reset Latch. When one of the logic inputs is taken to its "Active State", the logic signal stored in the latch is put in the corresponding state if it is not already there. When both logic states are held in the "Inactive State," the latched logic state is stored or held. If both of the input signals are active at the same time, the outputs of the latch go to a "Non-Complimentary State" where they are both at the same logic state instead of compliments of each other. This is called the "Illegal State" and is normally not allowed by design of the external logic.

A useful extension of the simple cross-coupled latch is a Clocked or Enable Latch. Here some additional logic is added to allow the latch to sample a logic signal and hold it. This sampling time is controlled by an additional clock or enable control signal. When this Enable control signal is active, the Data input signal is passed through to the output. Accordingly, the latch is often referred to as a Transparent Latch. When the Enable control signal is inactive, the last Data input Logic State is held by the latch.

Latches have the disadvantage of their stored output being valid only for the low half of their clock cycle. There has to be a period of time when the input signal is being acquired and tracked. Here the latch output is not valid because the latch is transparent from the data input to the Q output. Asymmetric clock pulses can minimize this, but in the maximum frequency use of the latch where it is normally used, the clock duty cycle returns to about fifty percent to allow for settling of logic signals. This disadvantage is offset by their minimal size. Therefore, bus structure designs often accommodate their shortcomings.

Certain types of latches may be considered to include two connected subcomponents, i.e., a "keeper" portion and a "drive" portion. The drive portion drives the output of the latch. The keeper portion holds the value of the latch. Both the keeper portion and the drive portion generally include circuitry consisting of multiple transistors. Such a configuration is discussed further below.

Flip-Flops

Flip-flops are generally two latches connected together in series, such as a master latch and a slave latch, with the output of the master latch connected to the data input of the slave latch. The data input of the first latch is the data (D) input of the flip-flop and the output of the second latch is the output (Q) of the flip-flop. The enable controls, of each of the two latches, are connected to opposite phases of a common clock line so that the two latches are enabled out of phase of each other. This clocks data through the two latches in two stages, but it inadvertently creates a race between the interstage data and the clock that is mediated by the relative delays inside the flip-flop. One state of the clock enables the data input to the first latch to pass into the first or "master" latch while the second or "slave" latch holds it data content. The result is an "edge-triggered" data flip-flop where a specified active edge of the clock cuts off the data input and presents the result to the output. The output is always valid except for a brief time when it is being switched to the opposite logic state by the "active edge" of the clock. The output of the second latch is normally buffered within the flip-flop cell, to provide output signal strength sufficient for driving external logic interconnections and isolation of the slave latch loop from noise coupled back into it. This buffer normally has four times the drive strength of an ordinary inverter, which characteristic is henceforth abbreviated as "Qx4" output. This forms an optimum speed "taper" or step ratio for a series of increasing size inverters.

There are several flip-flop topologies in use. The type of structures used to make up the master and slave latches classifies the edge triggered flip-flop dominant topologies. For CMOS implementation, these classifications are described in following subsections.

Setup and hold times are well-known primary timing specifications that describe edge triggered flip-flop performance. The setup time defines the last opportunity for the input data to be presented to the flip-flop data (D) input before the active clock edge. This input data has to be latched in the master latch of the flip-flop after the active edge of the clock and concurrently passed through to the slave latch to appear on the slave latch (or flip-flop) output. The hold time defines the period of time the data must be held after the active clock edge occurs. These setup and hold (S&H) times form a specification on how fast the flip-flop's master latch can settle from changing data as the clock freezes the data input's logical state in the master latch. Setup and hold times are different for logic 1 and logic 0 responses as can be seen by data D transitions occurring at different delay times to establish their respective setup or hold time. The window of time that is between the first setup to the last hold time is unusable and biased, since the new Q output will not consistently reflect the intended data D input, but is modified by the previous logical state of the flip-flop.

The maximum-toggle-rate defines how fast a flip-flop will toggle in the fastest first stage of a counter. This specifies how fast the flip-flop can be driven through its required internal clock and recovery sequences. Other delay time specifications are the time it takes a flip-flop to be asynchronously reset or set. These functions are normally used with less critical timing requirements and are often traded off against improved clocked responses. A flip-flop can be optimized to make these reset and set functions very fast at the expense of normal operating speed, but a balanced tradeoff is normally used to make one general-purpose flip-flop design.

The integrated circuit cell area of a flip-flop should be made very compact, since it is a complex cell that is used very often in most logic designs. If a flip-flop were made out of the gate cells that describe its logic equivalent, it would likely be too large for its high usage in logic circuits. Also the interconnections would not be defined well enough to guarantee that the flip-flop race requirements would be satisfied.

Power is consumed within flip-flops while they are being clocked or their data inputs are changed even though the output may not change state. The internal race condition, the pass through current of the gates, the extra movement of internal nodes, and the parasitics of the high layout density required make the flip-flops "hot spots" in the integrated circuit and add significantly to the overall integrated circuit power dissipation.

One common type of flip-flop is a transmission gate type edge-triggered Data flip-flop. It consists of two identical latches connected in series. The output of the first latch is connected to the input of the second latch (signal node "A"). Only the clock on each of these latches is connected out of phase of each other. That is to say, that one latch in the hold mode while the other latch is in the sample mode of operation and visa-versa. Each latch consists of a transmission-gate that enables the data input signal to enter the latch when it is in the input sampling mode of operation. Here the latch clock (or enable) control input is high. When the clock (or enable) signal goes to the other (or low) state, the latch switches to the hold mode of operation. Turning on the feedback transmission gate and turning off the input transmission gate simultaneously achieve this.

Figure 4:
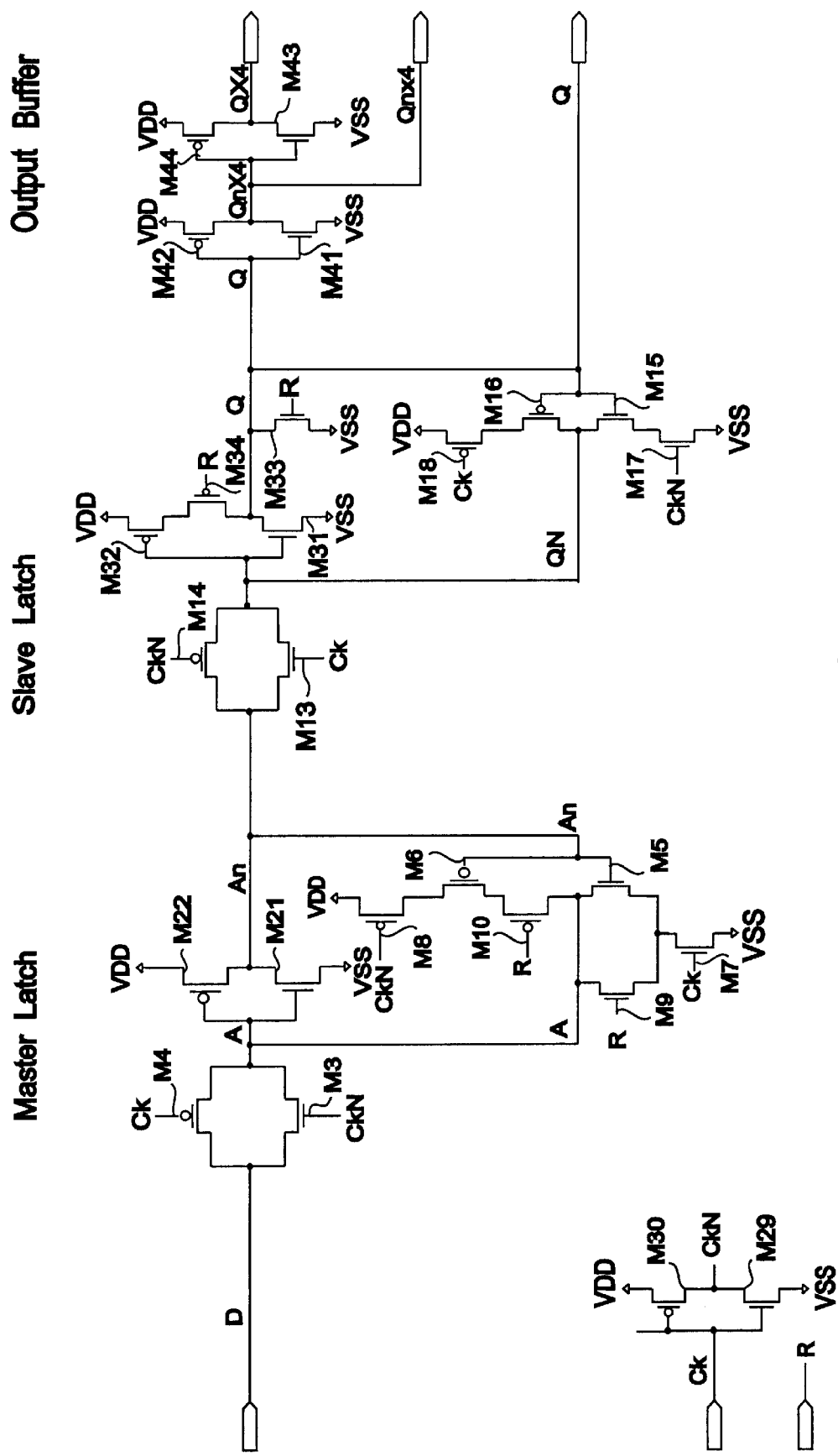
FIG. 4 is a schematic diagram of a strapless, edge-triggered D flip-flop with Qx4 output buffer and asynchronous-reset.

FIG. 4 is a schematic of perhaps the most commonly used realization of an edge-triggered D flip-flop in use today. The illustrated flip-flop is a strapless, edge-triggered D flip-flop with Qx4 output buffer and asynchronous-reset. Thus, it is a version of the transmission gate flip-flop that has the straps between the feedback inverter-gate and the transmission-gate removed. This class of flip-flop is therefore referred to herein as the "strapless" class of flip-flop. The straps, if present, would tie the transmission gate input node together between the pull-down n-channel MOS devices and the pull-up p-channel MOS devices in order to form the node between the feedback inverter-gate and the feedback transmission-gate. In practice, this intermediate node (between the feedback inverter and the feedback transmission-gate) is not required, because it is internal to the structure of MOS switches and does not go out of the gate structure and drive anything else.

This description also includes techniques for providing better low voltage operation. These techniques include eliminating transmission gate devices, keeping stacks of transistors to a minimum, especially for driving critical nodes, and minimizing the loading by intermediate logic circuit nodes while providing the transistors with maximum gate voltage drives.

II. Flip-Flop Output Drive Considerations

An output buffer is integral to the flip-flop cell for output drive capability and to isolate the slave latch loop from the output interconnect. An unbuffered latch can be flipped to the opposite logic state by noise coupled onto the output line. Input and output buffers are incorporated into flip-flops for overall chip speed, power, and size benefits.

By eliminating the output buffer, the race-free flip-flop (discussed further below) can be optimized for higher speed.

To keep the chip routing down to a minimum, it may be best to route only one buffered signal out of the flip-flop, thus eliminating the need for a buffered inverted output. It is more efficient to invert signals as required along the chip routes. This makes a buffered Qx4 output as perhaps the best general-purpose output. To save one of the two series extra-large output inverters (e.g., in FIG. 4, M41 and M42 or M43 and M44), the slave latch Qn inverted output can be used, but it is better to invert the data in the slave latch so that the forward complex-gate output is used instead of the feedback inverter output. This can be done by using the master latch feedback signal A to couple to the slave latch instead of An. It may be better to use a small internal inverter than a large output inverter for this purpose.

P-channel transistors inherently have a lower mobility than that of n-channel transistors, because their majority carriers are holes rather than electrons. For a balanced inverter drive, two or three times the transistor (gate) width is required for the p-channel transistor in order to balance the n-channel strength. This is also equivalent to having two or three series n-channel transistors in the pull-down branch and a single p-channel transistor in the p-channel pull-up branch, as in a NAND gate. With this in mind, it is desirable to have the flip-flop's output drive forward path's complex-gate reduce to a single p-channel transistor, at the location where the output is actively pulled up. This part of the flip-flop is a critical speed-limiting portion of the circuit, since it must drive the capacitance of a much wider output inverter or some undefined output routing interconnect lines.

Figure 5C:
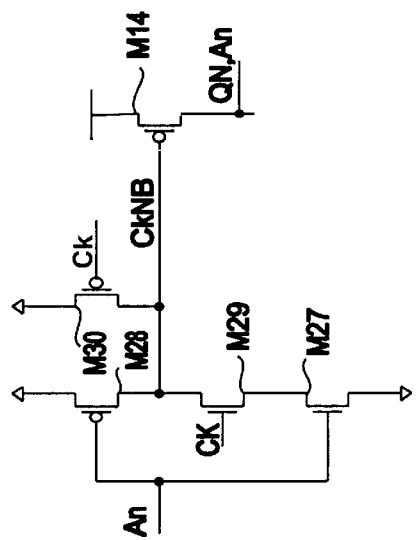
FIGS. 5A through 5C illustrate a technique for designing the pull-up portion of the output branch of a flip-flop to have only a single pull-up transistor.
Figure 5B:
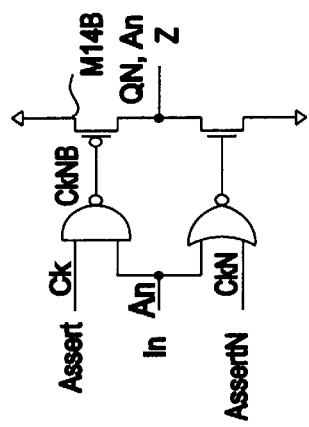
Figure 5A:
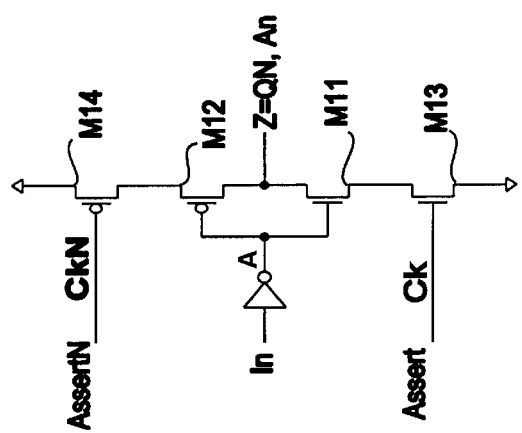

As shown in FIGS. 5A through 5C, conversion from a tri-state inverter to a high-drive tri-state line driver can accomplish this. Therefore, the flip-flop can also be tailored to use a single p-channel pull-up in this way. As to the edge-triggered D flip-flop logic, the conventional two series pull-up transistors in the drive portion of the slave latch (see, e.g., FIGS. 31, 36 and 37, discussed below) are replaced with a single p-channel transistor M14 driven with a NAND gate output CkNB. With this, the CkN clock that drove M14 must be inverted to the Ck clock input to the NAND gate, and the signal A that should drive M12 must be inverted to An to drive this NAND gate. (Recall that the An signal went to A to invert the slave latch data to eliminate one of the output buffers, as discussed above.) Referring to FIG. 5A, for symmetrical drive strengths, it is desirable to reduce to a single transistor, the two series p-channel transistors M12 and M14 in the drive portion of the slave latch of the flip-flop (see FIGS. 31, 36 and 37). Due to their lower mobility, the p-channel transistors used for pull-up are two to three times weaker than equivalent n channel transistors used for pull-down. The conversion of a tri-state buffer to single n- and p-channel output transistor tri-state buffer, often used in integrated circuit bus and output pad drivers, is used to graphically illustrate a technique for this reduction. The two pull-up series transistors of the tri-state inverter (M14 and M12 in FIG. 5A) are replaced with a new, single transistor M14B, as shown in FIG. 5B, while the logic function of the two series transistors is performed by the NAND gate driving the new single pull-up transistor M14B. The pull-down of the tri-state pad buffer can be similarly replaced, but this replacement is not used in the flip-flop. The master latch complex-gate transistors M6 and M8 are similarly replaced with a new M8 driven by the same NAND gate output CkNB. In order to eliminate the clock inverter and provide monophase clocking to the flip-flop, it is desirable to eliminate the inverted clock signal CkN entirely. Note that the CKNB NAND gate provides the clock inverter function. In fact, the clock inverter transistors M29 and M30 become part of the NAND gate. The master-to-slave signal can be combined into the clock inverter rather than being applied directly to the drive portion of the slave latch, as shown in FIG. 5C. If the complex-gate n-channel transistors of the latch that use the CkN inputs are controlled by the NAND output CkNB, these transistors (M3 and M17) will still be turned off to break the current path from tthe new single p-channel pull-up devices which are turned on by this same CkNB signal. This is possible, since the n-channel function of this signal in transistors M3 and M17 is to disconnect the latch complex-gate output from the negative supply while this output is being pulled up to the positive supply with the CkNB p-channel transistors M14 and M8. The other half of the complex-gate pull-down was disconnected from the negative power supply with the same Ck signal used in the NAND gate and is maintained in a disconnected state by the latch feedbacks following the application of the clock. The NOR gate shown in FIG. 5B could replace the series transistors M11 and M13 in a similar manner, and also M5 and M7 in the master latch, to provide additional serial compaction options.

In addition to providing the advantages of a single p-channel transistor pull-up, this NAND gate benefits flip-flop performance, power, and layout. This includes single phase clocking, race-free operation, and lower power due to activity on the CKNB inverted clock signal being active only when the complex-gates are pulled-up (D and Q=0), as well as limited activity from signal going to n-channel devices only. The race-free operation is due to the flip-flop going through a sequence of states, instead of the normal edge-triggered flip-flop clock-data race. The race-free operation is especially beneficial at low voltages where delays stretch out and differences may cause circuit malfunction. It also solves the slow clock edge limit of low voltage/low power circuits. There is an additional advantage of only having to pull on the CKNB NAND gate output signal to originate a reset.

This approach is logically consistent, since when both A and CkNB signals are low, the output Qn is pulled up. For ease of reference, the logical sense of the data input is maintained in the naming conventions of the A and Q signals. Since both the master and slave latches contain the same sense of data (An and Qn), this technique of replacing the identical pair of pull-up transistors (M6 and M8) with a single device, also works for the keeper portion of the master latch complex-gate. (In FIG. 31, for example the drive portion of the slave latch is formed by transistors M11, M12, M13 and M14; the keeper portion of the slave latch is formed by transistors M15, M16, M17 and M18.) A latch may be considered to include two parts: a keeper portion and a drive portion. The drive portion drives the output of the latch. The keeper portion holds the value of the latch. Both the keeper portion and the drive portion generally include several transistors. The NAND gate is the same gate for both the master and slave latches. The other two inverted clock signals CkN on transistors M3 and M17 can be replaced with the NAND gate signal CkNB that contains extra information without problems. This eliminates the inverted clock altogether to make the flip-flop a single-clock-phase flip-flop.

Both the master and slave latches contain active-low data on their forward complex-gate outputs An and Qn. With this, a reset state of the flip-flop is when these An and Qn signals are high. Since CKNB pulls both of these signals high through the single p-channel pull-up transistor, only one reset point is required in the CkNB NAND gate making it a complex-gate that is overridden to the low logic state. Since the CkN signal on transistors M3 and M17 have been replaced with CkNB, these transistors are cutoff with the application of the asynchronous-reset.

Figure 15:
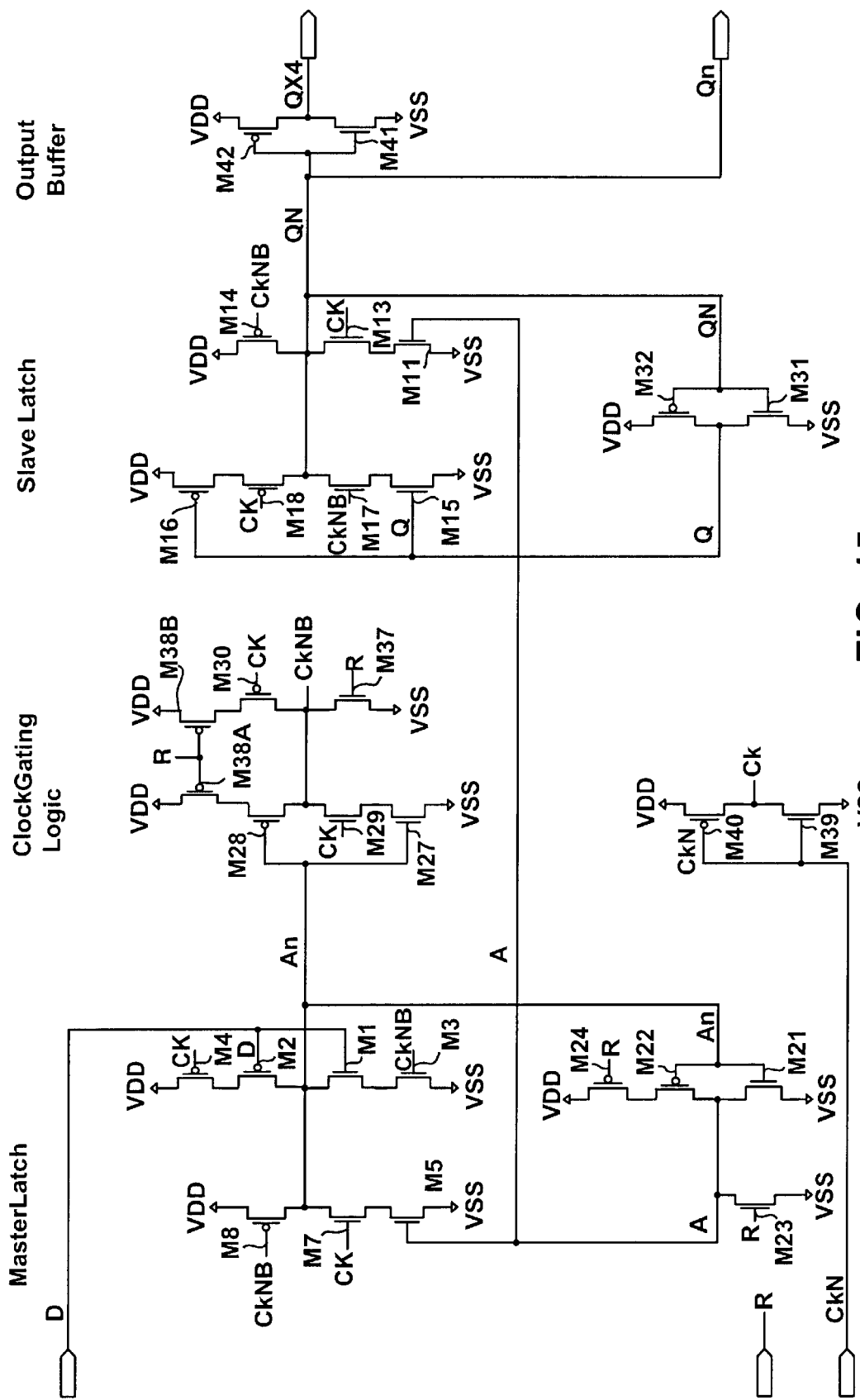
FIG. 15 is a schematic diagram of the flip-flop of FIG. 14, with the addition of an asynchronous-reset.
Figure 16A:
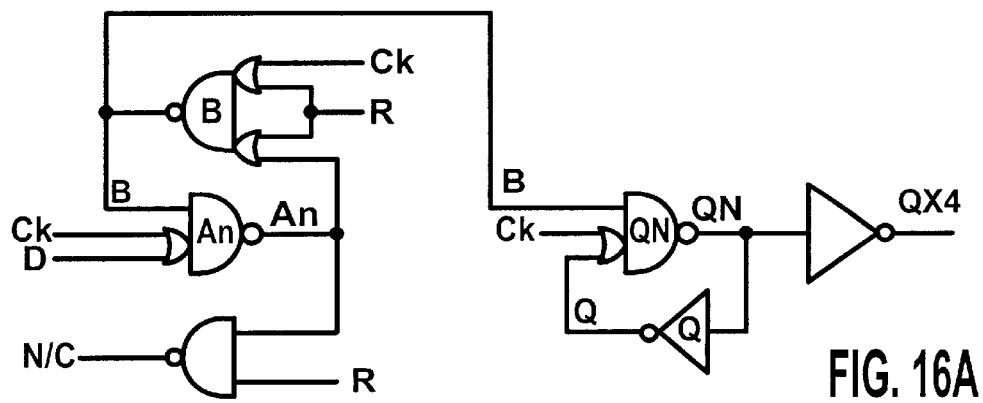
FIGS. 16A through 16D show, for the flip-flop of FIG. 15, the p-channel gate logic, a layout stick diagram, the n-channel gate logic, and an actual layout, respectively.
Figure 16B:
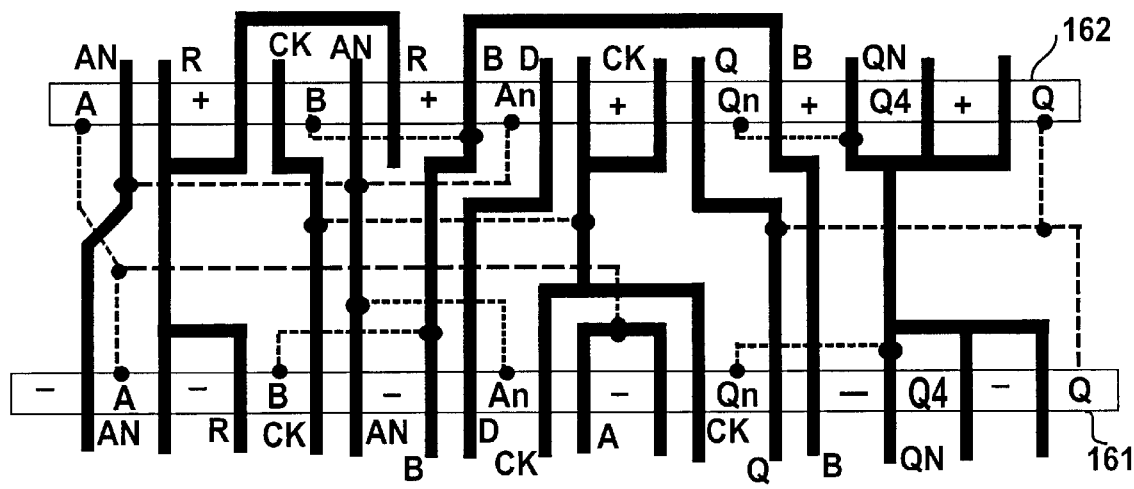
Figure 16C:
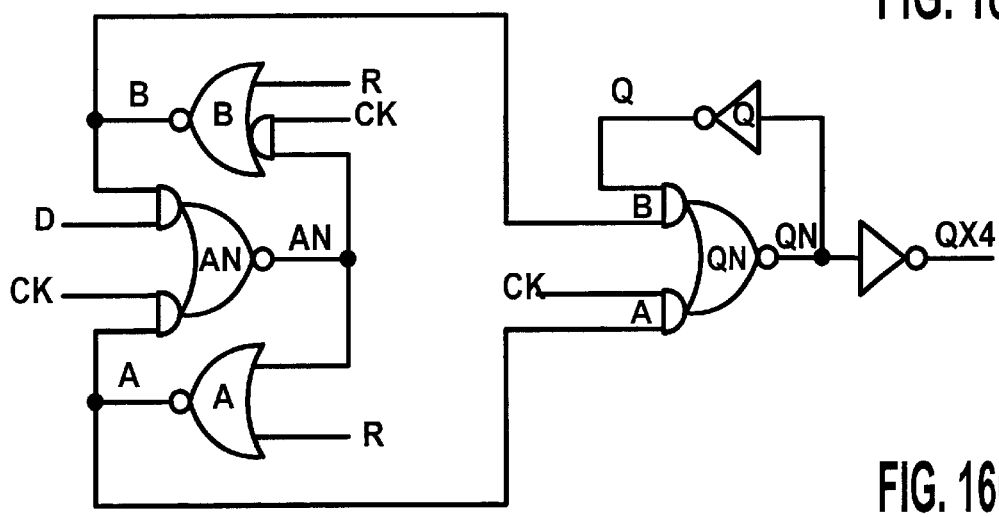

A full schematic example of this configuration is in FIG. 15. Specifically, FIG. 15 shows a race-free, edge-triggered D flip-flop with monophase clock, negative-edge clock input buffer, Qx4 output buffer, and asynchronous-reset. FIGS. 16A and 16C are logic diagrams of the pull-up and pull-down portions, respectively, of the flip-flop of FIG. 15. FIG. 16B shows a stick figure diagram of a layout that may be used for the circuit of FIG. 15. This configuration has moderate drive strength provided mainly through the single p-channel pull-up switch M14 driving the slave latch's active-high-going output transition. It is important that this single p-channel pull-up M14 has the maximum output drive strength relative to transistor size (width). Normally it takes at least two series p-channel switches to perform this function. Since n-channel devices are more than twice as strong for a given transistor size (width), two series devices can easily balance the complementary pull-down strength of the slave latch active pull-down drivers.

Inclusion of the Qx4 output inverter (M41 and M42) in the flip-flop of FIG. 15 shows that this flip-flop can efficiently incorporate an integral output buffer that provides output drive strength, output isolation from interconnect noise coupling, and the normal non-inverting D-flip-flop logical output state. Because the primary slave latch output presents inverted data, only one inverting buffer stage is needed in the Qx4 output buffer circuit for a formulation of this function at the minimum delay. This stronger slave latch output drive provides proportionally stronger output buffer strength. To maximally increase drive strength along a series of inverters while minimizing its delay time, a taper ratio (interstage device width step sizing) of around 4 to-1 can be used.

III. Serial Device Compaction

When MOS transistors are connected in series, there is generally only the minimum possible area between them as is allowed by the layout design rules. This area makes up the junction diffusion parasitic capacitance on critical nodes. When MOS transistors are connected in parallel, a significant area of source/drain junction diffusion is required to interconnect them (typically about three to five times as much junction area). The gate polysilicon ("poly") is also more difficult to route into the transistor area which also increases the junction area and adds more poly to substrate capacitance along with more metal interconnect area.

Figure 6A:
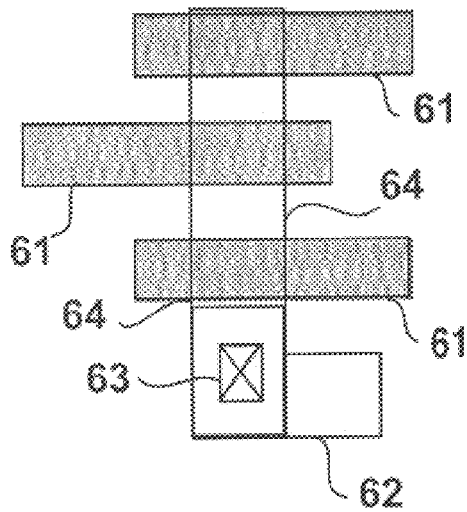
FIGS. 6A through 6D show a comparison of layouts for all-series and series-parallel connections of transistors.
Figure 6C:
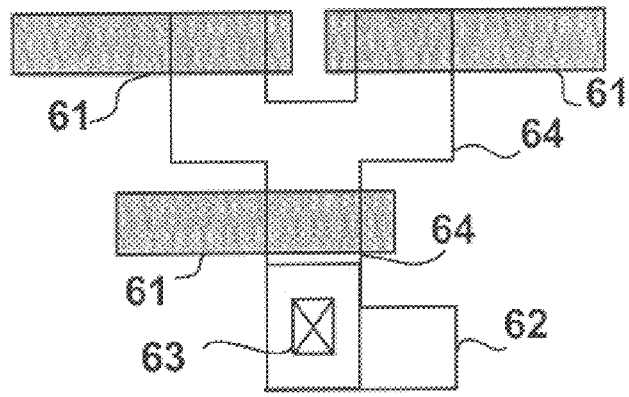
Figure 6B:
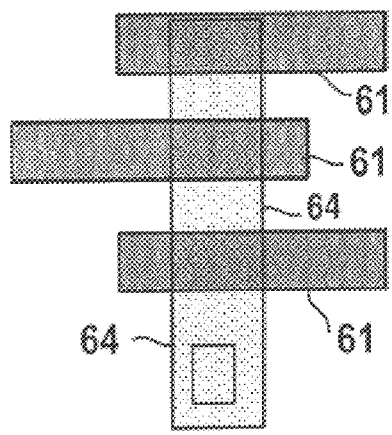
Figure 6D:
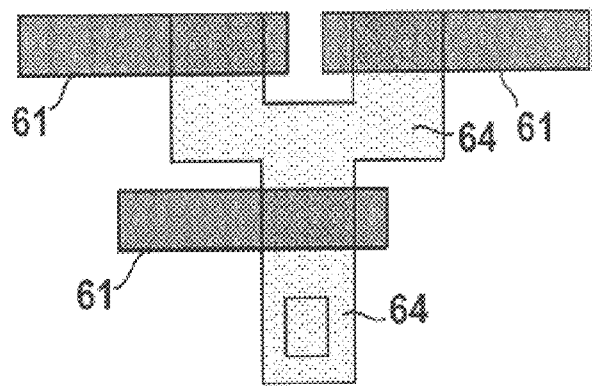

FIG. 6A through 6D show the logically active, or switched, portion (i.e., no power) of layouts for series-only and series-parallel connections of transistors, as a basic comparison of series-only verses series-parallel layout. The layouts shown in FIGS. 6A and 6B have all-series transistor connections, and the layouts shown in FIGS. 6C and 6D have series-parallel MOS transistor connections. In these Figures, elements 61 represent poly, elements 62 represent metal interconnect, and elements 63 represent metal contacts, and elements 64 represent active area. In FIGS. 6B and 6D, the Metal-1 output wire 62 has been removed for greater clarity visualizing the active area. Note that a MOS transistor is defined by an area of poly over active area. For purposes of this description, a "diffusion region" is defined as a portion of active area that is not covered by poly.

Figure 7A:
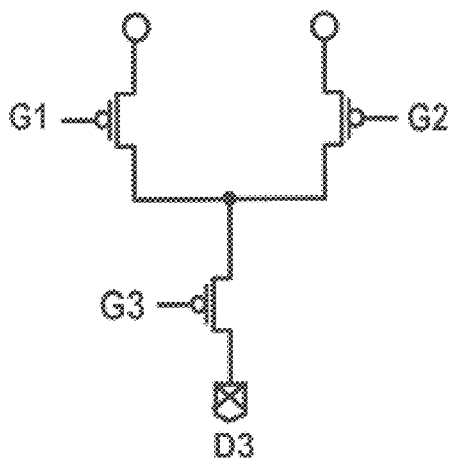
FIGS. 7A through 7E show various layout approaches for a series/parallel combination of MOS transistors.
Figure 7B:
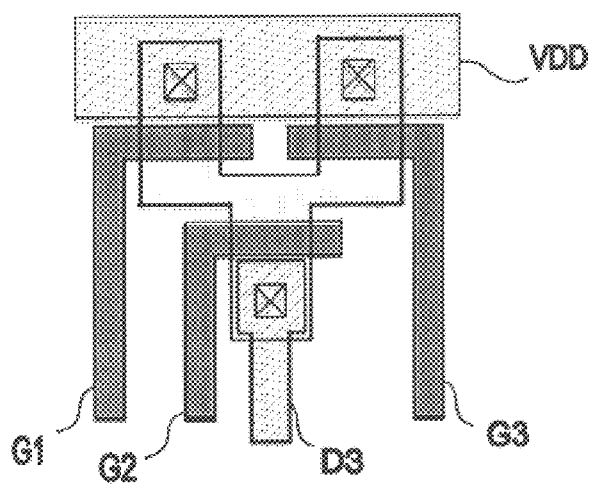
Figure 7D:
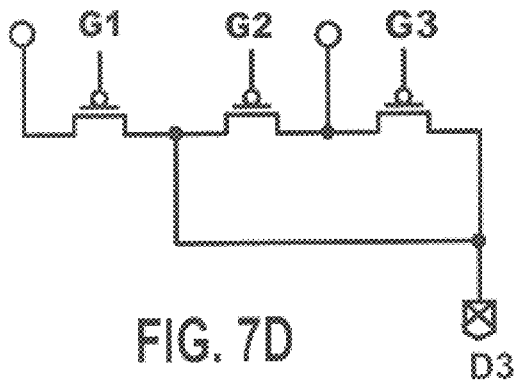
Figure 7C:
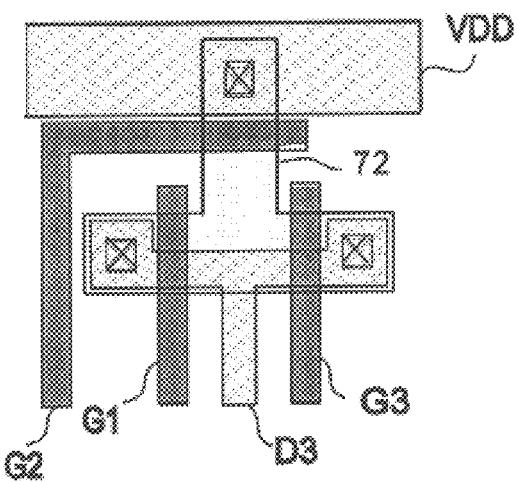
Figure 7E:
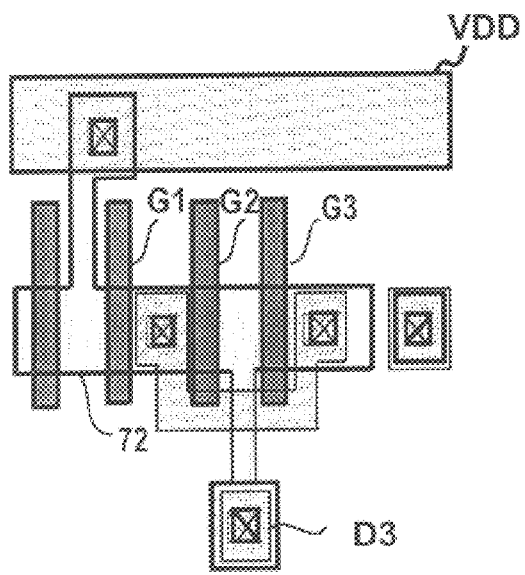
Figure 8A:
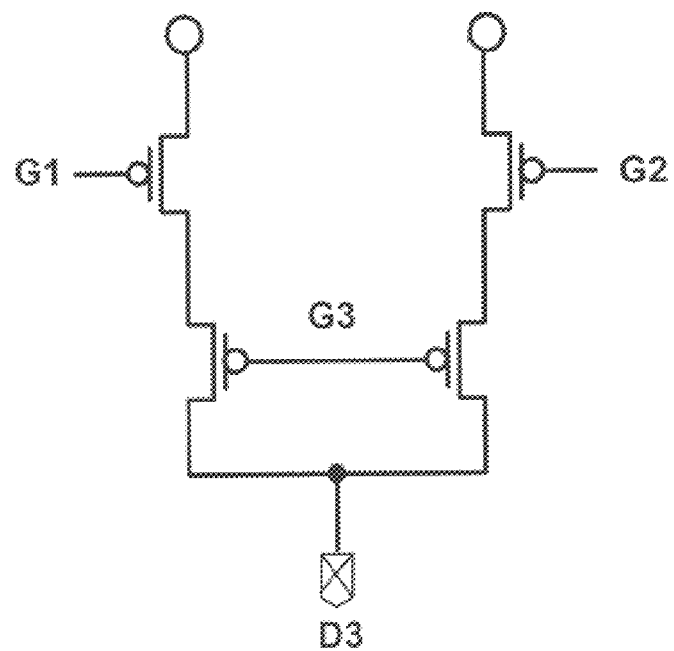
FIGS. 8A and 8B show how a more compact layout can be achieved by using two transistors for the G3 input as opposed to the one transistor used in FIGS. 7.
Figure 8B:
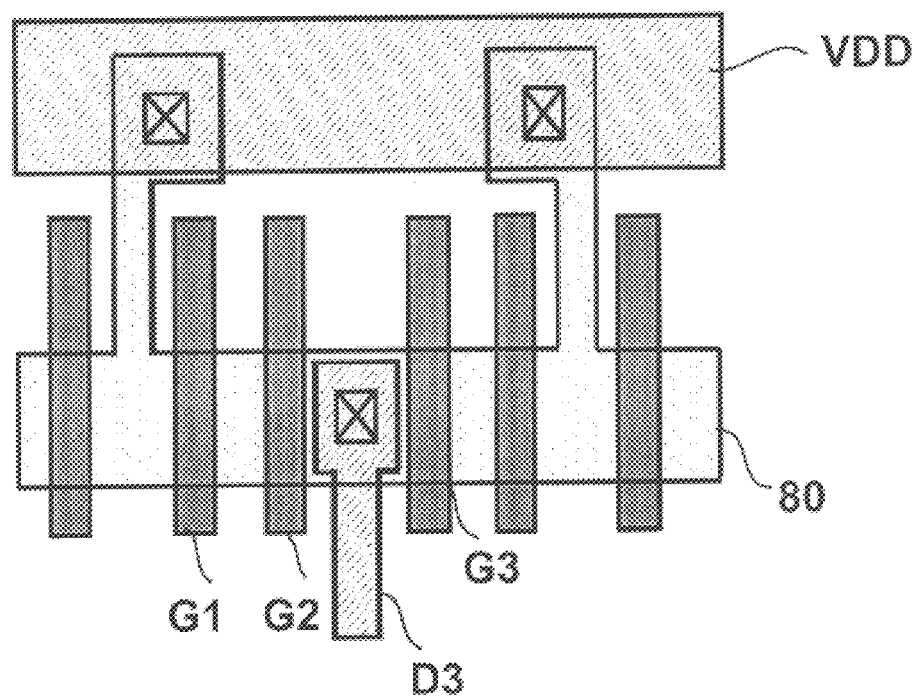

FIGS. 7A through 7E illustrate various layout approaches for a series/parallel combination of MOS transistors. In particular, FIG. 7B and 7C illustrates two layouts corresponding to the schematic of FIG. 7A. FIG. 7E shows a layout for the schematic of FIG. 7D. Active area is shown as elements 72. Compare the approaches of FIGS. 7A though 7E with the approach of FIGS. 8A and 8B. FIG. 8B shows that a more compact layout is achieved by using two transistors for the G3 input, as opposed to the single transistor used in FIGS. 7A through 7E. The schematic corresponding to FIG. 8B is in FIG. 8A. Active area is shown as element 80. Hence, using a greater number (i.e., two) of transistors may increase schematic complexity, but it also can facilitate reducing the layout to a more compact and orderly linear array of transistors with easily accessible nodes. The two outside transistors are added to the layout of FIG. 8B to indicate shared power to adjacent cells on the ends.

In FIG. 8B, the vertical height is at the minimum allowed by the process and its layout design rules and the resulting width is also minimized for an elementary width of: 4 poly widths; 2 poly -to- poly spacings; 2 contact center to poly spacings; 2 poly to same signal active spacings; 1 minimum active area width. From FIG. 8B, it can be seen that each of the diffusion regions that is configured to switch signal level (i.e., excluding diffusion regions coupled to power) is shared by exactly two active transistors.

Figure 9A:
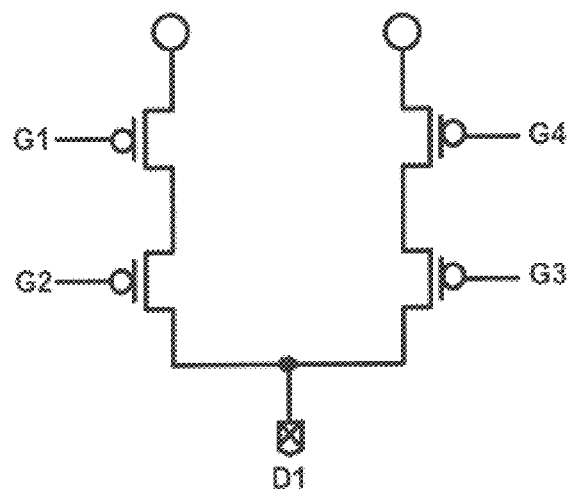
FIGS. 9A through 9C show an example of a how an improved layout can be achieved by serial device compaction.
Figure 9B:
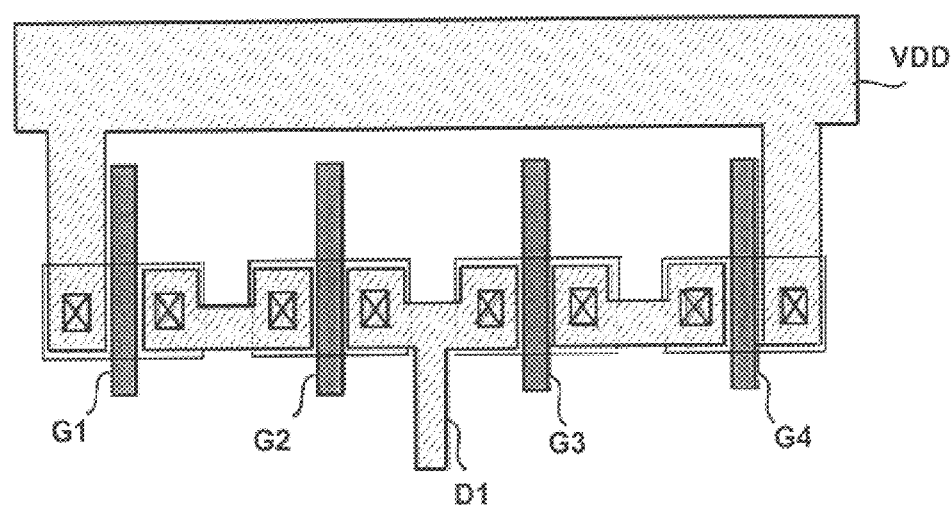
Figure 9C:
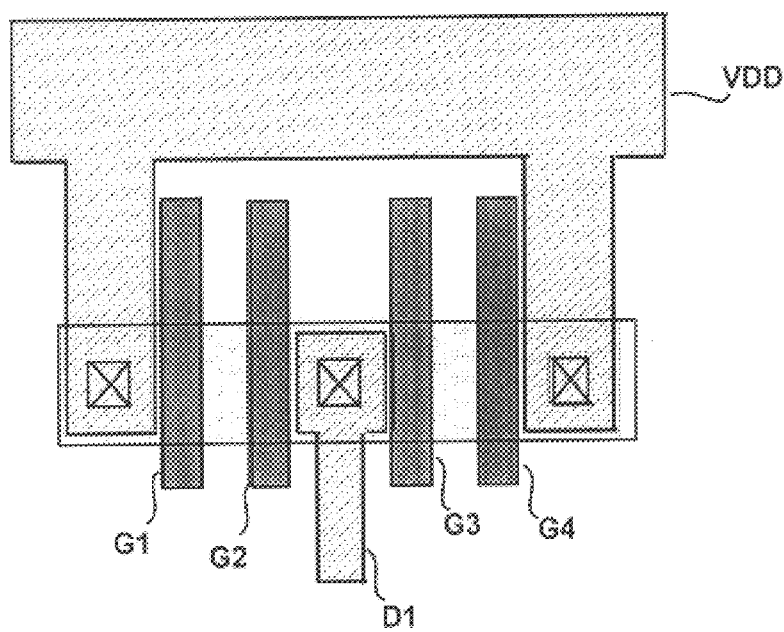

FIGS. 9A, 9B and 9C show an example of the improvement in layout that can be achieved by serial device compaction. Specifically, FIG. 9A shows a transistor schematic, while FIGS. 9B and 9C show two corresponding layouts for FIG. 9A. As shown, serial device compaction methodology makes better use of shared transistor source/drain diffusion areas, where the adjacent transistor source and drain diffusion areas are collapsed into one minimum diffusion area. Here effectively, each transistor requires only ½ of the normal minimum source/drain diffusion, since the other half of the connecting diffusion is attributed to another transistor. The minimum spacing dimension of this diffusion area can be poly-to-poly spacing, poly contact pad width, or the minimum spacing for a diffusion path connection between transistors. In addition to cutting the effective minimum diffusion areas in half, this eliminates extra area and parasitics of these eliminated connection pads with their interconnect as well as the spacing required to separate the diffusions.

When an even number of branches are used in the complex-gates, the power supply source connections are shared with adjacent gates in the string of transistors. The output drains are also shared between complex-gate branches when even numbers of branches are used. In going from FIG. 9B to FIG. 9C, it can be seen that each of the diffusion regions that is configured to switch signal level is shared by exactly two active transistors.

This power contact width is either one square of contact pad or ½ an active area width plus spacing to poly if the power is brought in diffusion as in FIG. 8B. In processes with a high number of layers of metal, power is dropped in vertically to a contact pad from upper layers of power distribution planes.

From a layout perspective, the serial device compaction techniques described herein allow contiguous active area, which is the combined area of diffusion and transistor channels formed by poly over this active area. Further, these techniques also allow the minimum area of transistor interconnect within the cell to be used.

Figure 10A:
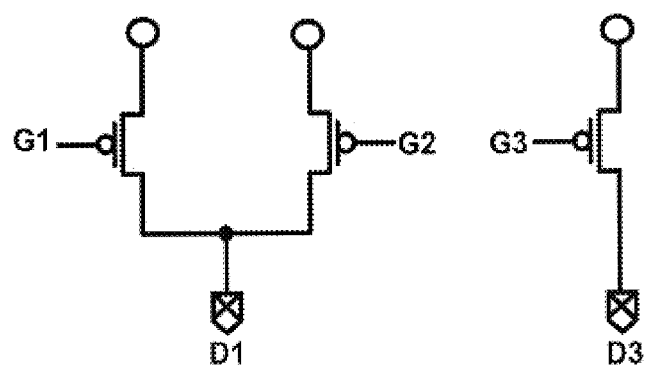
FIGS. 10A through 10D illustrate comparative layouts demonstrating that shared source/drain greatly collapses the width of the transistor stack.
Figure 10B:
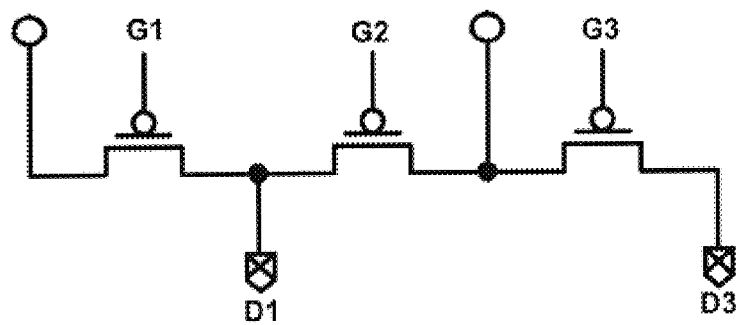
Figure 10C:
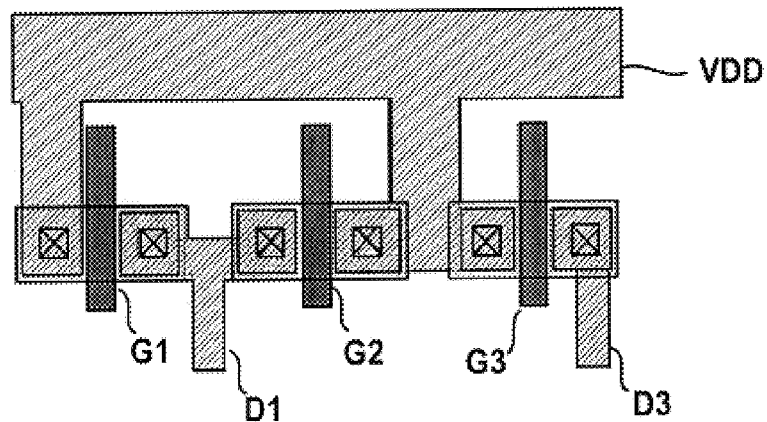
Figure 10D:
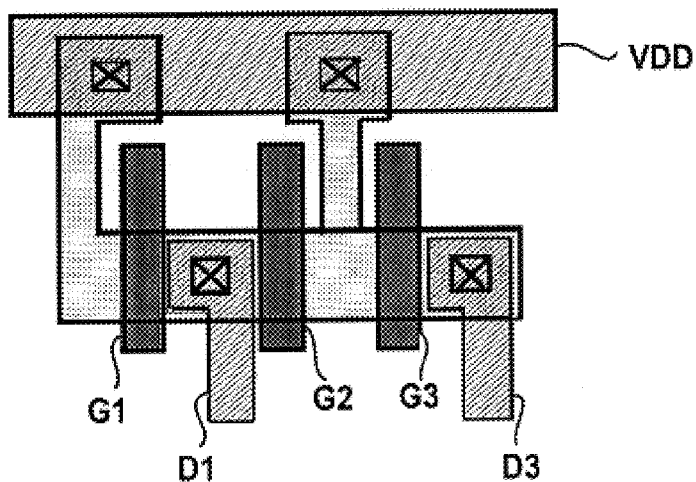

Referring to FIGS. 10A through 10D, it can be seen that a shared source/drain can be used to substantially collapse the width of the transistor stack. FIG. 10C shows a layout for the schematic of FIG. 10A, which is in comparison to FIG. 10D and its corresponding schematic in FIG. 10B. It is worthwhile to make transistor and logic modifications to take advantage of this effect. In going from FIG. 10C to FIG. 10D, it can be seen that each of the diffusion regions that is configured to switch signal level is shared by exactly two active transistors.

Figure 11A:
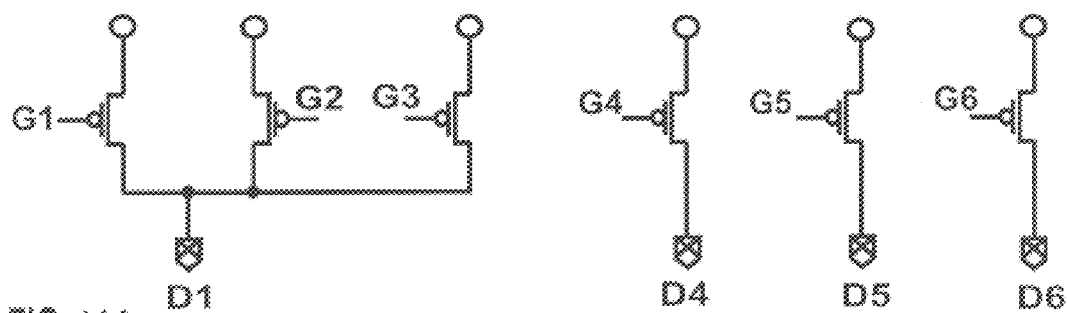
FIGS. 11A through 11D illustrate comparative layouts demonstrating that an even number of transistor branches in a complex-gate facilitates contiguous sharing of source/drains.
Figure 11B:
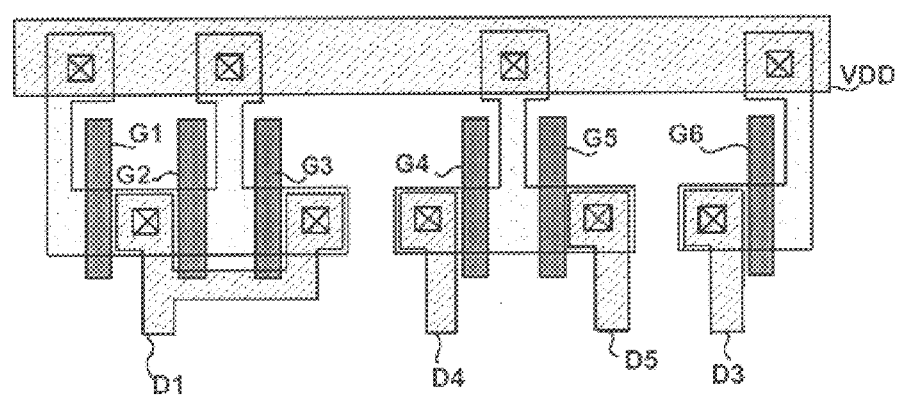
Figure 11C:
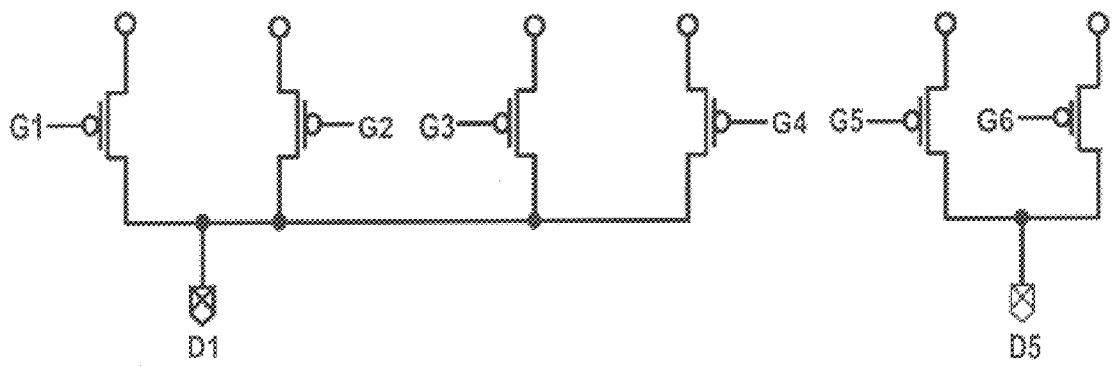
Figure 11D:
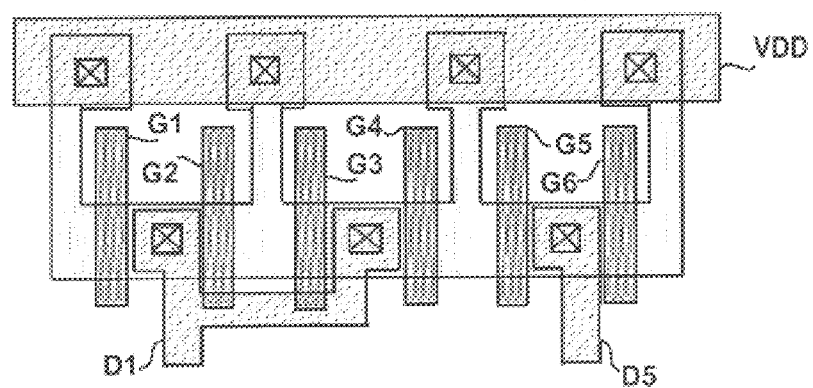

An even number of series- or single-transistor branches connected to an output node facilitates this approach, since a shared power feed can be on either end, as shown in FIGS. 11A through 11D. FIG. 11B shows a layout for the schematic of FIG. 11A, which is in comparison to FIG. 11D and its corresponding schematic in FIG. 11C. In FIGS. 11C and 11D, the even number of transistor branches in a complex-gate enables contiguous sharing of source/drains on both sides so that only ½ of a source/drain connection on each side is required. This is in comparison with the odd number of branches in FIGS. 11A and 11B. This saves a significant amount of cell width by eliminating the active-to-active spacing that separates circuit node diffusions. Double finger transistors can aid in this sharing of power. From this contiguous active areas are constructed. In going from FIG. 11B to FIG. 11D, it can be seen that each of the diffusion regions that is configured to switch signal level is shared by exactly two active transistors.

Figure 12E:
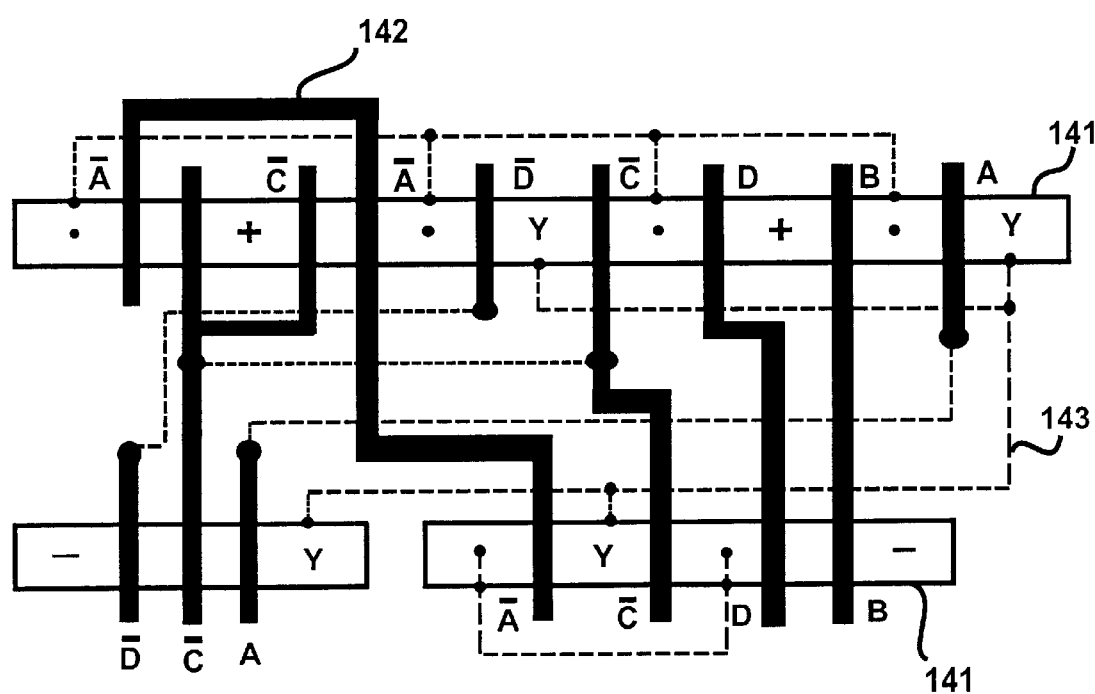
FIG. 12E is stick diagram of a conventional complex-gate cell layout.

Serial device compaction of complex-gates may be better understood through the following illustrative design process. FIGS. 12A through 12E show the development of a complex-gate from a truth table definition (FIG. 12A) of the example logic function, through a Karnaugh Map reduction (FIG. 12B), a logic gate description (FIG. 12C), and a corresponding transistor schematic (FIG. 12D). A corresponding conventional complex-gate cell layout is shown in FIG. 12E in "stick diagram" form.

In FIG. 12E and in all of the layout stick diagrams of this description, the following symbolic conventions are followed: long, unfilled and unshaded rectangles, such as elements 141, represent active area; thick, solid lines, such as element 142, represent polysilicon (poly); broken lines, such as element 143, represent metal; a symbol or reference numeral located at the end of a poly or metal line or on part of an active area indicates that the signal by that name is applied to that signal line or portion of active area; and, the "+" and "−" symbols represent where high and low power supply voltages, respectively, are applied.

In logic reduction, such as by means of Karnaugh Maps, the n-channel device logic is normally reduced to a sum-of-products form, such as $\{A\overline{CD}+\overline{A}BD+B\overline{C}D\}$ for the logic function represented in FIGS. 12A and 12B. Since the gate is inverting, the "0" terms in the Karnaugh Map are used for logic reduction. This is because the n-channel devices pull the complex-gate output to the "0" state for output activating combinations of inputs. The p-channel side is normally obtained by deriving the complement by means of De Morgan's theorem. This results in the dual or series-parallel complement of the n-channel topology. The result becomes a product-of-sums form, such as $\{(\overline{A}+C+D)(A+\overline{B}+\overline{D})(\overline{B}+C+\overline{D})\}$ in the example. The product-of-sums form implements as three separate sets of parallel MOS transistors that have to be connected together in series from the output to the positive supply to realize the logic function. Some reduction in the number of transistors can be obtained by factoring the equations, however, such reduction tends to make the integrated circuit layout worse. In this example, there are three parallel MOS transistors for input logic signals $\overline{A}$, C, and D. This combination of three parallel MOS transistors is connected in series with the next term's three transistors for logic input signals A, $\overline{B}$, and $\overline{D}$. To complete this logic function pull-up implementation, a third parallel combination of the remaining two terms $\overline{B}$, C, and $\overline{D}$ are connected in series with the rest of the implementation. These series parallel connections are parasitic-intensive.

Figure 13A:
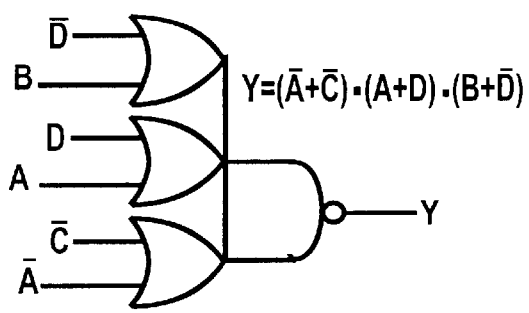
FIGS. 13A through 13D show, for a serially compacted complex-gate implementing the logic function of FIGS. 12A and 12B, the p-channel gate logic, the n-channel gate logic, a transistor schematic, and a layout stick diagram, respectively.
Figure 13C:
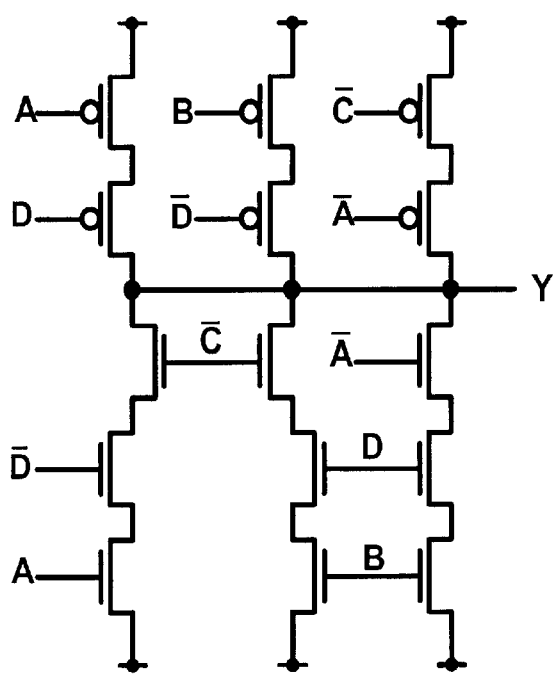
Figure 13B:
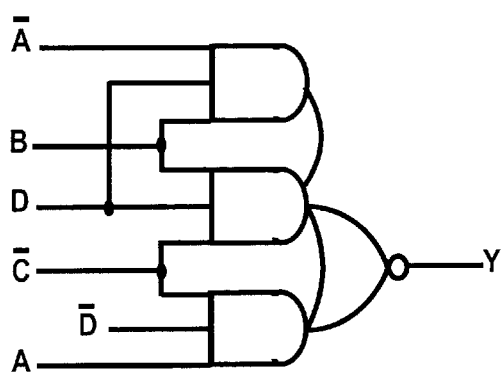
Figure 13D:
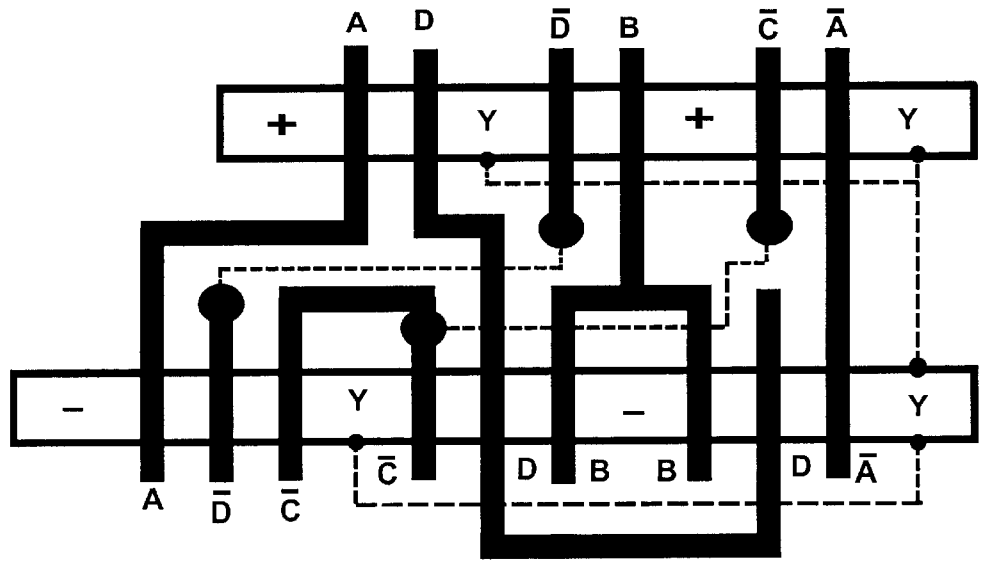

If the p-channel device logic is instead reduced by directly using the "1" terms of the Karnaugh map, instead of using the De Morgan's complement of the n-channel equation, it will also reduce to a similar sum-of-products term form. In this example, the logic function reduces to $\{\overline{AC+AD}+B\overline{D}\}$ by directly using the "1" terms of the Karnaugh map, which is more conducive to compact layout than the traditional method which uses the De Morgan's complement. This method of facilitating a more compact layout is referred to herein as "serial device compaction". FIGS. 13A through 13D show an illustrative example. Specifically, FIGS. 13A, 13B, 13C and 13D show the p-channel gate logic, the n-channel gate logic, the transistor schematic, and the layout stick diagram, respectively, of the serially compacted complex-gate for the logic function of FIGS. 12A and 12B. It can be seen that the serially compacted layout of FIG. 13D is more compact than the conventional layout of FIG. 12E.

Using serial device compaction, layouts can be achieved in which the serially compacted cell's active areas of both the n-channel and the p-channel devices are contiguous active areas with minimum design rule dimensions of the switched elements, resulting in minimum parasitics. The transistors are sized to make the output drive strength the same, resulting in the serially reduced complex-gate having a lower profile cell of about four Metal-2 tracks, as opposed to six Metal-2 tracks for the normal complex-gate, along with about a one-third savings on cell width.

Serial device compaction logic reduction methods allow reduction of critical active parasitics by using series connected devices when advantageous for reducing the interconnect diffusion between MOS transistors. They allow an organized arrangement in layout to minimize poly gate interconnect and reduce the metal interconnect within the logic cell (normally resulting in a smaller cell area, particularly the cell height between the power supply rails). The highest parasitic capacitance per unit area comes from the source-drain diffusion junctions. This is due to junction capacitance between diffusion and the substrate being about double that of thick oxide capacitance to substrate of the poly and metal interconnect. Parasitic sidewall coupling becomes severe for IC processes below 0.5 microns. In addition, the static leakage current component of power dissipation is from these junctions that have voltage applied to them. Reducing the total area of these features proportionally reduces this leakage power dissipation. Off transistors also add static leakage current. Current integrated circuit processing keeps this leakage current to a normally insignificant number; however, in low-activity, ultra low power circuit applications, this leakage current becomes important, especially when there is a lot of circuitry involved, as in large integrated circuits.

Serially compacted design reduces the required chip area, and therefore the IC interconnect, by making the cells smaller in both width and height. Because the tallest cell that must be accounted for when the cell height decision is made, all the simpler cells that make up the bulk of the integrated circuit layout will waste the excess cell height over the entire integrated circuit layout. Because of its high usage and complex design, the flip-flop is a cell that that is highly desirable to be used to set the cell height (distance from top power rail to the bottom power rail). This cell height should remain constant throughout the integrated circuit cell library to allow the router software to randomly place cells next to each other. The routing complexity within any cell greatly increases the cell size and internal cell parasitics.

Serially compacted design provides a very significant advantage in designing fast flip-flop cells. Normally, in order to make the flip-flop cell faster, the transistors are made larger. Since this approach makes the cell larger, the parasitics tend to increase at nearly the same ratio as the size of the transistor, which tends to cancel out the desired increase in flip-flop speed. This larger transistor loaded by a similar larger parasitic capacitance limits the maximum practical speed of the flip-flop. Serially compacted design provides a methodology that can be used to provide an inherently faster flip-flop. This increase in built-in performance may also be realized in the opposing paradigm of operation, which is slower, low-power flip-flop design. There are many similar design trade-offs between speed and low power, such as simplification and minimization. Serially compacted flip-flops provide the shortest path between clocks and the flip-flop Q output, which is only one inverter delay.

Since virtually all of the MOS devices can be arranged in series where desirable, performance of the flip-flop can be optimized for different critical path time trade-offs. This can be accomplished through the design of the internal logic configuration, the selection of internal sequential paths, plus the ordering and sizing of series MOS transistors. These gains are balanced by layout parasitics and the best result tradeoff is used. These improved flip-flop memory devices can be used to provide cells with exceptional performance. The individual gains may be small, but they are significant in that they add performance where it cannot be otherwise realized. Note that if the parasitics are cut in half, the speed will be doubled and the power will cut in half.

A gain like this is achievable through various optimizations, including the techniques described herein. Such optimizations include the following:

1. Fast setup time is achieved by making the shortest and quickest path from the data (D) input to the slave output (Q), along with the appropriate data lockout and hold time for the master stage of the flip-flop. Note that for decreasing these delays, it is more important to start turn-on of transistors early than turning opposing transistors off, when high speed is desired. The opposite is optimal for low power. Separate turn-on signals and turnoff signals are used for this optimization. Signals "A" and "CkNB" achieve these along with the normal "Ck" signal in the race-free flip-flops of FIGS. 14 through 21, and the enhanced clocks discussed below. These enhanced clocks are signals "Ck" and "CkN" in the symmetric-serial flip-flops with schematics in FIGS. 31, 36, and 37, also discussed below. Note the large, "donut" or "U" shaped n-channel inverted clock-driver pull-down transistor in these devices, as shown in FIGS. 34, 35, 38, 39D and 40. An inverter normally does not have this feature, since the pull-up and pull-down control signals are the same, but it is often realized in complex and tri-state gates. Note that in this description, a "donut" transistor means that the gate of the transistor is formed from a segment of poly that is shaped as a closed loop, as viewed from above the top surface of the substrate. Note that variations of this type of transistor include a "U" transistor or "L" transistor, so named due to the resemblance of the poly gate's shape to the respective letters.

2. Fast hold time is achieved by placing the clock switches very close to the physical output, substantially reducing output inter-device capacitance, and making the other series output switches which are closer to the power supplies stronger (wider). The non-critical signals arrive at the gate sooner.

3. Fast usable transition time to the hold state is achieved by making the driver parts of the slave rapidly switch simultaneously from one logic state to the other.

4. Ultra-fast output times are achieved by sizing the slave latch so that it can drive moderate load logic signals directly, thus eliminating the delay incurred through buffer-output stages. Buffer stages are still needed where the output load is large from high fan-outs and an abundance of interconnects. This technique makes the output buffer an integral part of the flip-flop layout. Various strengths of this buffer are achieved by adding even numbers of fingers and varying their widths.

5. A single p-channel pull-up transistor is used to drive the output buffering inverter.

6. Fast interstage delay time is achieved by progressing from weaker (narrow) MOS stages to stronger (wider) stages by designing to the theoretical optimum inter-stage step ratio of 3.7 (natural log base "e"), where drive must be increased.

7. Data input devices can be placed closest to the output node of the gate that initially accepts them. This provides the latest data information insertion into the flip-flop as the clock locks out the data input and transfers the latched data to the output Q.

8. In a set/reset flip-flop, the reset/set transistors can be moved away from the slave latch complex-gate.

9. In a set/reset flip-flop, the reset/set switches can be moved into non-critical positions in the clock inverters, where they force the clock to pass master latch data to the slave latch.

Serial device compaction techniques provide a number of advantages with respect to reducing cell area. Both layout cell height and width can be made smaller than with conventional flip-flops, often by a considerable amount. Cell area reductions on the order of one half may be easily achievable. This area reduction also normally reduces the cell height on the order of 25%. This reduction is reflected in the rest of the integrated circuit layout using the cell library. This is because the resetable edge triggered D-flip-flop (perhaps the most commonly used large logic cell) is used to optimize the cell library's layout parameters such as cell height.

Cell height and area reduction are greatly enhanced by the layout methodology made possible through serial compaction techniques. All the n- and p-channel transistors can be horizontally stacked with minimum spacing between transistors, and usually with no breaks in the stack active area to consume chip area unproductively. The order of n-channel and p-channel switches can be selected to provide high number direct vertical connections in poly. This gate order switching tradeoff reduces the number of poly-to-metal contacts (which consume chip area and add to parasitics) as well as take advantage of the normally tighter poly line pitch. Normally this device placement and connection can be performed with optimal device sequences of the clock and data input in their preferred order. Examples of this approach are provided in FIGS. 32A through 32C and FIGS. 16B and 16D, discussed below.

Serial device compaction techniques also provide a number of advantages with respect to reducing power consumption. The power dissipation of integrated circuit logic cells consists of both static and dynamic components: The static power is leakage current and the dynamic power is the sum of current produced by the parasitic capacitance being switched between logic voltage levels ($CV^2$) and the pass-through current produced while both n- and p-channel devices are on together during logic transitions.

The static leakage current is primarily form two sources: 1) the weak inversion leakage current of off transistors, and 2) the junction leakage currents.

Serial device compaction substantially reduces the active area diffusion that produces junction leakage current. Note, however, that the inactive diffusion does not have to be minimized, because it only supplies power to the logic switching devices and is normally placed in a substrate or well which is at the same power rail voltage.

With regard to low power for dynamic conditions, serial device compaction brings the active diffusion area within the logic cell to the practical minimum. This diffusion area has the highest parasitic capacitance of any of the integrated circuit interconnect structures of the cell. The diffusion between serial devices is made to be the minimum consistent with design rules for series MOS transistors laid next to each other.

Interconnect within the cell is also kept minimal in serial device compaction. This also reduces the amount of parasitics within the cell. Because these parasitics within the logic cell are low, the internal driving transistors within the cell can also be reduced in strength to further reduce the parasitic capacitance and the complementary transistor switching pass through current. This results in a superior power speed tradeoff within the cell.

In addition, often the sequential order of series MOS transistor switches minimizes the capacitance that makes voltage transitions during activity on the clock or data inputs. The data input may make numerous transitions while it is not being clocked in. The techniques described herein provide significant advantages here, such as no inverted clock node in the race-free design, and minimal parasitic capacitance on the complex-gate internal nodes from various design considerations.

Because clock/data races are controlled through the race-free flip-flop design, the extended clock delays and slow rise times from very low voltage operation do not threaten to cause a race mode of flip-flop operation.

Serial device compaction also impacts low voltage performance. For example, limiting the series devices to two and using a single p-channel active output pull-up transistor substantially reduces the delay extensions from exceptionally low voltage operation. Due to the low supply voltages, the transistors are operated in the weak and moderate inversion regions of operation instead of the normal saturated region of operation. When transistors are stacked, all transistors except the one nearest the power supply rail do not necessarily have their sources at the power supply rail voltage, and thus they are not driven as hard as the transistors at the supply rail. Since voltage headroom is at a premium in low voltage circuits, limiting the series stack to two transistors optimize the low voltage operation. Two series transistors are used, since it takes two transistors to make a logic gating function.

IV. Edge-Triggered D Flip-Flop Embodiments

The flip-flop embodiments described herein fall into several categories, with each category having auxiliary and degenerate sub-structures associated with it. One design enhancement in branch-based flip-flops is "race-free" design. In race-free design, the traditional race within an edge triggered flip-flop between the clock and the data is eliminated. The state changes are arranged to provide a sequential dependency of states on one another.

Figure 14:
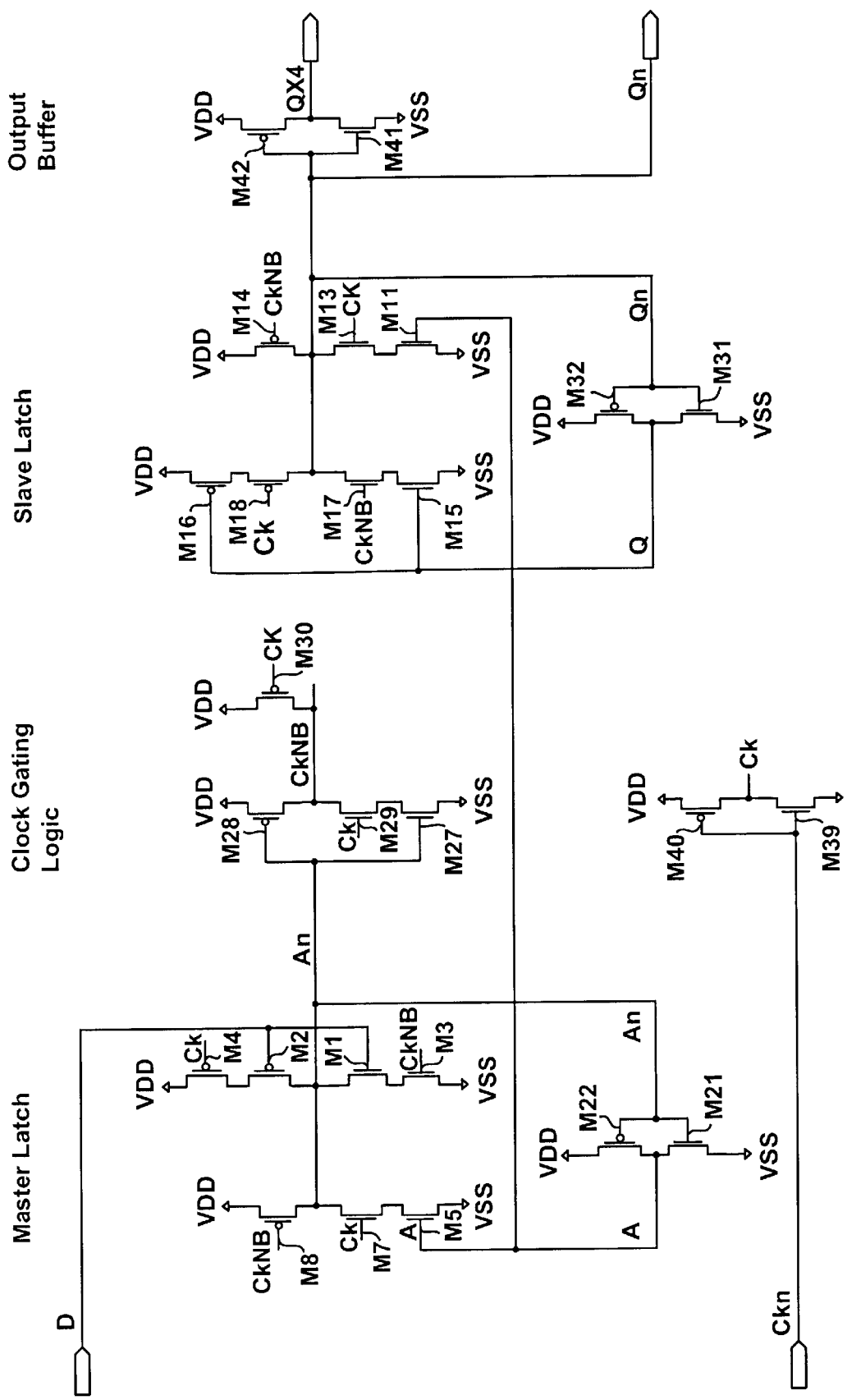
FIG. 14 is a schematic diagram of race-free edge-triggered D flip-flop with monophase clock, negative-edge clock input buffer, and Qx4 output buffer.

A fundamental race-free flip-flop is a race-free, edge-triggered data (D) flip-flop with a single-phase clock (Ck), and (Qx4) output buffer, an example of which is shown schematically in FIG. 14. FIG. 15 shows a schematic of a flip-flop that is similar to that in FIG. 14, but with the addition of an asynchronous-reset (R) control. The reset input R is only applied to the clock gating logic and the master latch feedback NOR gate, and not the slave latch. The reset input R could also be eliminated from the master latch; however, here it is applied to the master latch feedback NOR gate to assist in providing a rapid reset. Further, in those circuits, the reset input R is only applied to the transistor branches that are responsive to the inactive edge of the clock signal Ck. As a result, the reset R is not in the critical path of the clock. This feature is highly advantageous, in that it avoids adding series impedance to the critical clock path, which would tend to slow down transitions of the clock. Thus, in the clock gating logic, the reset input R is serially applied only to the (inactive edge responsive) pull-up branch of the clock signal path, formed by M38A, M38B, M28 and M30, and not the (active edge responsive) pull-down branch formed by M27 and M29. Similarly, in the master latch feedback NOR gate, the reset input R is serially applied to the (inactive edge responsive) pull-up branch of the clock signal path, formed by M22 and M24, and not the (active edge responsive) pull-down branch formed by M21. Note that this same principle may also be applied to a flip-flop with a set control input.

Figure 16D:
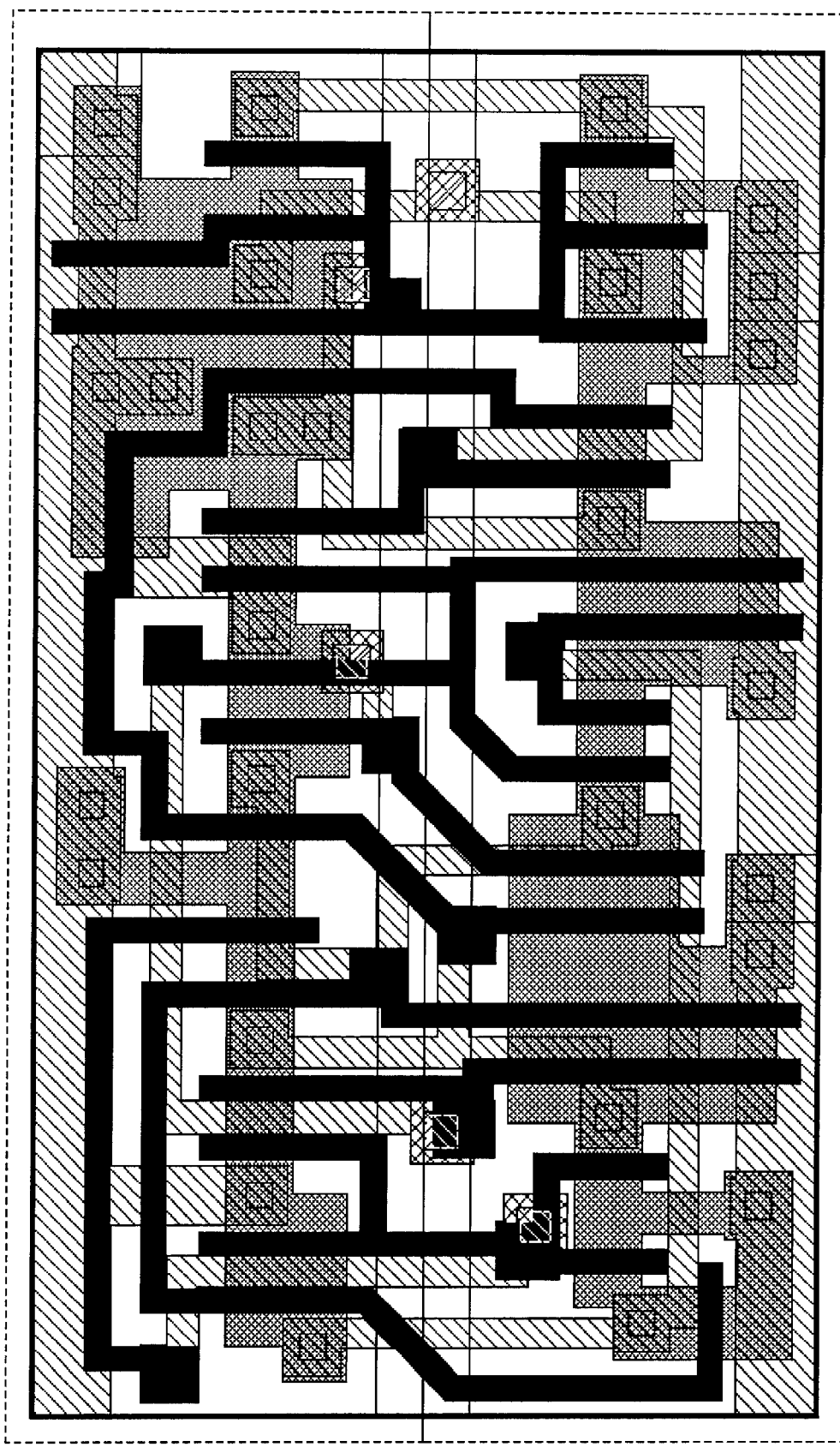

FIG. 16B shows a stick figure diagram of a layout that may be used for the circuit of FIG. 15. FIGS. 16A and 16C show the p-channel gate logic and the n-channel gate logic, respectively, for the stick diagram layout of FIG. 16B. FIG. 16D shows an actual cell layout similar to the stick diagram of FIG. 16B. From FIGS. 16B and 16D, it can be seen that, due to serial device compaction, each of the diffusion regions that is configured to switch signal level is shared by exactly two active transistors, in both the n-channel active area 161 and the p-channel active area 162. Note, however, that in contrast with conventional gates arrays, neither of the active areas includes any permanently inactive transistors.

Figure 17:
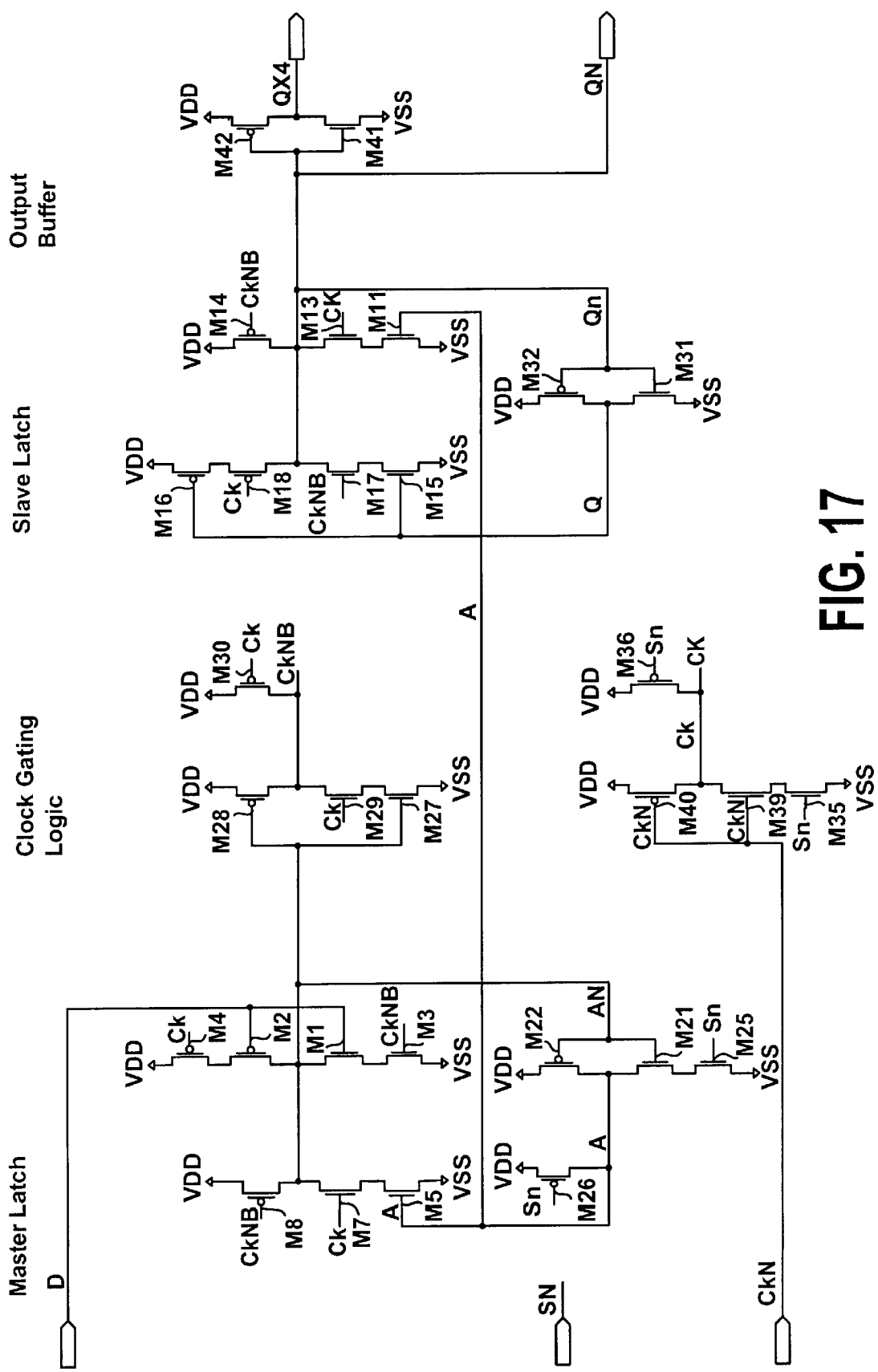
FIG. 17 is a schematic diagram of race-free edge-triggered D flip-flop with monophase clock, negative-edge clock input Buffer, Qx4 output buffer, and asynchronous-active-low-set.
Figure 18A:
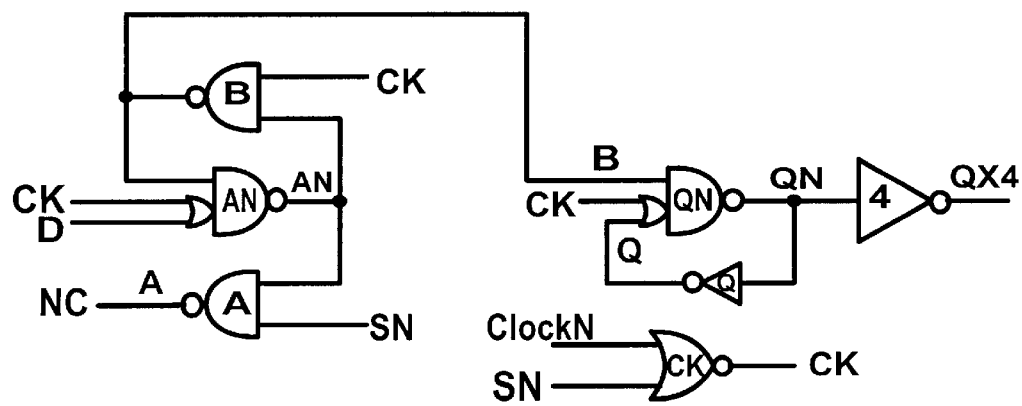
FIGS. 18A through 18C show, for the flip-flop of FIG. 17, the p-channel gate logic, a layout stick diagram, and the n-channel gate logic, respectively.
Figure 18B:
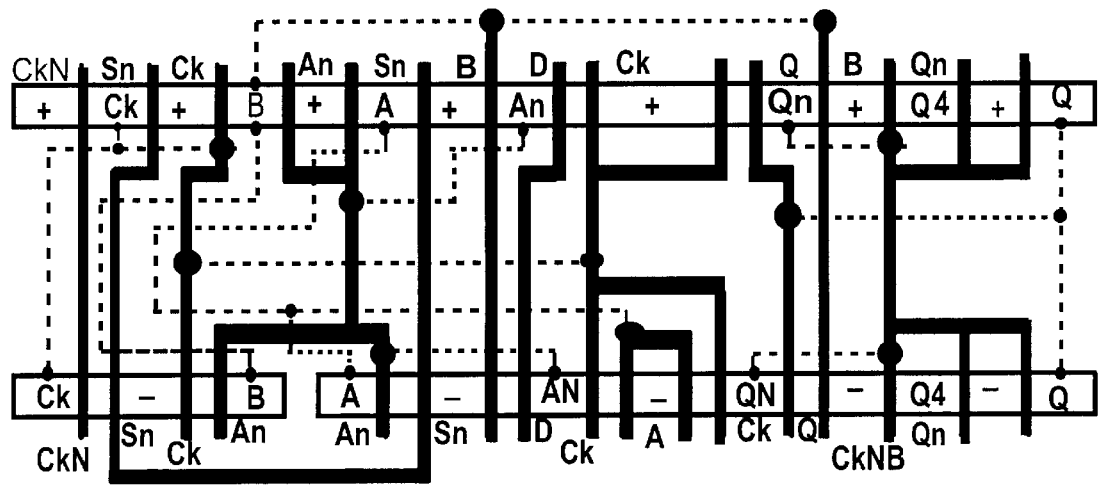
Figure 18C:
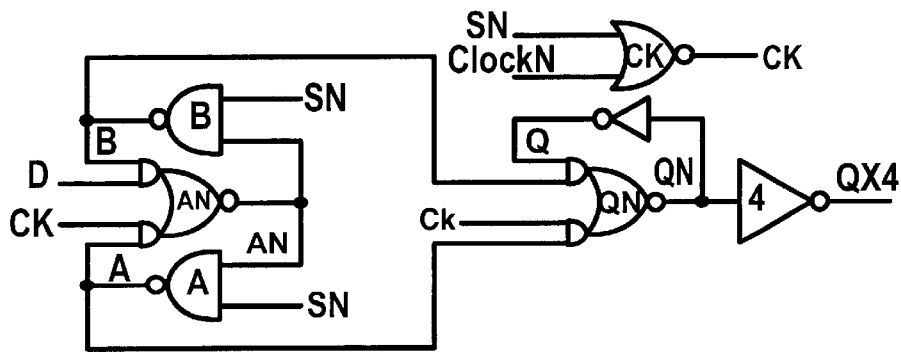

FIG. 17 shows a similar flip-flop to that shown in FIG. 15, but with an asynchronous-active-low-set control, instead of reset. Note that the reset class of flip-flop is believed to be the most commonly used class of flip-flop, followed by the set-reset class of flip-flop, followed by the set class of flip-flop. Flip-flops without set or reset are used very infrequently, because it is difficult to initialize them at power-on for testing. In a manner similar to that shown in FIG. 15, the set input Sn is only applied to the clock gating logic and the master latch feedback gate, and not the slave latch. Further, the set input Sn is only applied to the transistor branches in those circuits that are responsive to the inactive edge of the clock signal CkN. In the clock gating logic, the set input Sn is serially applied only to the (inactive edge responsive) pull-down branch of the clock signal path, formed by M35 and M39, and not the (active edge responsive) pull-up branch formed by M40. Similarly, in the master latch feedback gate, the set input Sn is out of the critical clock path. FIGS. 18A, 18B and 18C show, for the flip-flop of FIG. 17, the p-channel gate logic, a layout stick diagram, and the n-channel gate logic, respectively.

Flip-flops without either asynchronous-reset or asynchronous-set functionality are less desirable, since it is extremely difficult to test and initialize such flip-flops. Hence, it is desirable to have a layout within the same cell height of this flip-flop, with a full set of controls within its class, such as both an asynchronous-reset and asynchronous-set. An example of such a circuit is shown schematically in FIG. 19, which is a schematic diagram of race-free, edge-triggered D flip-flop with monophase clock, negative-edge clock input buffer, Qx4 output buffer, asynchronous-reset, and asynchronous-active-low-set. In a manner similar to that shown in FIGS. 15 and 17, the set and reset inputs are only applied to the clock gating logic and the master latch feedback gate, and not the slave latch. Further, the set and reset inputs are only applied to the transistor branches in those circuits that are responsive to inactive edges of the clock signals Ck and CkNB, or out of the critical path of the clock. In addition, note that each of the pull-up and pull-down transistor branches of this set-reset flip-flop includes no more than two series transistors.

Figure 19:
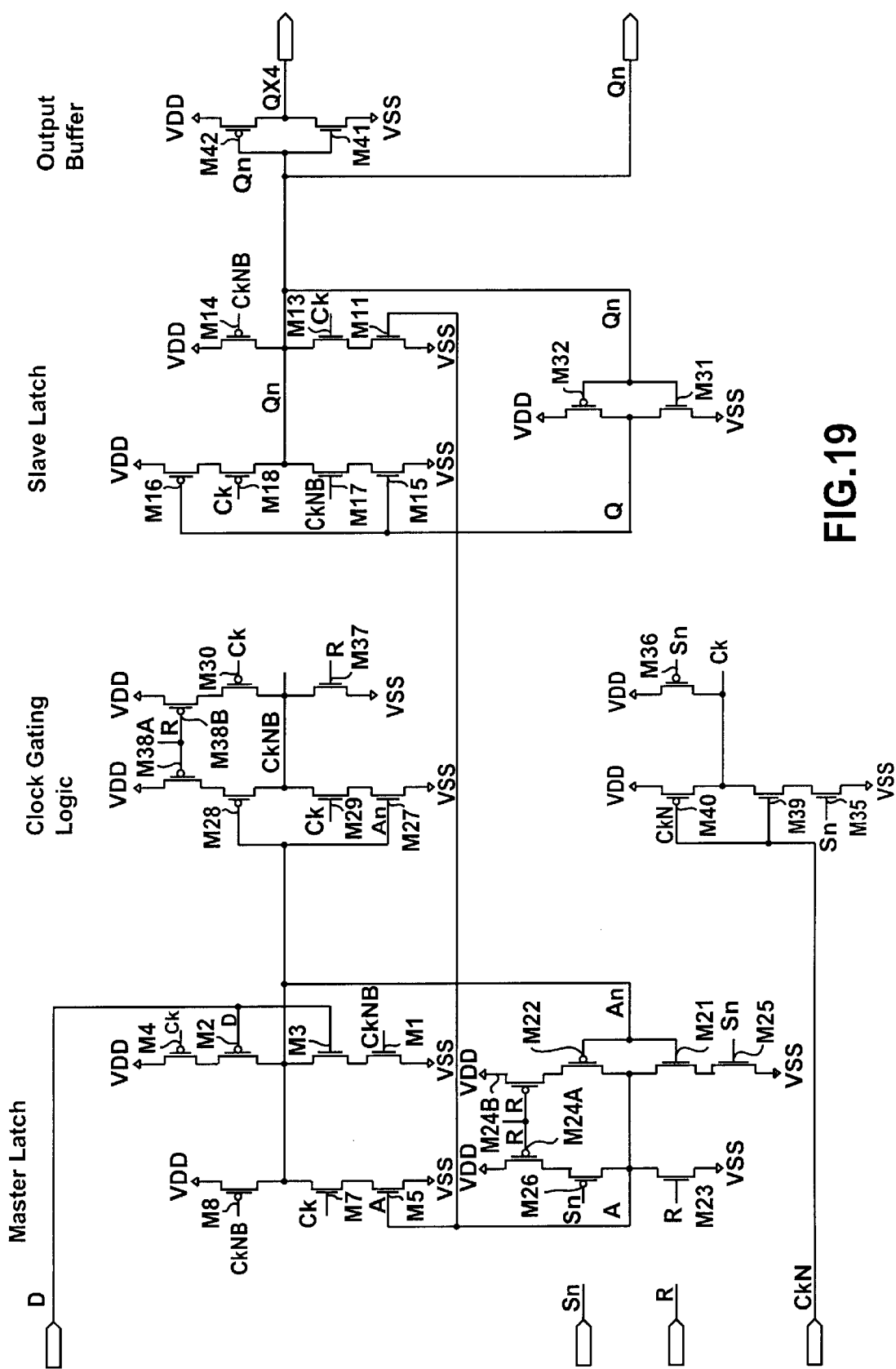
FIG. 19 is a schematic diagram of race-free, edge-triggered D flip-flop with monophase clock, negative-edge clock input buffer, Qx4 output buffer, asynchronous-reset, and asynchronous-active-low-set.
Figure 20A:
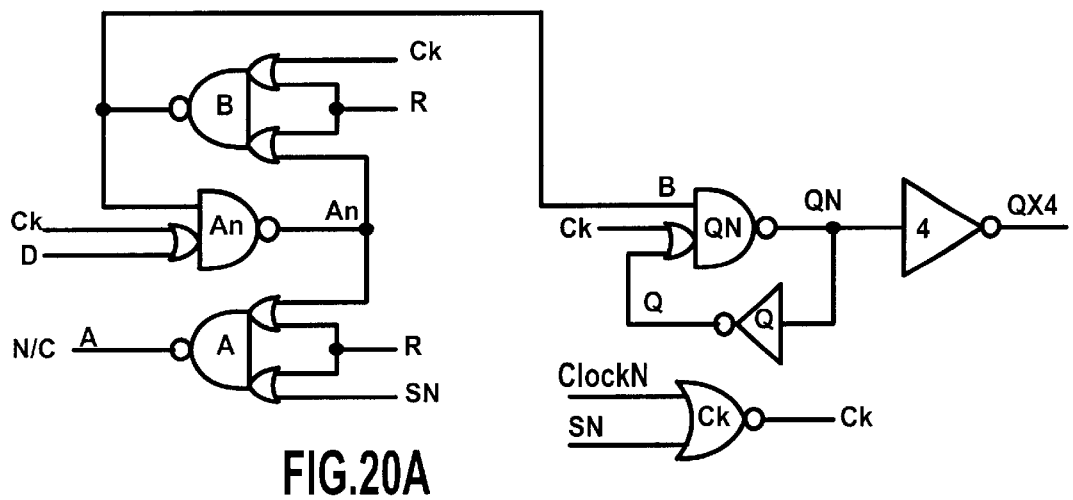
FIGS. 20A through 20C show, for the flip-flop of FIG. 19, the p-channel gate logic, a layout stick diagram, and the n-channel gate logic, respectively.
Figure 20B:
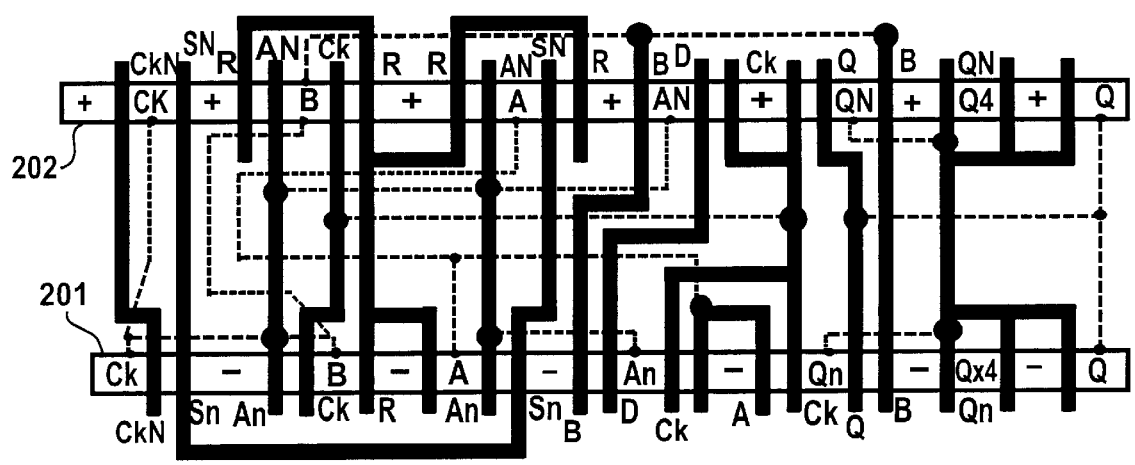
Figure 20C:
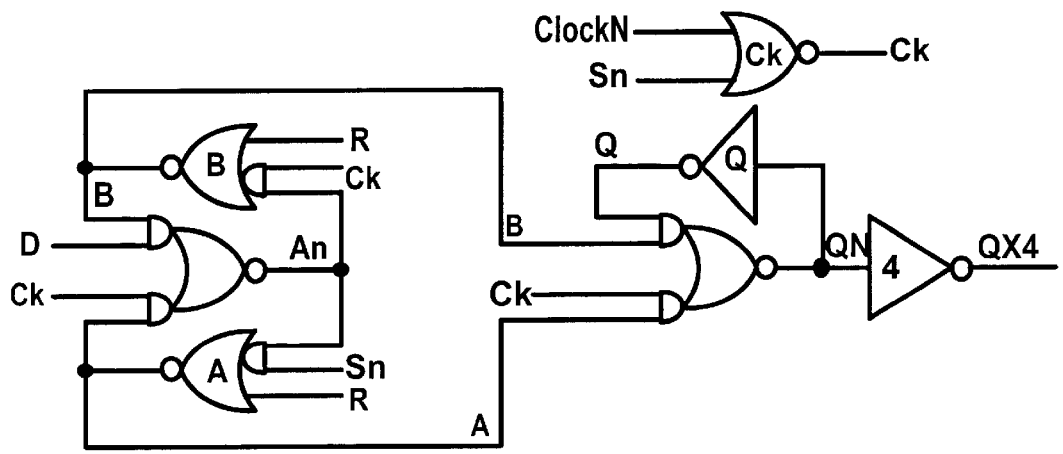
Figure 21:
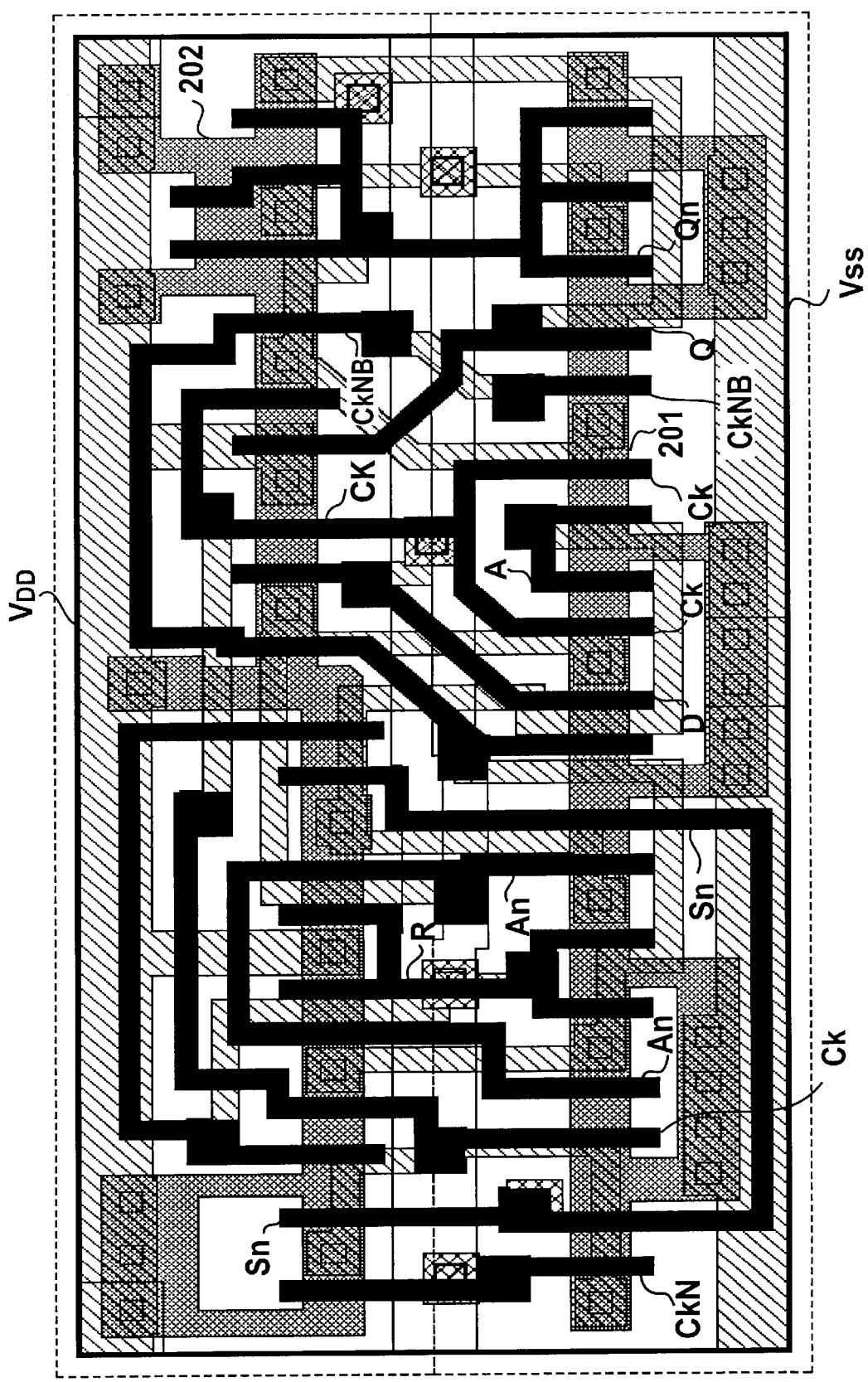
FIG. 21 shows a layout for the flip-flip of FIG. 19.

FIGS. 20A, 20B and 20C show, respectively, the p-channel gate logic, a layout stick diagram, and the n-channel gate logic, for the flip-flop of FIG. 19. FIG. 21 shows an actual layout of the flip-flop of FIG. 19, which roughly corresponds to (and may be derived from) the stick diagram of FIG. 20B.

The negative edge of the clock is used, because it is better controlled in the clock distribution buffers due to using the inherently stronger NMOS devices to drive the line. In at least one embodiment, this flip-flop cell has a width of only 18 Metal-2 tracks. The layout is nine Metal-2 tracks high, but by using two levels of metal inter-cell routing and making the types of layout tradeoffs discussed above, the cell height can be reduced to the minimum allowable, which is five Metal-2 tracks high. Note from FIG. 20B that both the n-channel active area 201 and the p-channel active area 202 are contiguous, due to the even number of branches in each of the logic gates located internal from the ends of the active areas. Thus, the largest flip-flop in a class of flip-flops can be constructed within the library topology optimized for the highest usage flip-flop.

Figure 22A:
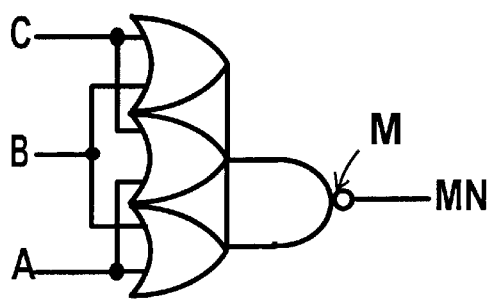
FIGS. 22A through 22D show, for a majority gate, the p-channel gate logic, the n-channel gate logic, a transistor schematic, and a layout stick diagram, respectively.
Figure 22B:
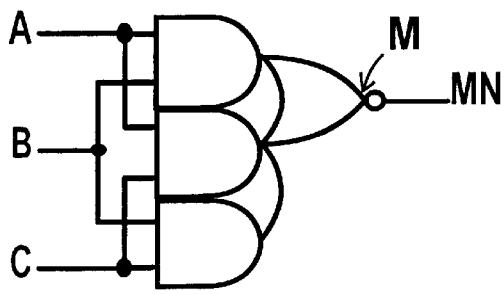
Figure 22C:
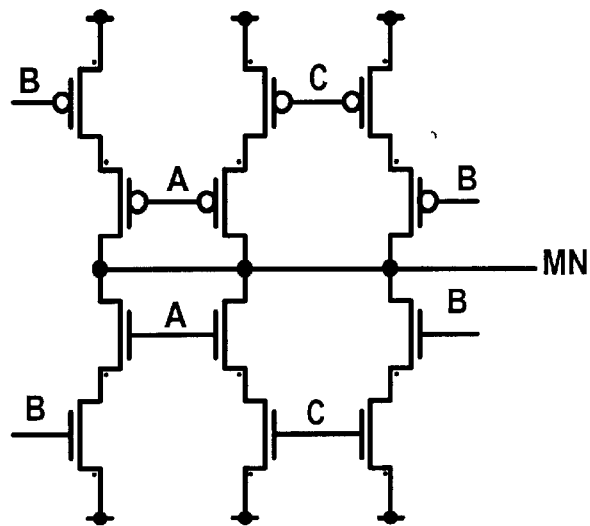
Figure 22D:
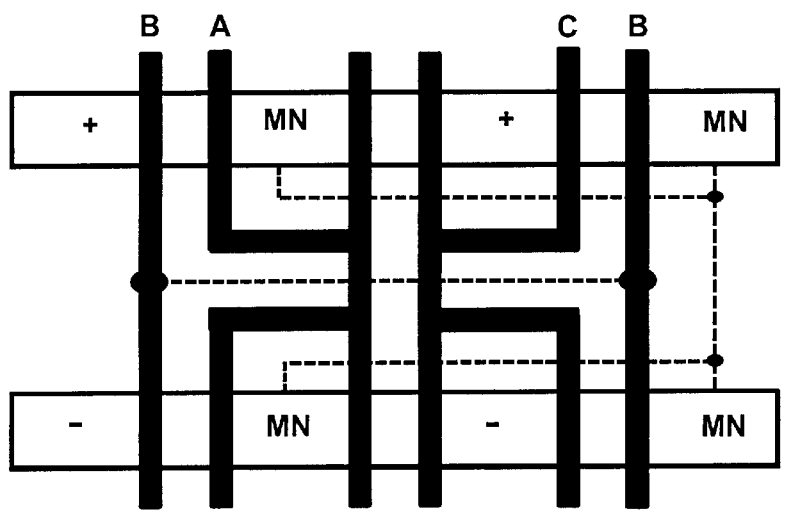

Additional complex cells must also be constructed within this same cell height to fit in the cell library. FIGS. 22A through 22D shows an example of how a majority gate can be designed with this technology to fit within the cell height of the flip-flop adjacent to it. Specifically, FIG. 22A shows the p-channel gate logic, FIG. 22B shows the n-channel gate logic, FIG. 22C shows the transistor schematic, and FIG. 22D shows a layout stick diagram.

Figure 23A:
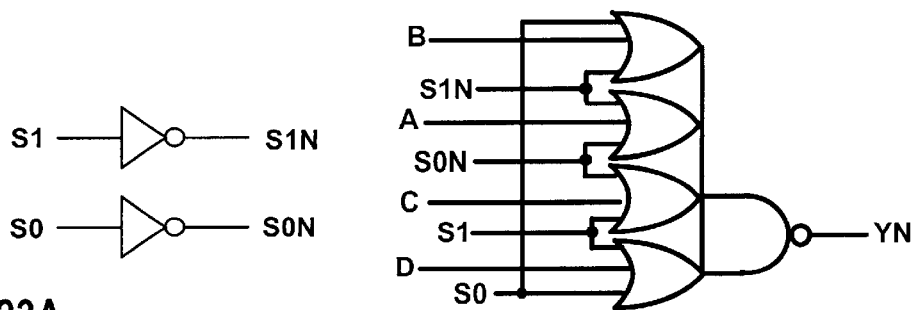
FIGS. 23A through 23D show, for a four-input, single-stage selector/multiplexer, the p-channel gate logic, the schematic diagram, the n-channel gate logic, and a serially-compacted layout stick diagram, respectively.
Figure 23B:
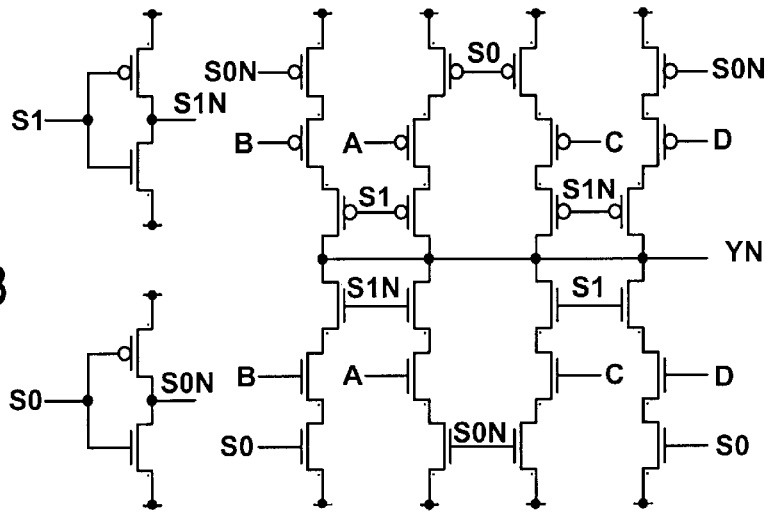
Figure 23C:
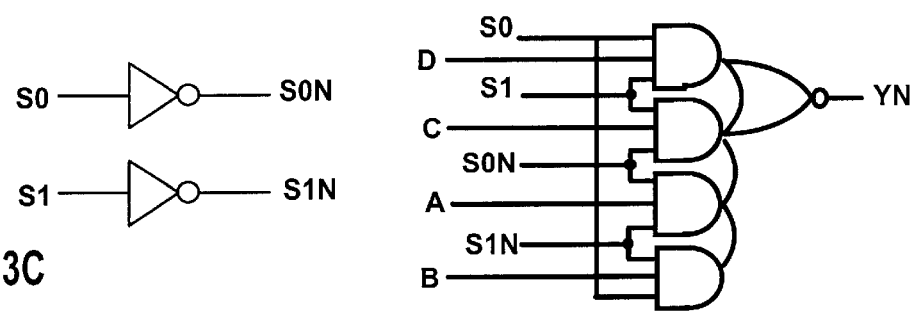
Figure 23D:
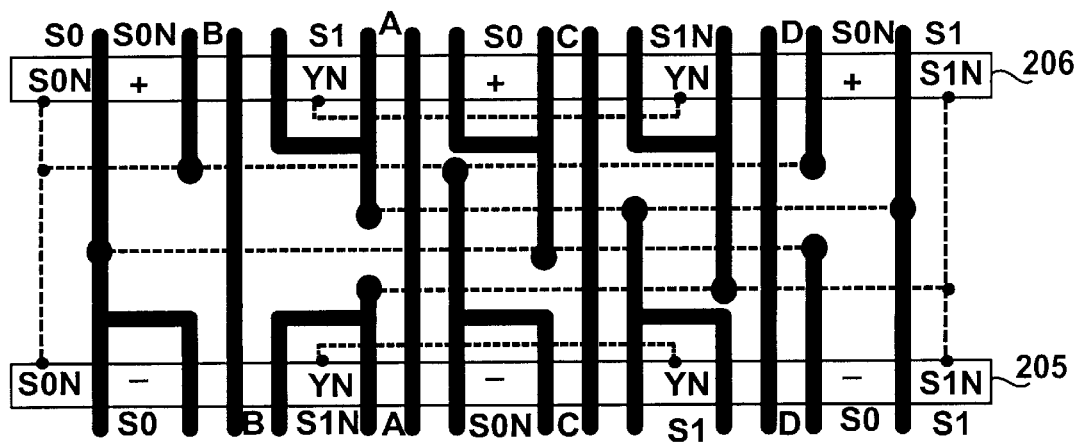
Figure 24A:
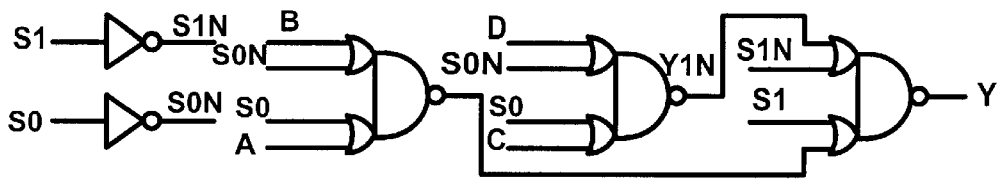
FIGS. 24A through 24E show, for a four-input, two-stage selector/multiplexer, the p-channel gate logic, a schematic diagram, the n-channel gate logic, a serially-compacted layout in stick diagram form, and an actual layout, respectively.
Figure 24B:
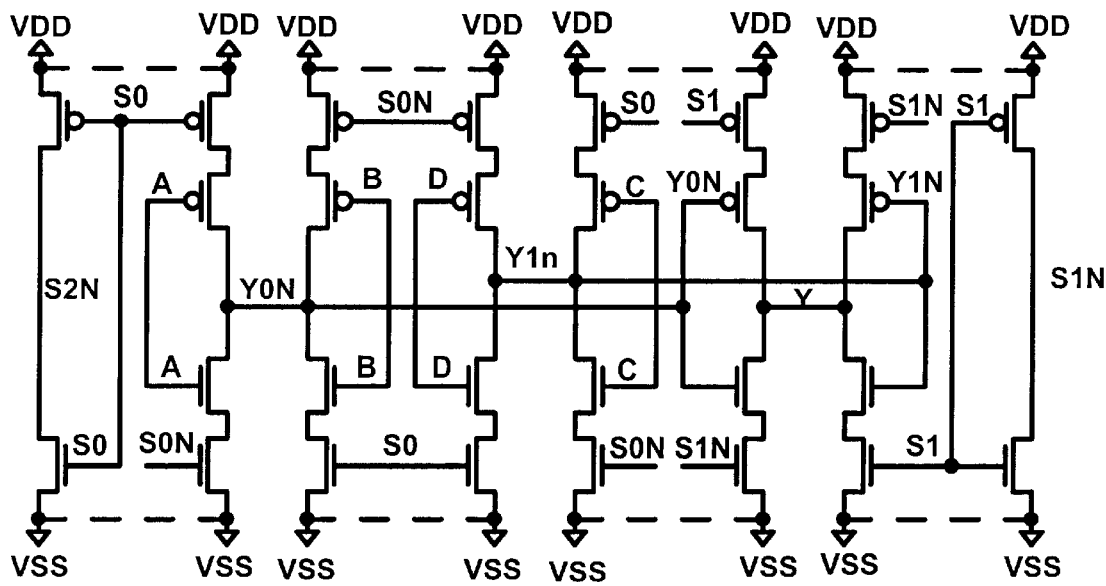
Figure 24C:
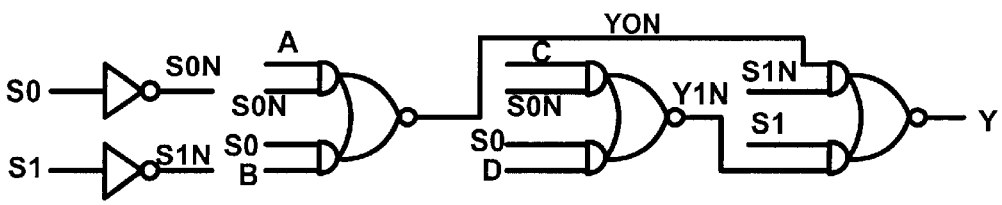
Figure 24D:
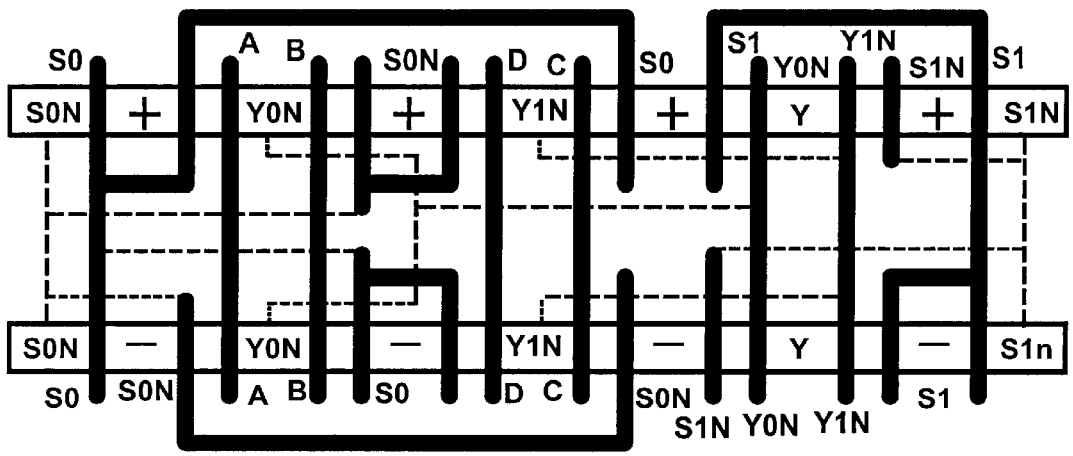
Figure 24E:
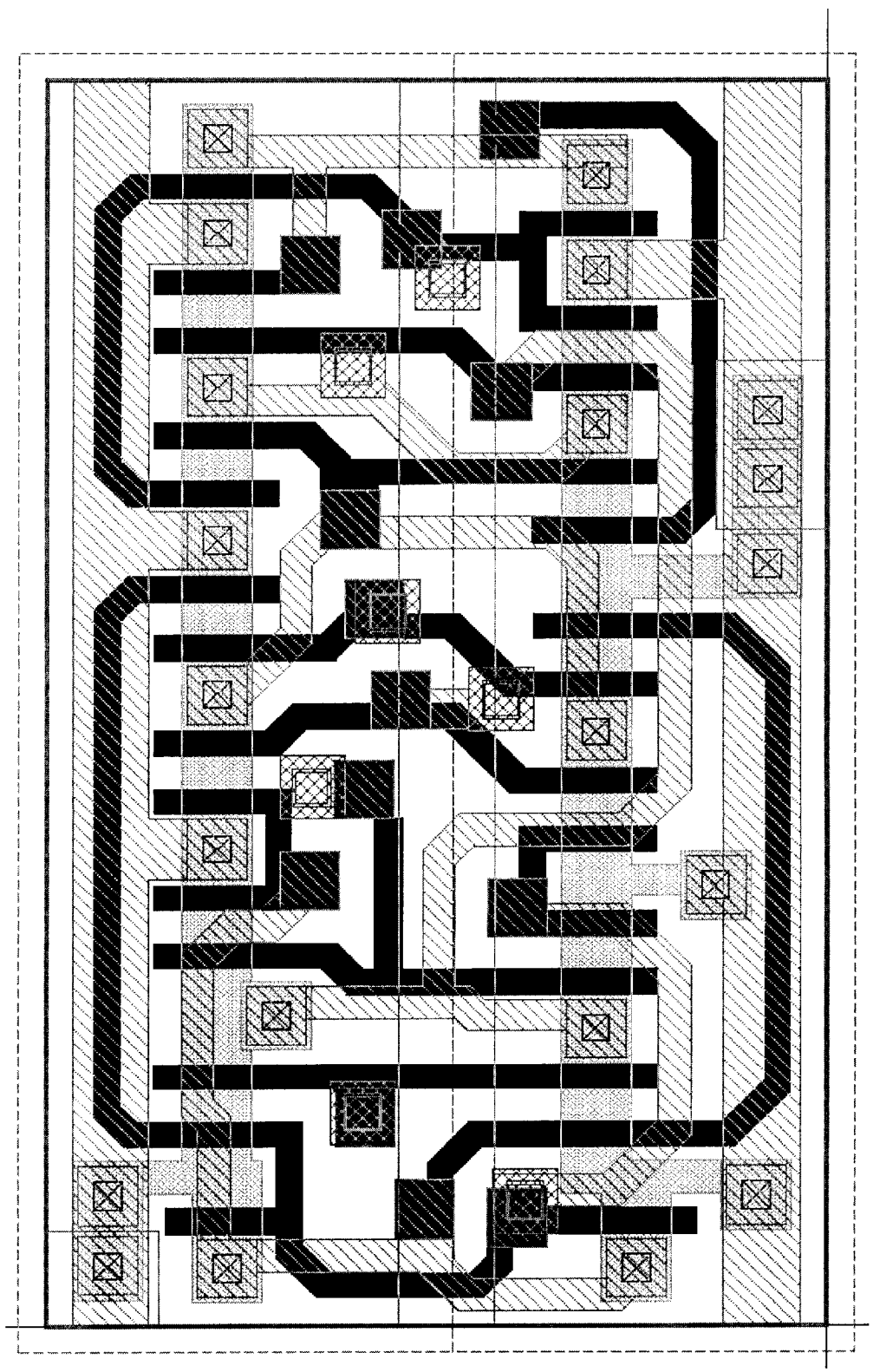

FIGS. 23A through 23D show an example of how a single-stage, four-input multiplexer can be designed with this technology to fit within the cell height of the flip-flop adjacent to it. FIG. 23A shows the p-channel gate logic, FIG. 23C shows the n-channel gate logic, FIG. 23B shows the transistor schematic, and FIG. 23D shows a serially compacted layout in stick diagram form. The logic equation for the p-channel logic is given by YN=(A+S0N+S1N)·(B+S0+S1N)·(C+S0N+S1)·(D+S0+S1), where S0 and S1 are the selection signals and A, B, C and D are the four inputs. The logic equation for the n-channel logic is given by YN=(A·S0N·S1N)+(B·S0·S1N)+(C·S0N·S1)+(D·S0·S1). Note from FIG. 23D that both the n-channel active area 205 and p-channel active area 206 each are contiguous, and the poly connections are well-organized for efficient use of the cell area. Similarly, FIGS. 24A through 24E show an example of how a two-stage, four-input multiplexer can be designed with this technology. FIG. 24A shows the p-channel gate logic, FIG. 24B shows the transistor schematic, FIG. 24C shows the n-channel gate logic, and FIG. 24D shows a serially compacted stick diagram layout. FIG. 24 shows an actual layout of the two-stage, four-input multiplexer. Here, again, the n- an p-channel active areas each are contiguous.

Even though these larger cells can be constructed at a low cell height, logic gates such as a two-input NAND gate (probably the most commonly used gate in a cell library) can be constructed at a lower height. When these cells are combined in a cell library, the power rails must match. In order to accomplish this, the cell height of the gates must be increased to that of the taller flip-flops wasting this additional area. Lower profile flip-flops and larger cells minimize this lost chip area.

An internal input clock buffer enhances the functionality and performance. Buffering the external clock input to the flip-flop imposes the minimum load on the distributed clock line. The buffer uses near minimum n- and p-channel device sizes. This minimal input clock buffer is functionally optimized when the active edge of the flip-flop clock is negative going. Functionally, this inverted clock edge configuration is superior because it allows the time-critical active edge of the final routed clock signal to be driven with inherently stronger n-channel devices of the clock line distribution buffer output. The other edge of the clock line distribution buffer, driven by its inherently weaker p-channel devices, only has to setup the clock logic signal for its next time critical active edge.

Coincident Complementary Clock Generation

Within the flip-flop, the buffered clock provides better-controlled rise and fall times, since the internal clock signals are isolated from variations in slope of the external clock signal. The active rising and falling edges of the internal complementary clock signals should be "coincident". That is, the two signals should cross as close as possible to the mid-point in their voltage ranges. This can be accomplished by making the first internal clock's critical edge slow in transition, which is followed by the inverted second internal clock critical edge going fast in transition. This effect is enhanced by the reverse-ratioed clock inverter transistors causing the transition of the second clock to start early. Thus, the (complementary) clocks are designed to cross each other as close to the mid-point in their transition as possible.

Figure 25:
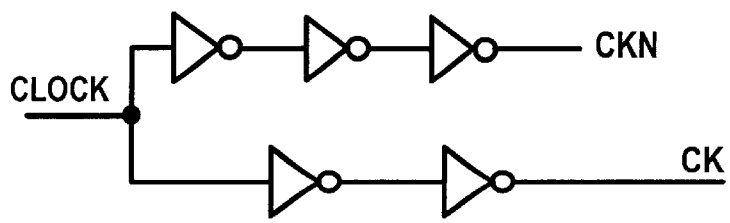
FIG. 25 shows a coincident complementary clock generator.

The flip-flop may use an embodiment of a clock generator such as shown in FIG. 25, which has more transistors but greatly improved performance. Specifically, FIG. 25 shows a coincident clock generator that may be desirable when numerous flip-flops share the same clock, such as in a register file or a shift register. The inverter chains in the clock tree are sized to obtain the same delay from Clock input to both Ck and CkN outputs on the critical clock edge. Ratioing of transistors in this clock buffer can be used to caused these coincident output signals to cross each other at the most active part of their voltage swing, i.e., at the midpoint between the high and low voltage levels.

Figure 27:
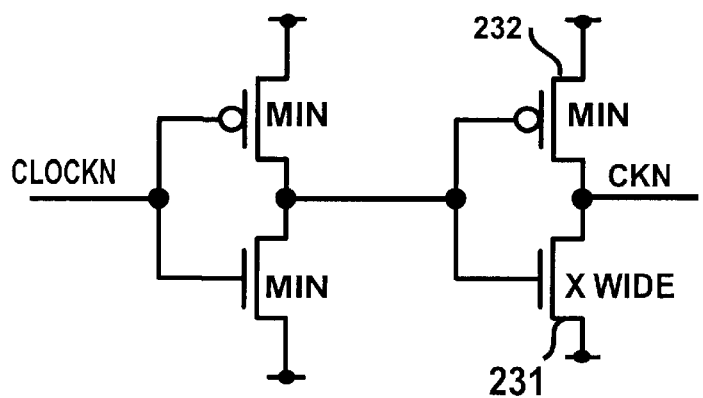
FIG. 27 shows an internal flip-flop coincident clock generator.
Figure 29:
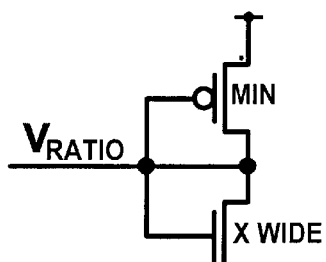
FIG. 29 schematically shows a reverse ratioed inverter along with $V_{Ratio}$.

FIGS. 27 through 29 show how the coincident clock generator may be implemented to achieve the desired results. FIG. 27 is a schematic diagram showing an example of an internal flip-flop coincident clock generator comprising a series pair of inverters, the final output of which is the CkN signal. Note that first series inverter is an optional isolation inverter to control the slope of the Ck signal and to minimize CLOCKN input capacitance. Each inverter is formed from a complementary pair of n- and p-channel transistors. Each of the transistors has a gate that has a minimal width, except for the n-channel pull-down transistor 231 in the second (output) inverter—the output n-channel transistor 231 has a substantially wider gate width than that of the other transistors, particularly that of its complementary pull-up transistor 232. In at least one embodiment, the gate of the n-channel pull-down transistor 231 is at least twice the width of the gate of the corresponding p-channel pull-up transistor 232. This is in contrast with the conventional technique in which the p-channel pull-up transistor is generally at least twice as wide as the n-channel pull-down transistor.

Figure 28A:
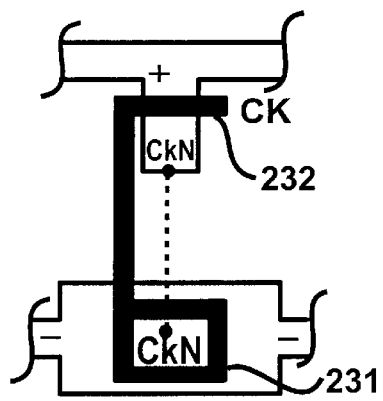
FIGS. 28A and 28B show layout for obtaining a ratioed complementary pair of transistors.
Figure 28B:
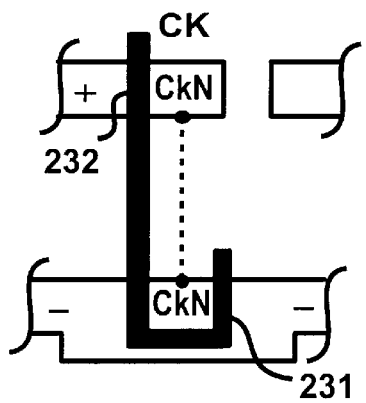
Figure 30:
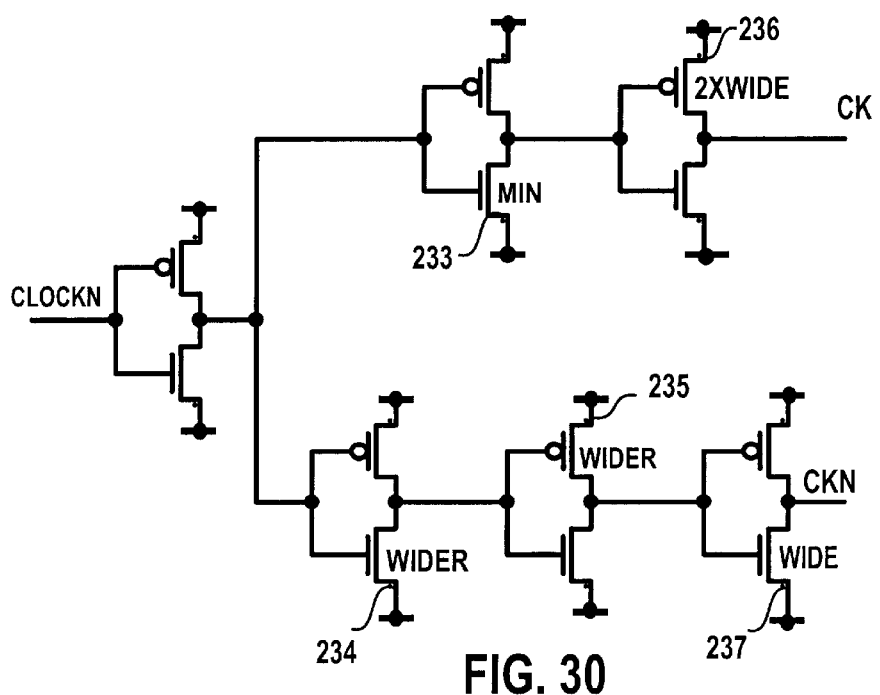
FIG. 30 shows a transistor schematic diagram of the external coincident clock generator of FIG. 25, according to at least one embodiment.

The wider gate width of the output pull-down transistor can be achieved, for example, by forming that transistor as a "donut" shaped transistor, as shown in the layout stick diagram of FIG. 28A, or as a "U" shaped transistor, as shown in FIG. 28B, or an "L" shaped transistor, or the like. FIG. 29 shows a simple schematic of a reverse-ratio inverter, connected to illustrate how its transfer function is offset to $V_{RATIO}$. This offset starts its output early. FIG. 30 schematically shows an example of an external coincident clock generator, which is the same clock generator as shown in FIG. 25. To achieve the desired signal responses, n-channel transistor 233 is selected to have a minimal gate width. N-channel transistor 237 is selected to have a somewhat wider gate width than transistor 233. Transistors 234 and 235 are selected to have wider gate widths than normal. And, transistor 236 is selected to have a gate width of approximately twice that of transistor 237. Transistors 236 and 237 are to be of equal strength to produce symmetric complementary outputs, while transistors 234 and 235 are adjusted to equalize the relative delays.

Figure 26A:
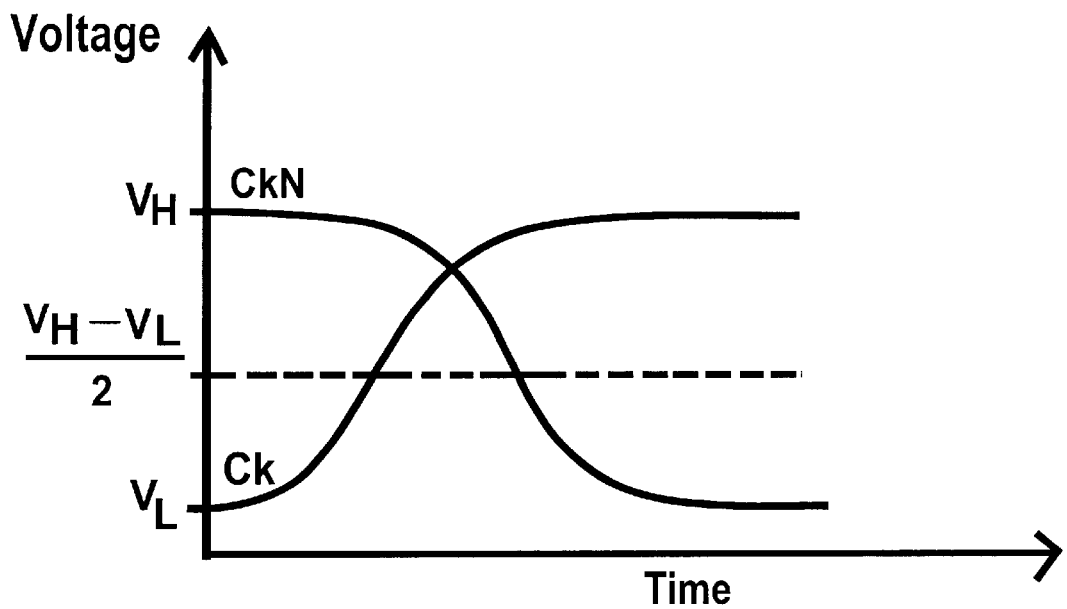
FIG. 26A shows a plot of two complementary clock signals without the use of the coincident clock generator.
Figure 26B:
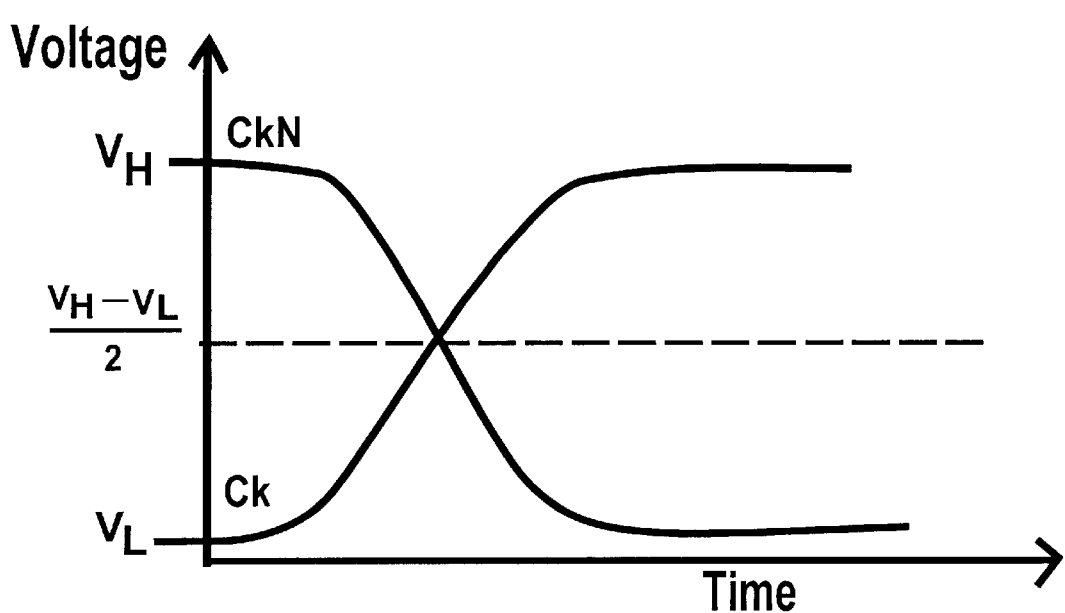
FIG. 26B shows a plot of two complementary clock signals with the use of the coincident clock generator.

FIG. 26B shows the two complementary clock signals CK and CkN for an embodiment which incorporates the coincident clock generator technology, including the above-noted ratioing. The negative-going clock signal CkN transitions more quickly in this plot than in the plot of FIG. 26A, which shows an example of the two signals when such ratioing has not been used. In FIG. 26A, the two signals cross at a level that is undesirably high, due to the slower transition of the CkN signal.

Thus, the coincident clock generator design maximizes speed, reduces power dissipation, and significantly reduces the band of worst-case setup and hold times to a minimal value. The result is superior system performance in data reliability, speed, and power of the flip-flop.

Figure 31:
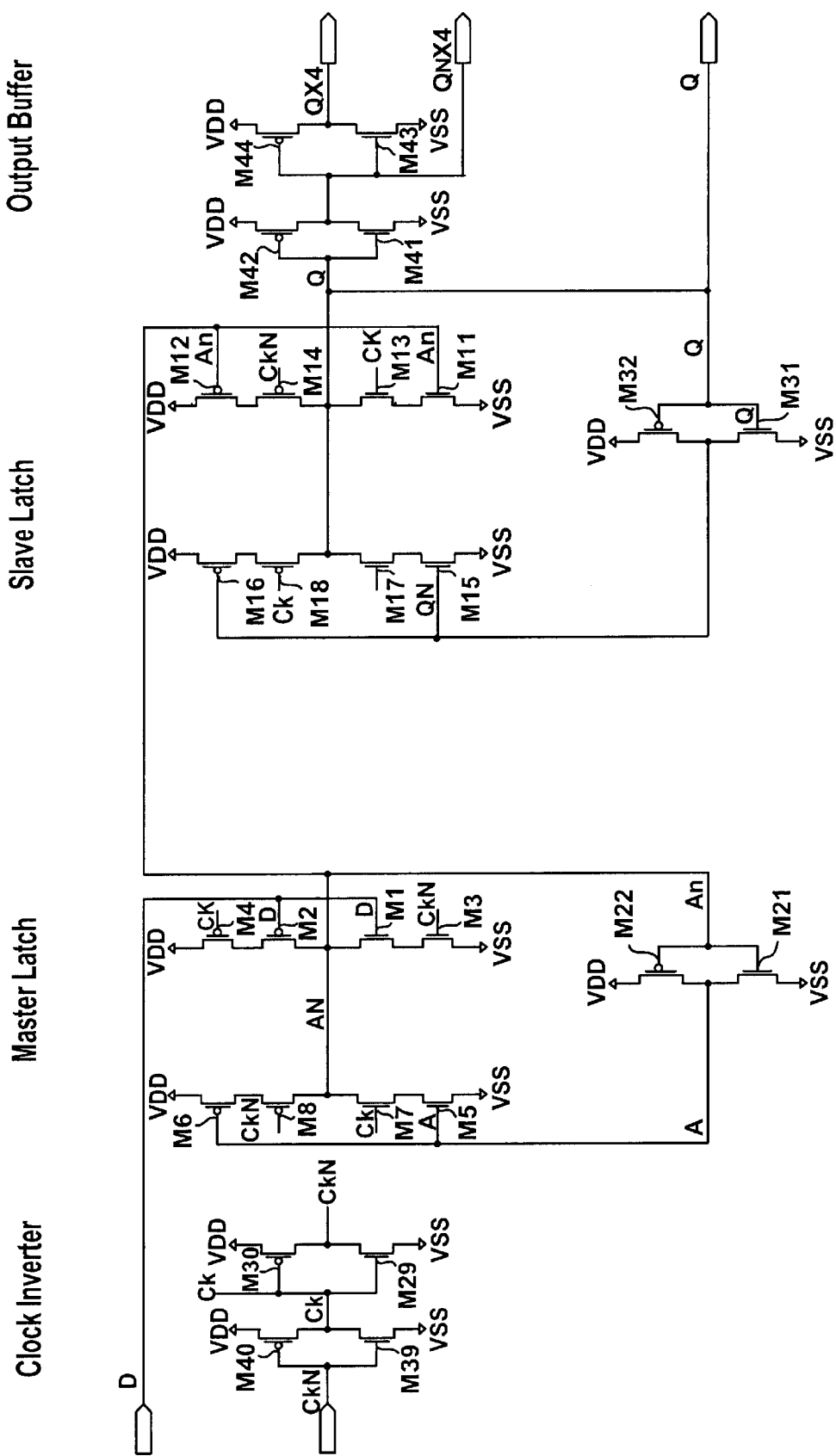
FIG. 31 shows schematically a symmetric-serial edge-triggered D flip-flop with negative-edge clock input buffer, and Qx4 output buffer.

An embodiment of a flip-flop which uses the coincident clock generator with an inverted clock input is shown in FIG. 31 (transistors M29, M30, M39 and M40). FIG. 31 schematically shows a symmetric-serial edge-triggered D flip-flop with negative-edge clock input buffer, and Qx4 output buffer. In the race-free configuration, the equivalent to the inverted clock signal is only used when the Q output is to be in its low state-the low-going CkNB signal is used for only two of the four setup and hold operations for a low Q output while the Ck signal goes high in all four cases of the plot.

Figure 33A:
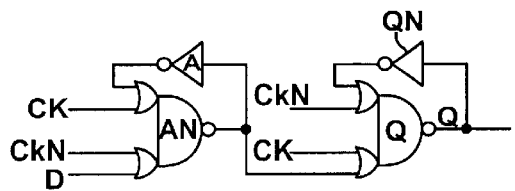
FIGS. 33A through 33G show, for the flip-flop of FIG. 31, the p-channel gate logic, the p-channel tri-state logic, a layout-preparatory schematic, the n-channel gate logic, and n-channel tri-state logic, a stick figure layout diagram, and an actual layout, respectively
Figure 33B:
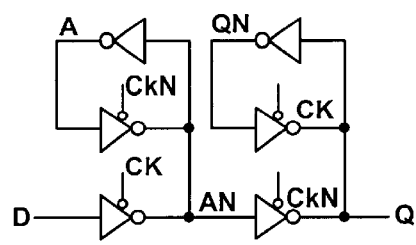
Figure 33C:
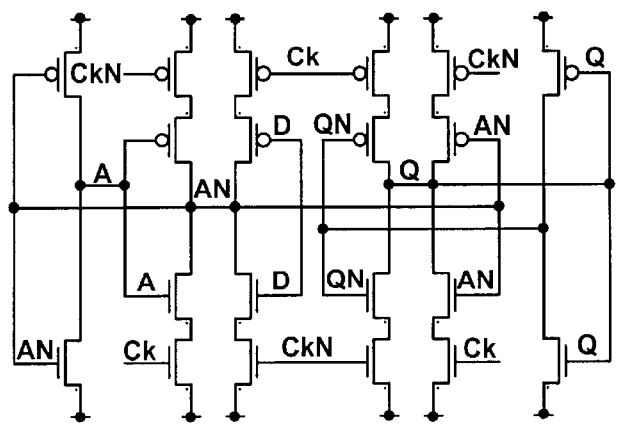
Figure 33D:
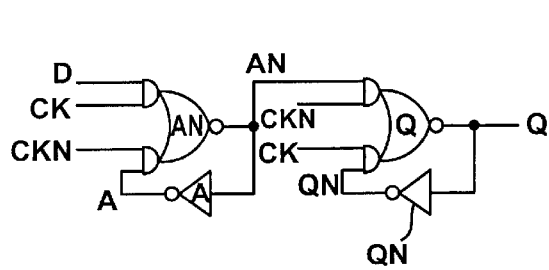
Figure 33E:
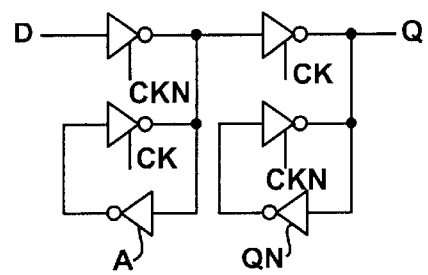
Figure 33F:
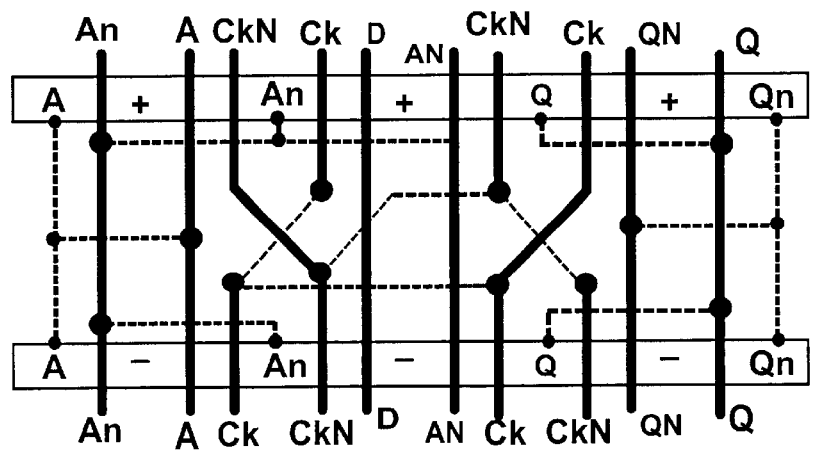
Figure 33G:
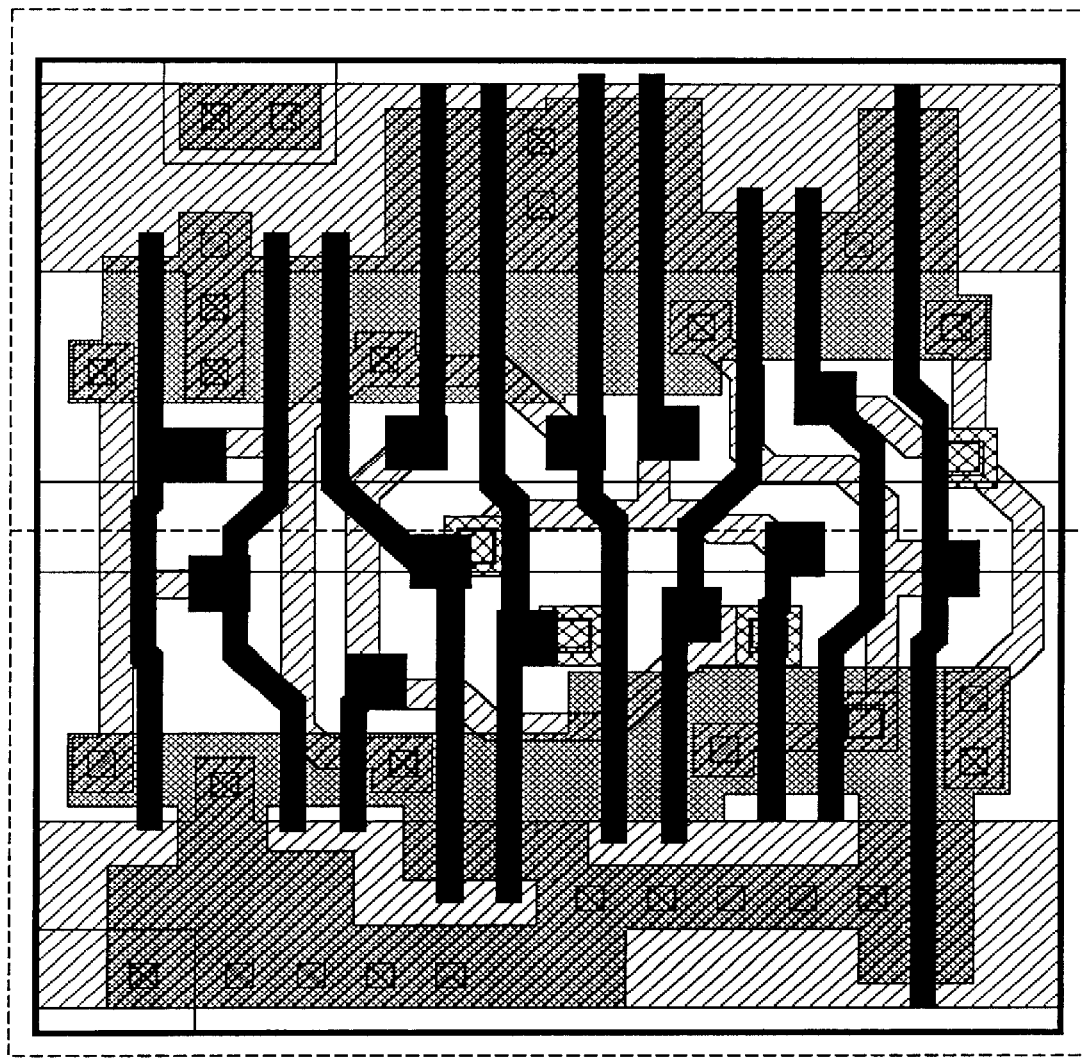

FIGS. 33A through 33F show several representations of the symmetric-serial D flip-flop of FIG. 31, which is designed according to the above-described serial device compaction. Specifically, FIG. 33A shows the p-channel gate logic; FIG. 33B shows the p-channel tri-state logic; FIG. 33C shows a layout-preparation oriented schematic; FIG. 33D shows the n-channel gate logic; FIG. 33E shows the n-channel tri-state logic; FIG. 33F is a stick figure layout diagram, and FIG. 33G is an actual layout. This may be the smallest fast, edge-triggered layout configuration of the symmetric-serial class of flip-flop, having a cell height of 10 Metal-2 interconnect tracks. With a cell width of 10 Metal-2 tracks, this cell is square and is equivalent in size to about two and a half standard two-input NAND gates. As a result, with minimal parasitic capacitive loading to transistor width ratio, this flip-flop operates extremely fast and has extremely low power dissipation. Both the n- and p-channel active areas are contiguous and require only minimum critical design rule spacing along the stacks of transistors. The poly gate interconnections are at their shortest and most direct hookup routes from their straight well organized transistors, and the metal is minimal and direct with no poly jumpers between two sections of metal interconnect. The varying widths (strength) of transistors in this layout work well in this configuration and are sized for speed and balance of drive as required making an optimum fast flip-flop, even at low power supply voltages since all devices have gain and a maximum of two series transistors are used. The lowest power and smallest area configuration of this flip-flop is when all transistors are the minimal width of the smallest transistor in this layout. Even on this minimal flip-flop, the benefits of this invention's serial compaction technology are realized. The layout stick diagram of FIG. 33F indicates that this flip-flop cell height will lay out at the minimum for gates which are four or five Metal-2 tracks. The clock inverter would normally come from a global implementation of coincident clock generator technology shown in FIGS. 25 and 30.

Figure 34:
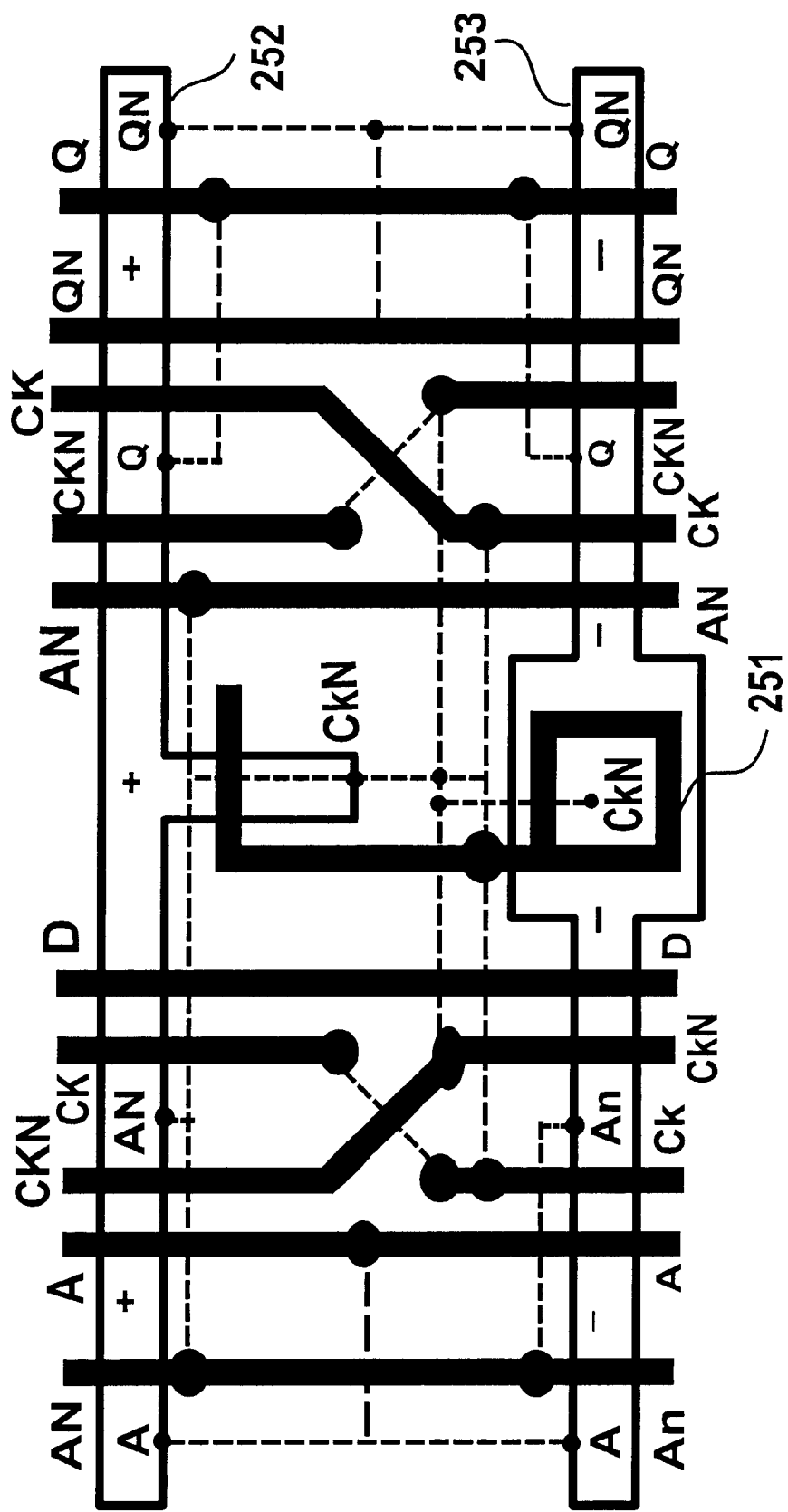
FIG. 34 shows a symmetric-serial edge-triggered D flip-flop layout variation of the layout of FIG. 33F, with coincident-clock-generator technology for a fast critical edge clock inverter configuration.
Figure 35:
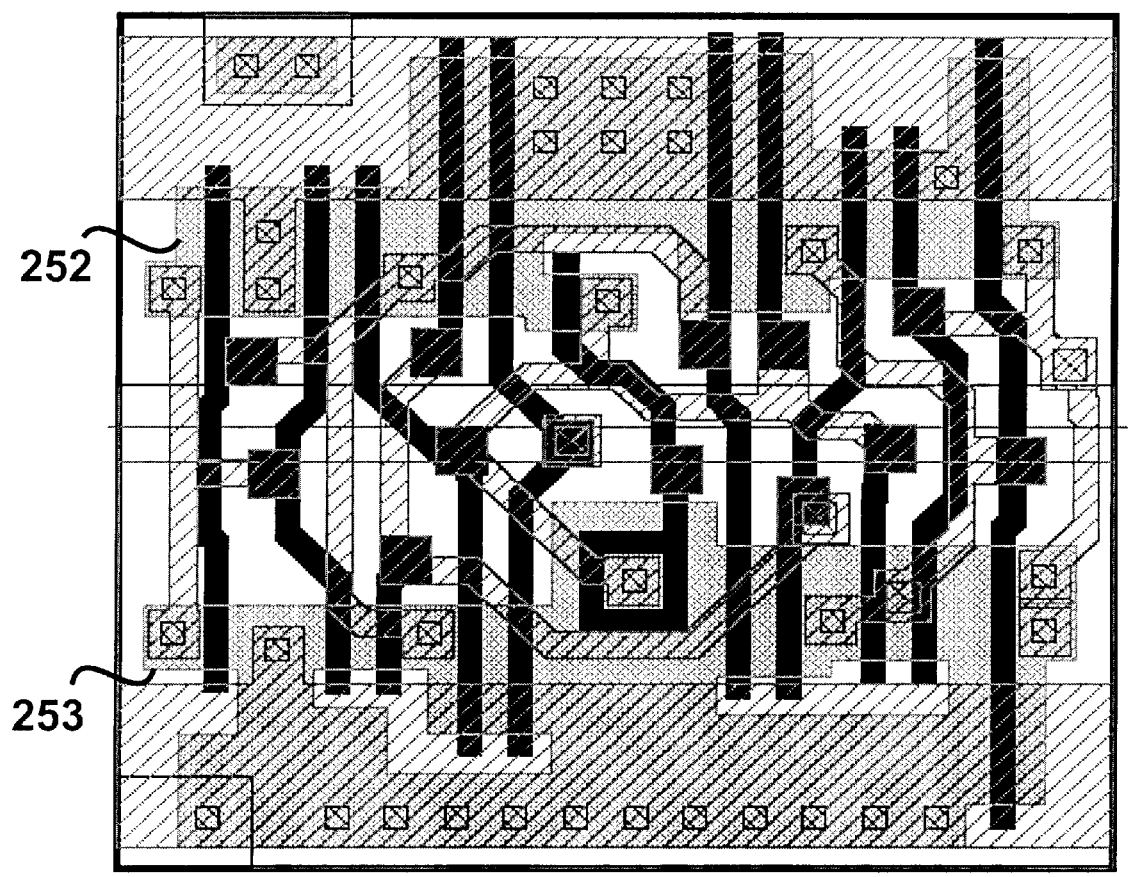
FIG. 35 shows an actual layout corresponding to FIG. 34.
Figure 36:
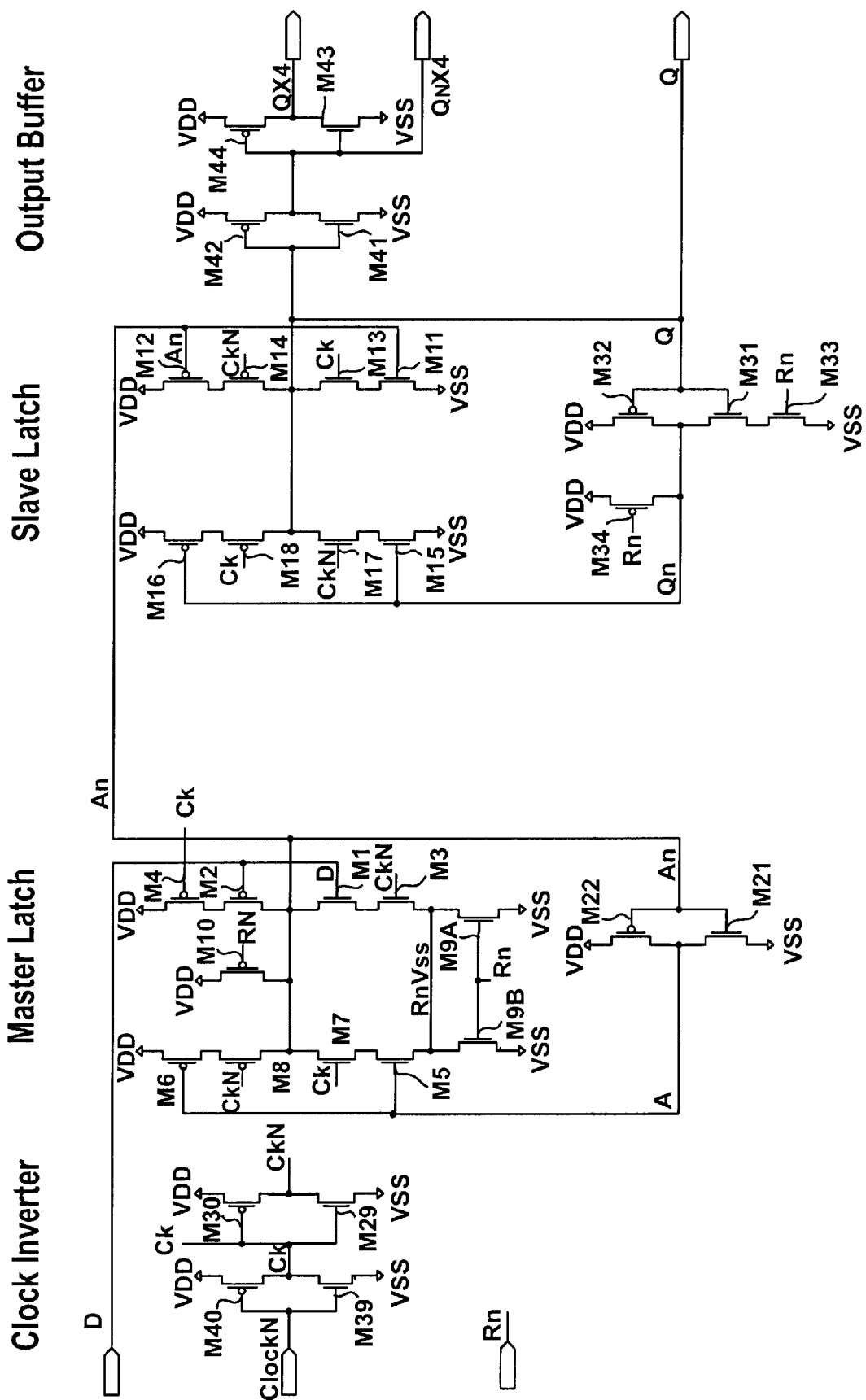
FIG. 36 is a schematic diagram of symmetric-serial edge-triggered D flip-flop with negative-edge clock input buffer, with coincident clock generator technology, Qx4 output buffer, and asynchronous-active-low reset.
Figure 37:
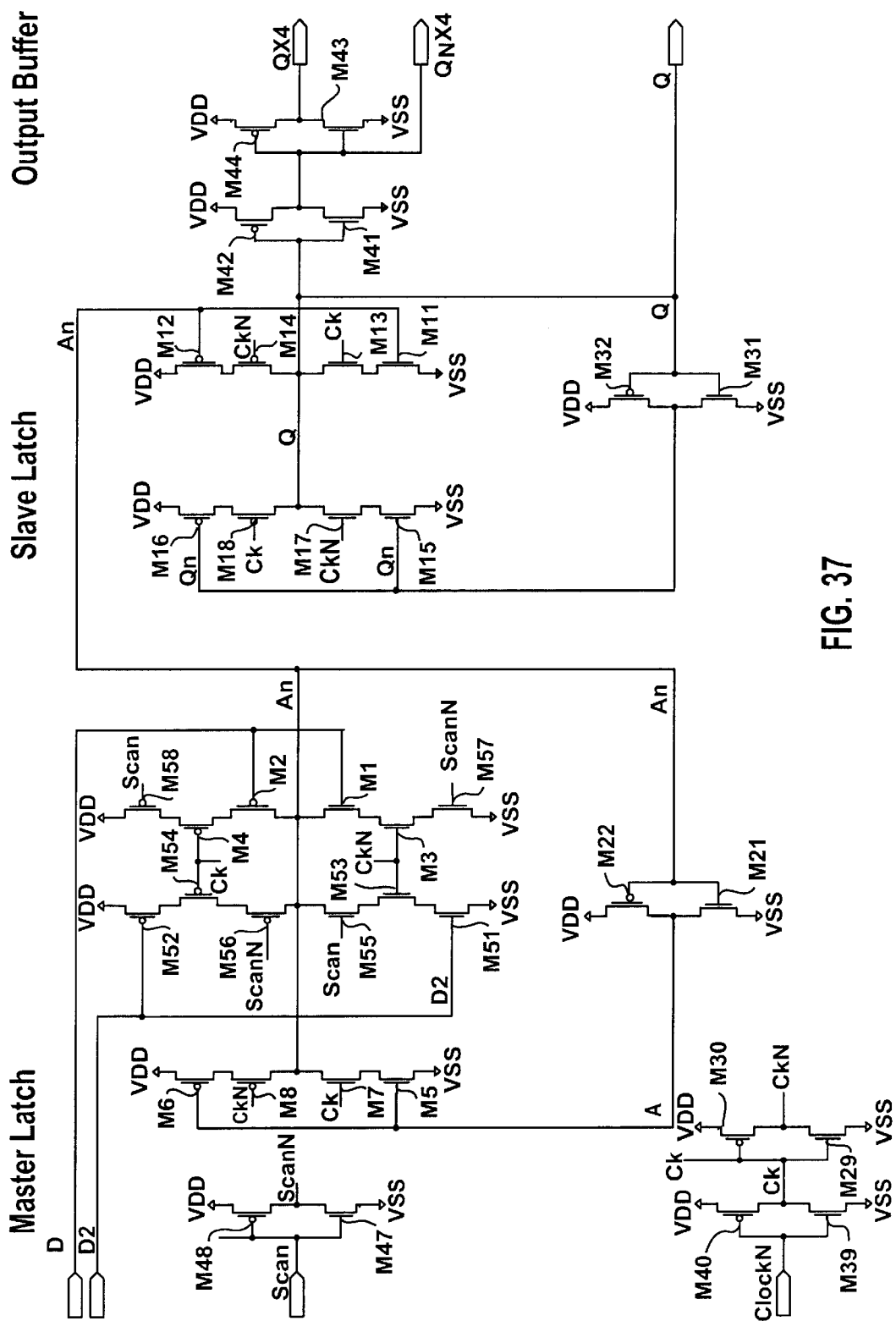
FIG. 37 is a schematic diagram of symmetric-serial scan edge-triggered D flip-flop with negative-edge clock input buffer, and Qx4 output buffer.
Figure 38:
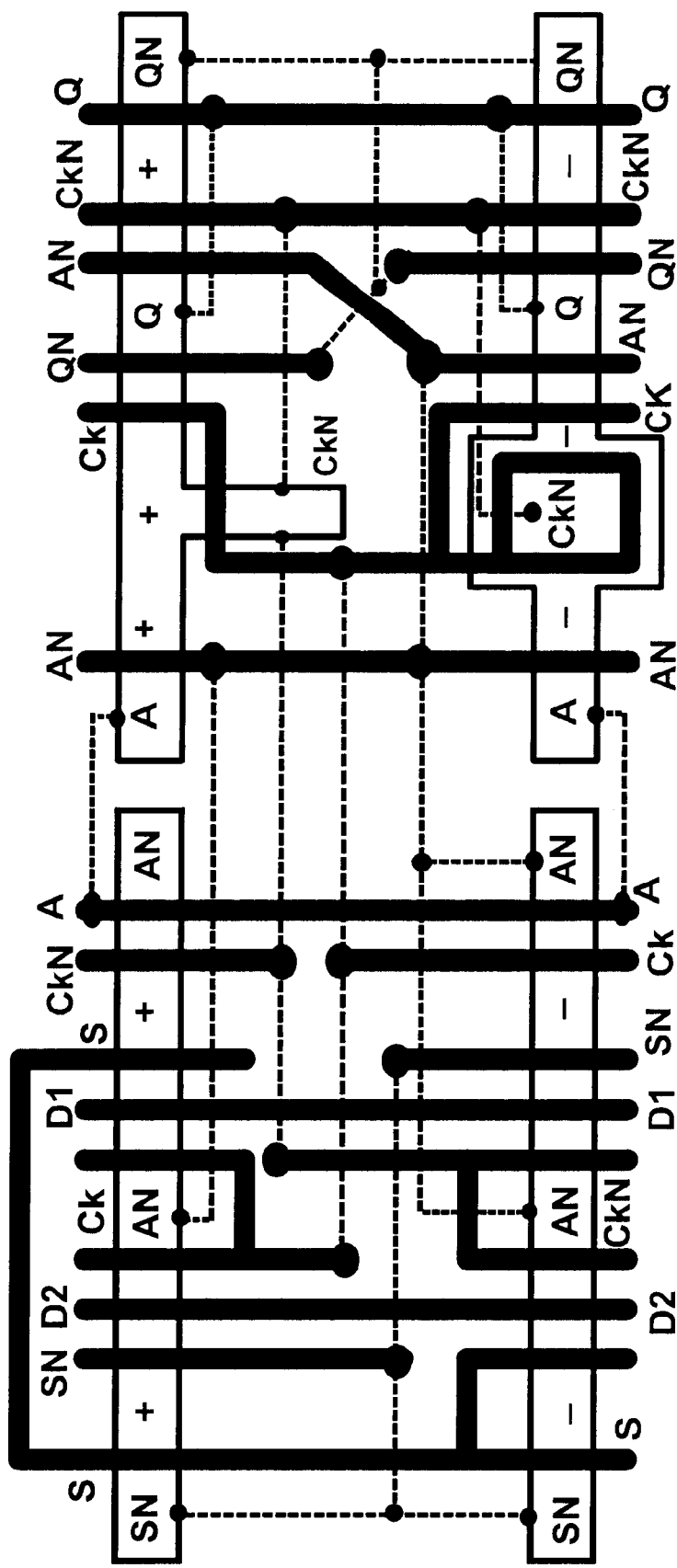
FIG. 38 shows a layout stick diagram corresponding to the scan flip-flop of FIG. 37.

FIG. 34 shows a layout of a symmetric-serial edge-triggered D flip-flop similar to the layout of FIG. 33F, but with the addition of coincident clock generator technology for a fast critical edge clock inverter configuration. An actual layout corresponding to the stick figure diagram of FIG. 34 is shown in FIG. 35. An important element of the coincident clock generator technology is implemented in the center of the row of n-channel transistors (the lower active area rectangle) as a square ring of poly 251, forming minimum drain diffusion (area in the center of the "donut") per transistor strength (effective width around the ring) along with a minimal p-channel inverter pull-up. This square-shaped transistor 251 is identified as M29 in the symmetric-serial schematics of FIGS. 31, 36, and 37. FIG. 31 shows a symmetric-serial edge-triggered D flip-flop with negative-edge clock input buffer, and Qx4 output buffer. FIG. 36 shows a symmetric-serial edge-triggered D flip-flop with negative-edge clock input buffer, Qx4 output buffer, and asynchronous-active-low reset. FIG. 37 shows a symmetric-serial scan edge-triggered D flip-flop with negative-edge clock input buffer, and Qx4 output buffer. FIG. 38 shows a layout stick diagram corresponding to the scan flip-flop of FIG. 37. Note the high density that may be achieved in the master scan latch in the left third of this flip-flop cell. There is a strong demand to use scan flip-flops to facilitate integrated circuit testing, but their use has been resisted due to previously inefficient structures and poor performance, which are overcome by the techniques described herein.

The fast n-channel transistor is complemented with a normally minimum p-channel pull-up device (M30) with a low drain diffusion parasitic capacitance and, due to its size, a minimal Miller load capacitance back to the input clock-driving signal through this p-channel transistor. The phase hookup of the clock inverter (clock true inverted to clock false) is important because the inverted signal uses the inherently stronger n-channel pull-down transistor to make the critical active low-going edge of the inverted clock signal CkN catch up to its slower input clock signal Ck at the decisive switching voltage (about the middle of the power supply voltage). The donut transistor is not new, but its purposeful use here to maximize the speed of the clock's critical edge speed and increase the device ratio for the clock inverter is decisive. This highly ratioed inverter not only transitions fast in the desired direction and has a minimal load capacitance on its output, but the inverted clock starts early due to the offset of its transfer function towards the stronger device. FIG. 26B illustrates this early start characteristic.

Figure 39A:
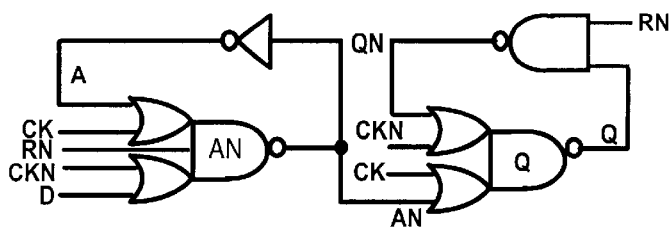
FIGS. 39A through 39E show, for the flip-flop of FIG. 36, the p-channel gate logic, a layout-preparatory transistor schematic, the n-channel gate logic, a layout stick diagram, and a layout example, respectively.
Figure 39B:
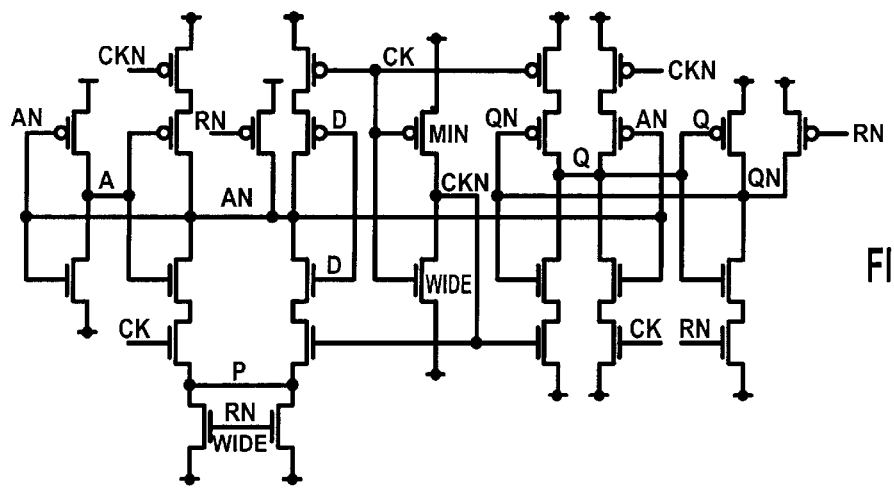
Figure 39C:
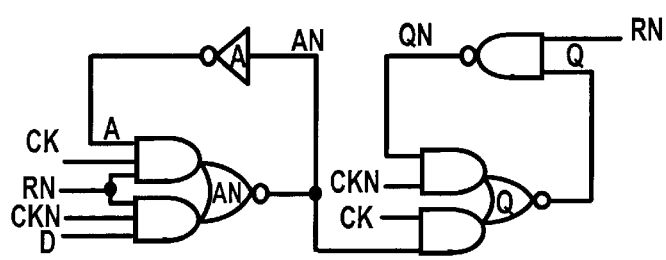
Figure 39D:
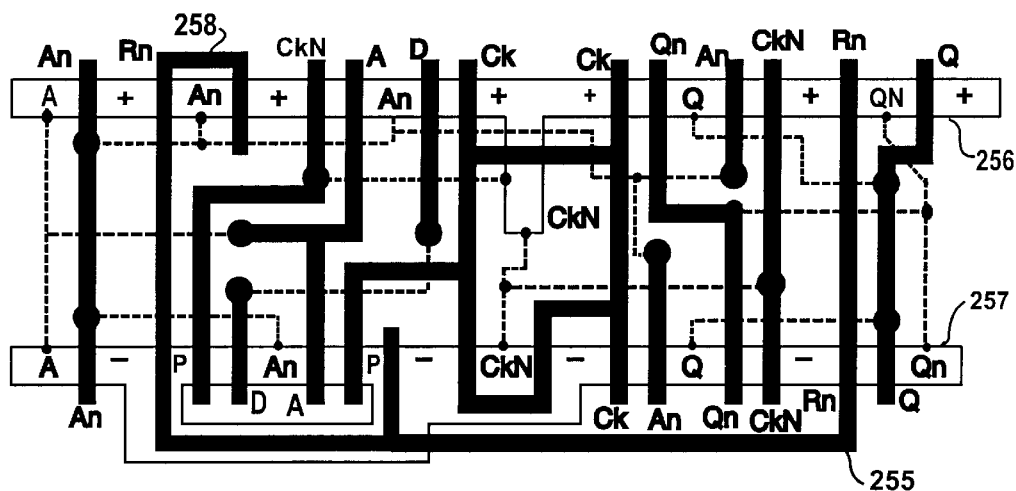
Figure 39E:
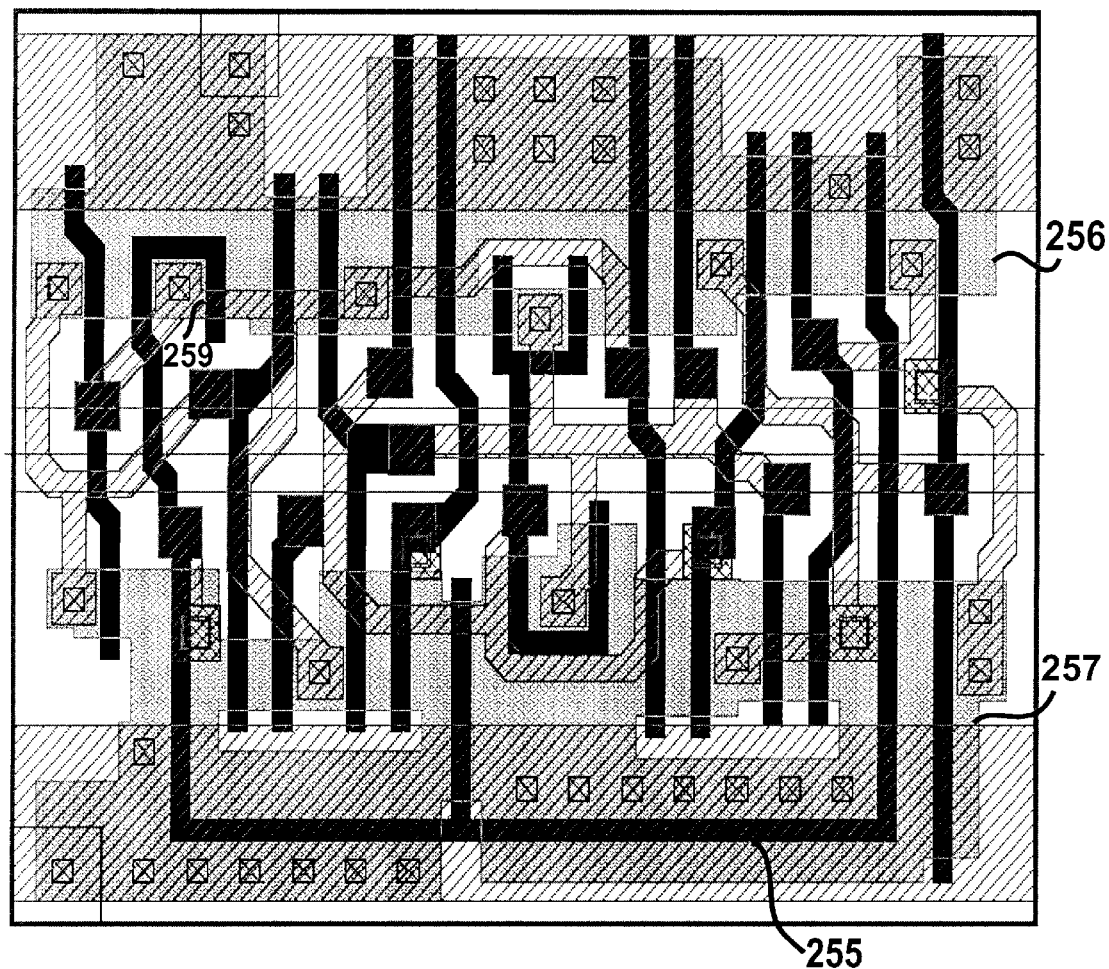

There are also alternative configurations of this clock's critical edge strong transistor switch, such as U-shaped and L-shaped layouts, as noted above. An example of these alternatives is in FIGS. 39D and 39E. FIG. 39D shows a layout stick diagram and FIG. 39E shows an actual layout, similar to that of FIG. 34, but with the addition of an asynchronous-active-low-reset. FIG. 39A shows the p-channel gate logic for this flip-flop; FIG. 39B shows a transistor schematic (essentially a redraw of FIG. 36), FIG. 39C shows the n-channel gate logic. Referring to FIG. 39D, what is shown is layout stick diagram of a symmetric-serial edge triggered D flip-flop with a coincident clock inverter, asynchronous-active-low-reset, and no set.

FIG. 39E shows a layout example. This flip-flop has a large, shared reset control, identified as the long horizontal poly 255 running along the bottom and forming a large "W" shape. Transistors are formed by the poly being formed over the active areas 256 and 257. The large "U" shape of the lower left half of the layout provides a maximal transistor width (strength) used to transfer the power supply connection to the lower n-channel portion of the master latch complex-gate identified in the schematic. Thus, a signal that is static or arrives early is placed closest to the power supply in a series string and is made wide by combining like transistor drains in the layout, to effectively transfer power to the active circuitry.

The lower right horizontal segment plus the lower right-most vertical leg of this reset poly 255 form transistor M33 of the slave latch feedback NAND gate, which strengthens the Qn inverted output of this cell. When the layout of FIG. 39E is compared to the corresponding layout without the reset (FIG. 35), the master complex-gate on the left is connected directly to the lower power supply rail as with its slave latch feedback inverter (equivalent to the NAND gate). Note the contiguous n-channel active area 257, and that the p-channel active area 256 is enabled to be partially contiguous by bending the master latch feedback NAND gate's reset into an inverted "U" shape 258. This makes the master latch complex-gate effectively contain four branches instead of the actual three. In at least one embodiment, this finished cell has a width of 13 Metal-2 tracks.

In order to facilitate a minimal width p-channel device in the coincident clock generator technology, the contiguous p-channel active area may be broken to optimize the cell layout. Otherwise, an extended structure such as in FIG. 39D or a two-finger, fork-shaped, clock inverter p-channel transistor may be used to facilitate contiguous p-channel active area, in a manner similar to transistor A in FIG. 21. This would make the p-channel active area contiguous.

Figure 40:
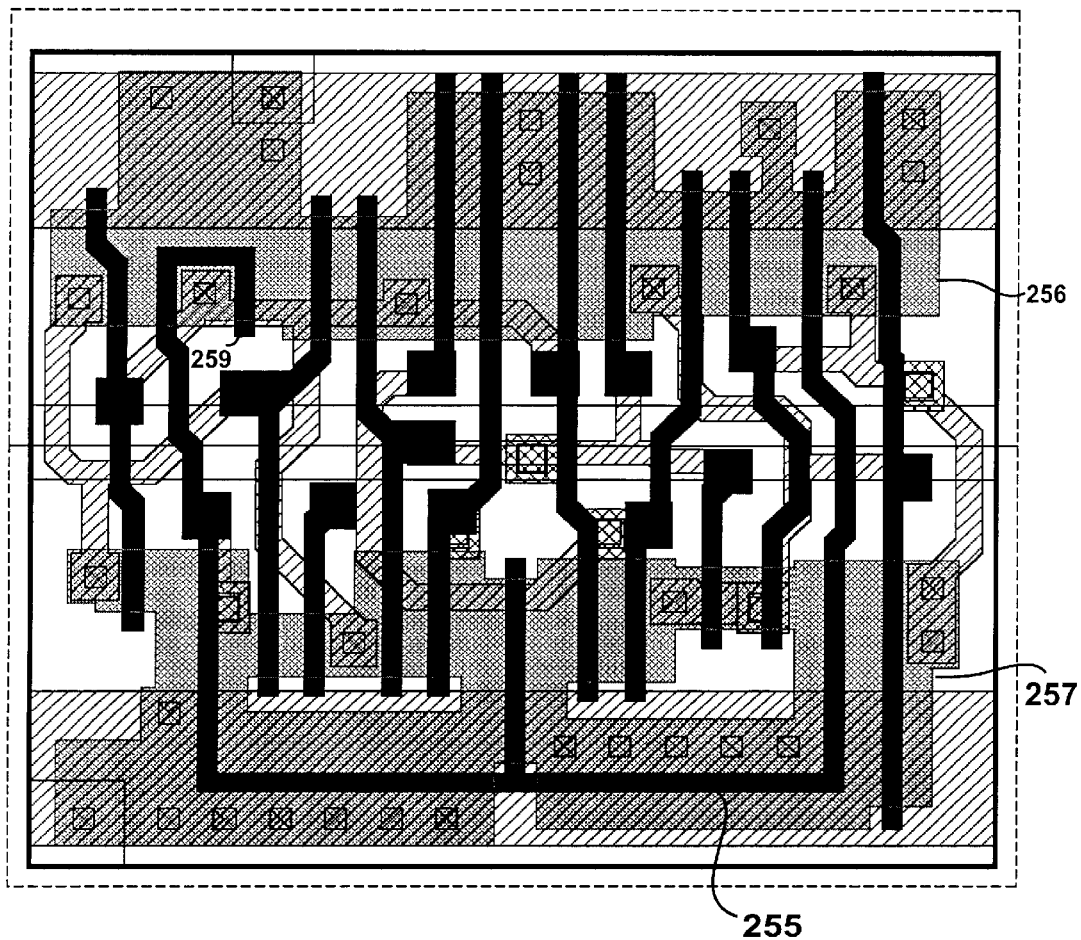
FIG. 40 shows a symmetric-serial edge-triggered D flip-flop layout variation of the layout of FIG. 33F, with an asynchronous-active-low-reset.

FIG. 40 shows a flip-flop similar to that of FIG. 33G, but in which an asynchronous-active-low-reset has been added. Thus, FIG. 40 shows a symmetric-serial edge-triggered D flip-flop layout without the coincident clock generator technology, asynchronous-active-low-reset, no set and no output buffer. Again, note the contiguous n-channel active area and the fact that the p-channel active area has only one break in its active area. Note also the transfer of power to the active logic through the inclusion of a normally ON wide reset transistor (the long "W" shaped formation of poly at the bottom of the layout), such as also seen in FIG. 39E.

With a single break in p-channel active area 256 in FIG. 40, the p-channel array of transistors would be longer than the n-channel contiguous string of transistors. To avoid such a break, an inverted "U" shaped finger of poly 259 is used (see also poly 258 in FIG. 39D) to form the p-channel transistor M10 with power active area on either side, as well as on top; this configuration facilitates contiguous active area on the p-channel transistor layout. The flip-flop parasitics are lowered and the cell width is reduced as a result;

and in this case this contiguous p-channel active area eliminates an entire metal two track for narrower finished cell width 12 metal two tracks. The cell width and height are quantized to the pitch of the routing metal via connection pads and an adjacent pass through route, so that integrated circuit routers use these cells. This U-shaped transistor configuration as well as "donut" transistor configurations have the effect of an even number of transistors for a single transistor in the schematic, and in this serial compaction technology, such transistor configurations can be used to convert from an odd number of branches in a complex-gate section to an even number of branches. Note the contiguous n-channel active area and that the p-channel active area can be made contiguous by bending the master latch's complex-gate p-channel reset transistor into an inverted U shape, to make an effective even number of p-channels in it.

FIG. 15 shows a high-performance, edge-triggered, race-free, data flip-flop with asynchronous reset, single-phase clock, and 4× strength output buffer, which implements many of the techniques described above. This flip-flop contains a fast clock, fast output, sharp setup and hold, and contiguous active area technologies. An integrated circuit cell layout for this flip-flop is shown in FIG. 16B in stick diagram form, and FIG. 16D shows an actual layout example. The layout has the transistors sized for high speed within the low cell height profile.

FIGS. 32A through 32C illustrate a technique for arranging transistors to convert a schematic to a compact layout, as explained above. Specifically, FIGS. 32A through 32C show modified schematic representations of the circuit of FIG. 15 that may be used to facilitate cell layout. The schematic of FIG. 15 has been rearranged to represent the initial reduction to layout of the basic transistor source-drain hookup with the poly gates positioned for later hookup. FIG. 32A is a schematic of only the p-channel sequence of transistors. FIG. 32B is the complete redrawn schematic, in which the transistors have been rotated to a horizontal orientation and adjacent power terminals have been connected together to form two linear rows containing the n-channel and p-channel transistors, respectively. FIG. 32C is a schematic of only the n-channel sequence of transistors. Thus, in the layout design process, first the logic gates from the schematic are arranged in a linear row in an order that places a maximum number of like gate signals near or next to each other such as R, Ck, and A signals in this illustration. Branch pairs provide for shared power on both sides. In this layout sequence, two inverters or gates, with an odd number of branches, are selected to be placed on the outside ends of this linear sequence of transistors while the remaining (Qx4) inverter transistors are doubled to formulate it with an even number of branches. U or donut-shaped transistors are used for this if high drive strength is desired.

The advantage of the use of a U-shaped transistor in the layout can be seen in FIGS. 39D and 39E as the conversion to even number of p-channel branches for a contiguous p-channel active area. In FIGS. 32A through 32C, note that the Q4 output inverter is drawn as double transistors in these linear rows and the Q inverter (containing an odd number of branches in a logic element) is drawn on the right end. This figure includes the auxiliary reset NAND gate driving circuit node "A" on the left end and results in a layout cost of one additional track cell width to obtain a lower power, and faster reset. Logically, only the reset in the clock and NAND gate (ClkNB) is required to perform reset. The power connection on the lower left n-channel linear string of transistors can be bent down towards the lower power supply to which it is connected. The metal interconnect for the gate output straps are shown in the middle part of this figure to envision the gate outputs that are to be connected to gate inputs later.

FIG. 16B, as noted above, is a stick diagram representing a layout that may be used for this flip-flop. The goals include 1) to keep both the n- and p-channel active areas contiguous, then 2) to make the maximum direct poly connections between adjacent gates, and 3) to align gates on the opposite active area, followed by 4) making efficient metal hookup of the gate outputs, while 5) making connections from these outputs to the poly gates. Frequently there are choices, and various steps are iterated to find the best solution. Occasionally the later steps do not work well, and earlier steps are modified to arrive at the best solution. The result of this and the branch transistor considerations makes an efficient serially compacted cell. Final connections are made by bending the metal and poly gates around to make all the connections form gate output metal straps to the poly gate nodes. Poly remains the dominant vertical connection media, and metal remains the dominant horizontal media. Since the maximum number of horizontal metal lines at the widest vertical stack defines the finished cell height, and the maximum width of the active area defines the finished cell width, these are important considerations in choosing the layout topology. This "stick" diagram may be used to initially map the cell for geometric layout to the design rules for the semiconductor process in which it will be fabricated. The transistors are sized when making the layout and optimized through circuit simulations that include the parasitic capacitances.

Note that the switched components of the flip-flop are responsible for the capacitive power dissipation and form the speed limiting parasitic capacitances that define much of the switching speed of the various flip-flop circuit nodes. The other part of the RC (or current-capacitance IC) speed product comes primarily from the individual transistor drive strengths. These contain a simultaneous combination of several unique features obtained through Serial-Device-Compaction methodology.

FIG. 19 shows a schematic of a low-power, edge-triggered, race-free, data flip-flop with asynchronous-reset, asynchronous-active-low set, buffered active-low edge single-phase clock, and 2× strength output buffer. This flip-flop also contains a fast output and embodies serial device compaction techniques. A corresponding cell layout is shown in FIGS. 20B and 21. The features of this embodiment include the following:

1. This is a low power flip-flop, due to the minimal width of all its transistors.

2. Both active areas are still contiguous, as seen by the lack of breaks in either the n- or the p-channel active areas. This is so even with the additional complexity of the flip-flop cell logic that includes asynchronous-set, asynchronous-reset, race-free logic, active-low edge clock input buffer, and output buffer,.

3. The active area widths generated by the strings of n- and p-channel transistors are nearly equal, so that cell width is fully utilized and kept to a minimum.

4. Even though the flip-flop contains the additional logic of both an asynchronous-reset and set, there are no more than two series transistors between any circuit node and either power supply.

5. The switched active area between adjacent transistors can be kept at the design rule minimum to minimize diffusion capacitance and minimize cell area and complexity.

6. The diffusion on each of the internal logic gate outputs can be kept at a minimum so as to reduce the switched parasitics while decreasing cell complexity and area.

7. Many of the transistors are kept adjacent so that the poly gates are joined together in a fork configuration for minimizing interconnect area of these transistors.

8. The serially compacted logic structure enhances direct poly gate interconnect, so that nearly all of the gate connections are made without going up to a metal layer through additional contacts. A contact from metal to diffusion and a contact from metal to poly are necessary; however, additional contacts for metal jumpers from one poly to another poly normally add routing complexity and area for the additional poly contact pads. The tradeoff is optimum order of series transistors to added interconnect. Reversing the order of series transistors from their optimum typically has about a 5percent speed penalty.

A layout of a very fast edge triggered D flip-flop of this technology is illustrated in FIG. 33G. It may be the most reduced form of the serial device compaction design methodology applied to flip-flops. Due to its clean structure, this flip-flop occupies a nearly square area that is about 2.5 times that of an ordinary logic gate's cell area as compared to the standard two-input NAND gate, shown on the right side of the layout of FIG. 33G. The order of the serial MOS transistors in FIG. 33F provides very high-speed operation. Its high speed is useful for frequency pre-scalars. At high frequencies, where power dissipation is important, this flip-flop uses a minimal amount of energy to toggle. This flip-flop has its drive strength stepped (or tapered) for minimum delay while having moderately high strength output MOS transistors so the flip-flop can drive a moderate or local load without the addition of output buffer stages. The clock inputs are set up to use the complimentary Q and Qn outputs of preceding pre-scalar stages. The maximum frequency operation can be extended if the first, or highest frequency stage, has its clock derived from a complimentary clock driver that provides coincident complimentary transitions to the flip-flop.

A variation of this flip-flop of FIG. 33F, with a simple fast and efficient clock inverter embedded into it, is illustrated in FIGS. 34 and 35. The clock inverter has asymmetrical drive of a minimal p-channel transistor and uses an enclosed-drain (or donut) MOS n-channel transistor in it. This provides nearly equal flip-flop output pull-up and pull-down delay characteristics. Power dissipation is also minimized with the minimum drain diffusions and the clean layout enabled by the serial device compaction design.

A low voltage version of this minimum flip-flop can be the same, except with minimum width n channel devices and about 2× wide p-channel devices. This provides somewhat symmetric drive at low voltages. This flip-flop performs well at very low voltage, since there are effectively only two series MOS devices to either power rail, a simple internal structure, and no pass (or transmission) gates that lose their gate drive voltage swing at low voltages. Transmission gates generally require an extra threshold voltage in series with the supply to provide the same drive as a normal gate MOS transistor configuration.

An extremely low-power version of this flip-flop has an additional reduction of its p-channel MOS device widths to the minimum allowed design rule dimension. Here symmetric rise and fall times are traded for the minimum-switched capacitance gate and drain areas. This characteristic along with the clean layout structure reduces switched capacitance to the minimum and reduces the junction diode leakage areas to a minimum.

FIG. 36 illustrates the schematic of a practical resetable version of this flip-flop. In most logic circuits, the reset is required to make the circuit testable. The reset Rn is used to easily put a logic circuit into a fully known state to begin testing. A layout corresponding to FIG. 36 is shown in FIG. 40. An important element in this reset is a wide n-channel MOS transistor 255 that joins the two n-channel MOS transistor legs to power. The very wide MOS devices look like an extension of the power supply to the circuit's complex-gate master latch. Note that the slave latch's critical complex-gate does not receive the reset signal Rn. The interstage drive is stepped to provide the minimum interstage delay of the critical logic signal edges.

Some embodiments of these flip-flops do not exercise all their input capabilities. For these applications, the unused transistors can be eliminated, and the flip-flop design is optimized for the application. Eliminating unused elements of the cell yields reduced versions of the flip-flop. One example is a toggle flip-flop that does not use a data input; here the data input can be tied to Qn within the flip-flop cell. Other examples include logical one-shots, clock synchronizers, phase comparators, etc. In a one-shot embodiment, the data input D is tied to a logic one and the asynchronous reset is used to return the flip-flop to its reset state. This allows the one-shot to pick up the first clock and ignore additional clocks, and then be cleared for the next operation through the asynchronous-reset. An example of a D flip-flop configured as a one-shot (D=1) is shown in FIGS. 44A through 44D which show, respectively, the p-channel gate logic, a transistor schematic, the n-channel gate logic, and a layout stick diagram. Note that the asynchronous reset RN directly pulls the output driver up, while the clock CK directly pulls the output driver down-this reduces gates delays in comparison with a conventional implementation.

A number of features of the above-described flip-flops and the logic circuits described below combine to form an efficient high speed, high performance edge-triggered storage device. To summarize, these features include the following:

1. The initial flip-flop-output is driven with a minimal number of series wide, strong, and balanced MOS switches. With all the functionality of the flip-flop, there is only a single series-switching device that pulls the slave latch output up to logic 1. This pull-up device is the inherently weaker of the two devices and sets the limiting condition.

The pull-down function consists of two series switching devices that pull the output down to logic 0. This is a good compliment, since technologies up to now produce pull-down-switching device that is about twice the strength of the pull-up switching devices.

This initial fast inverted output uses only a single inverter to implement a buffered output.

2. The series combination of MOS switches is ordered in a manner that best enhances flip-flop speed and minimizes switching power. Concurrently, this series arrangement of MOS switches enables efficient layout of the flip-flop cell. There are no breaks in either the n- or p-diffusion active areas, the length of horizontal stacks of transistors are about the same for both n and p-channel transistors, and gate outputs take only a single contact pad size square of diffusion. With this, the poly gate connections are direct, the active diffusion is minimal, and the metal interconnections are minimal.

3. The most-active transistors, which have the function of moving data into the flip-flop and moving data out of the flip-flop, are normally located closest to their output node. The least active transistors, which are used to initialize the flip-flop, are located closest to the power rails of the flip-flop. The reset and set transistors are located off the critical path, where they have the function of supplying power to the internal devices of the flip-flop logic or logically pulling on internal circuit nodes out of the way of the critical current paths. The other switches, which are used to hold the flip-flop internal data, are located between these other switching devices in the flip-flop. This provides a reasonably strong output drive without the need for external buffers. This output drive satisfies the typical use of the flip-flop where the output and. interconnect loading requirements are moderate. When high output drive capability is required, output buffers are added internally to prevent the flip-flop being slowed down by overloading its drive capability. This buffering is used with any other highly loaded logic cells, except that this raw flip-flop pre-buffer output drive is about twice as strong as seen in equivalent ordinary flip-flops due to the single p-channel output pull-up. This helps keep the flip-flop clock to output delay short. FIGS. 15 and 16B show a flip-flop schematic and layout with a moderately large output buffer included internally. This flip-flop high internal drive capability also enables the use of a larger than normal output buffer size to keep its speed high.

4. FIGS. 32A through 32C illustrate a technique for arranging transistors to convert a schematic to a layout, as explained above. The methodology shown in FIGS. 32A through 32C provides an excellent opportunity to achieve a tight, clean layout.

5. The flip-flop output is driven with balanced strength (to the first order) MOS switches.

6. There are a maximum of two series transistors between any circuit node and its respective power supply. This keeps the node drive strength high while using smaller-width transistors, and works well at lower power supply voltages.

7. The MOS switching devices inside the flip-flop are progressively wider as the signal is carried from the input to the output drive transistors. They are "tapered" so that they operate in the highest overall speed and low power efficient manner. This also reduces the cell area. In FIG. 16D, the layout of the fast version of this flip-flop illustrates this feature. Various critical internal transistors as well as the output buffer are wider for fast performance in various modes of operation.

8. Setup and hold time responses are matched so that there is not a loss of time between them, with a sharp decision time window to prevent a bias to one direction. The signal somewhat equivalent to the inverted clock signal (CkNB) is designed to cross the incoming clock signal (Ck) at the center of the active region of their signal transitions by ratioing the clock inversion logic gate. This ratio is reverse of the normal wider p-channel pull-up, and requires very small width p-channel pull-up transistors (M28 and M30) with wide n-channel pull-down transistors (M27 and M29).

9. When both asynchronous-reset and asynchronous-set are included, the flip-flop is designed to have the reset input dominate the set input, so that coincident set and reset input signals are defined as a reset function instead of a not-allowed signal. Thus, the flip-flop takes the reset signal as priority over the set signal. If, however, the end of the set input continues after the reset input, the flip-flop will switch to the set condition. If the reverse response to a set condition is desired, the flip-flop data can be used in an inverted state, or only the connection priority of the reset-pulling and set-pulling devices have to be reversed in some of these flip-flop realizations.

10. In a reduced device count version of this technology, this race-free flip-flop is reset at a single point by controlling only the output of the race-free NAND gate. A low logic signal on this CkNB signal directly turns on the single p-channel transistors (M14 and M8) of both the master and slave latches. Since both latches contain inverted data at this point, the flip-flop is reset. This method of resetting the flip-flop requires a ratio in the master latch keeper portion that enables CkNB (M8) to overpower Ck/A (M7 and M5) to clear the master latch feedback signal. Here M8 is wider.

11. The flip-flop consumes a very small integrated cell area. There are several interrelated reasons that is so, which are mentioned above.

12. Lower height cell layout and narrower cell width are achieved through the orderly arrangement of transistors using shared source-drain areas, with a maximum amount of contiguous active area, enabling compact interconnect routing within the cell. This enables the use of a lower cell height for the entire library and thus a proportionally smaller integrated circuit chip areas result.

V. Other Logic Circuits

The techniques described above can be applied to many other types of logic circuits, as will now be described.

Latches

Latches may be grouped into several categories, with each category having degenerate sub-structures. Examples of such degenerate sub-structures are those in which reset or set functions or internal scan logic is removed. These structures may also be built upon through incorporation of associated logic to produce latches that are more integrated. An example of this would incorporate a complex-gate addition to the data input or a tri-state output bus driver. For tri-state outputs, single n- and p-channel outputs to drive buses are implemented as in FIGS. 5A through 5C. This provides a maximum bus drive strength with a minimum capacitive load. Although the layouts may not be optimum, transmission gate input stages such as in the strapless flip-flop (FIG. 4) can be used to minimize the loading from the input.

Since both the master and slave sections of the flip-flop are generally latches, the same serial compaction techniques make efficient, fast compact latches. The key features of the master and slave latches are used.

Figure 41A:
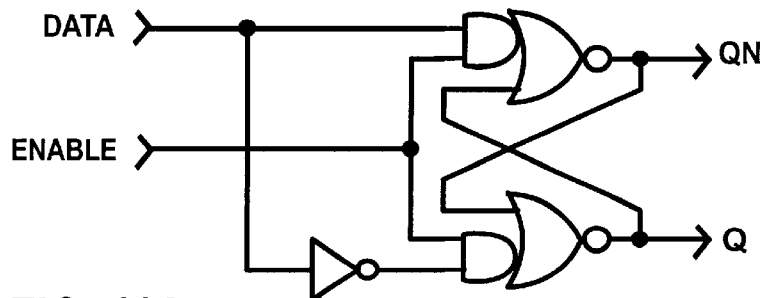
FIGS. 41A and 41B show a transparent latch using serial device compaction on AND-NOR complex-gates.
Figure 41B:
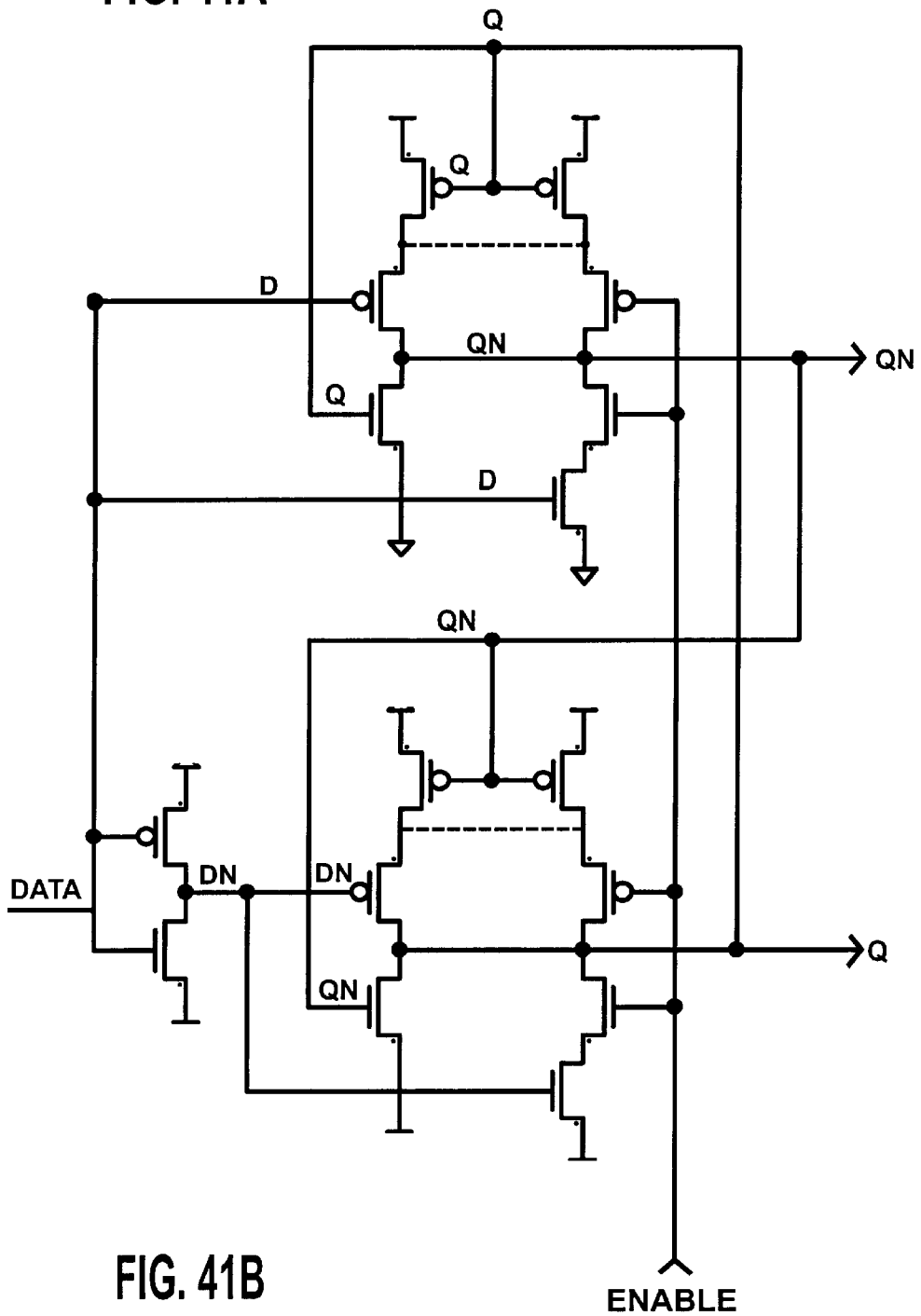
Figure 42A:
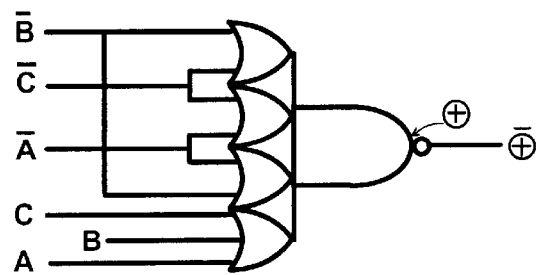
FIGS. 42A through 42D show, respectively, the p-channel gate logic, a transistor schematic diagram, the n-channel gate logic, and a layout stick diagram, of a serially-compacted single-stage three-input exclusive NOR (XNOR) gate.
Figure 42B:
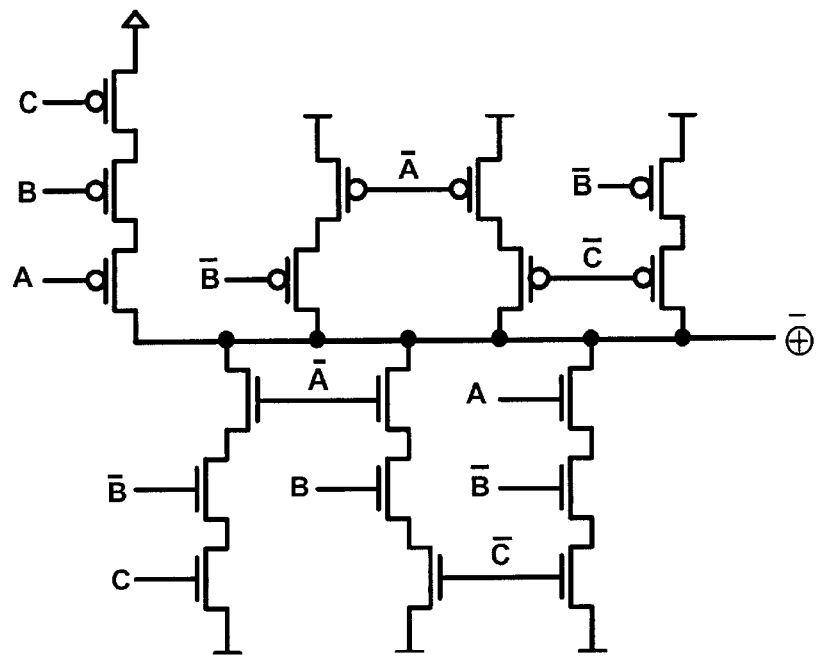
Figure 42C:
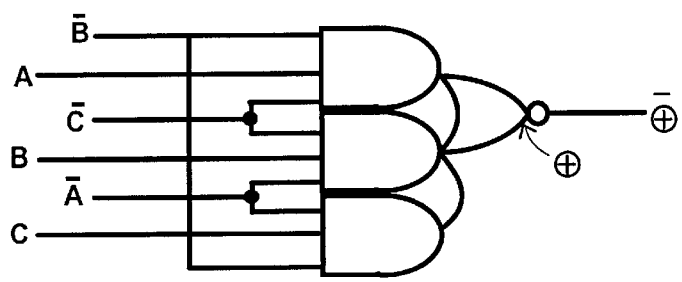
Figure 42D:
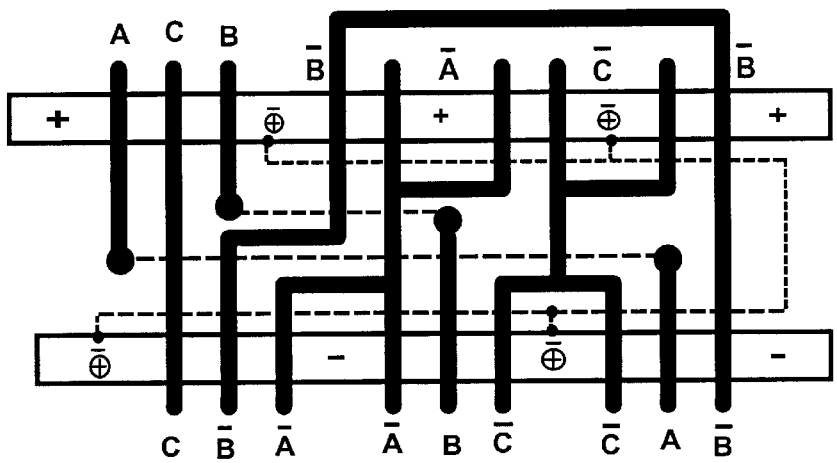

FIGS. 41A and 41B show an example of a transparent latch using serial device compaction on AND-NOR complex-gates. Different serial device ordering reflects different optimizations. Complex-gate Reset and Set functions can be added into the complex-gates of this latch in a manner similar to that of the cross-coupled latches in FIG. 2 above. The broken lines show where a single transistor was broken up into two transistors to form series-only stacks of transistors for serially compacted layouts. If these transistors are kept adjacent to each other in the layout, their gates connect together in a simple U-shape connection. Creating these transistor breakups, arranging the transistors adjacent to each other, and making these compact U-shaped gate connections is a part of this serial compaction technology.

Complex Logic Gates

FIGS. 13A through 13D show a complex-gate embodiment of the serially compacted design, since it has asymmetric pull-up and pull-down devices, and contiguous n- and p-channel diffusions. It has a significantly reduced cell area, lower parasitic capacitance, higher speed than its complex-gate or gate counterpart in FIG. 12E. FIGS. 22A through 22D show another example, which is a majority gate. Note that examples of complex-gates include majority gates and minority gates. Complex-gate examples also include the multiplexer/selector examples shown in FIGS. 23A through 23D and FIGS. 24A through 24E.

Standard Logic Gates

The serial device compaction techniques described herein can also be applied to virtually any type of ordinary logic gate, including gates for performing the functions of AND, OR, NAND, NOR, Inclusive AND, Inclusive NAND, Exclusive OR (XOR), Exclusive NOR (XNOR), parity gates, etc. For example, FIGS. 42A through 42D show, respectively, the p-channel gate logic, a transistor schematic diagram, the n-channel gate logic, and a layout stick diagram, of a serially-compacted, single-stage, three-input exclusive NOR (XNOR) gate. FIGS. 45A through 45D show, respectively, the p-channel gate logic, the n-channel gate logic, a transistor schematic diagram, and a layout stick diagram, of a serially compacted three-input parity gate.

Adders

Figure 43A:
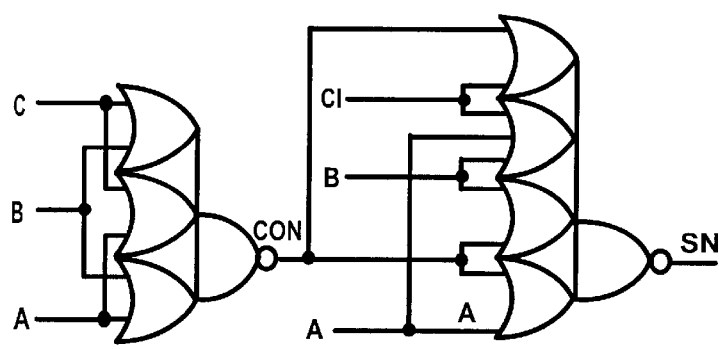
FIGS. 43A through 43G illustrate various embodiments of a serially compacted full adder.
Figure 43B:
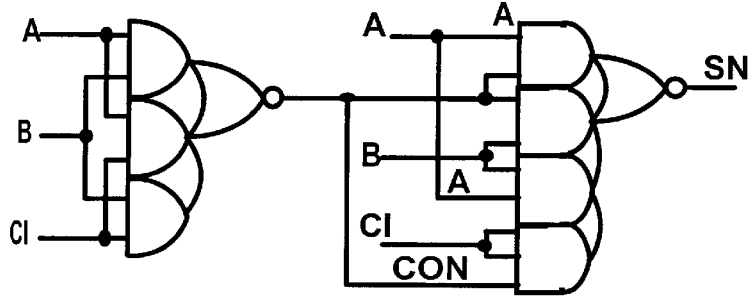
Figure 43C:
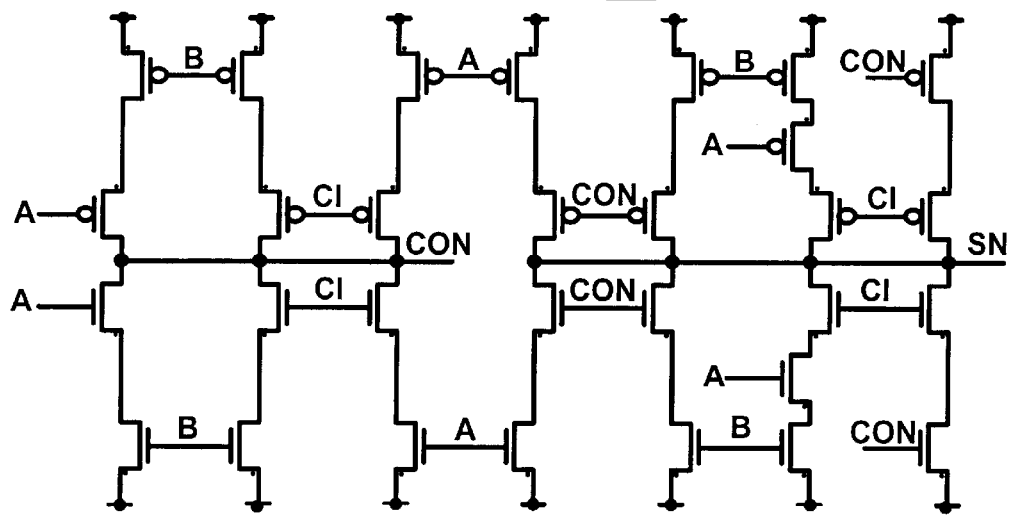
Figure 43D:
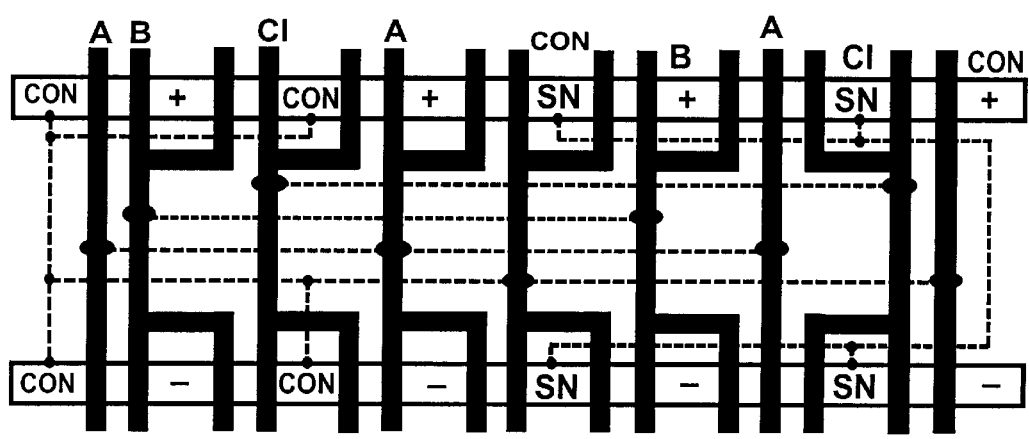

Serial device compaction also has benefits in adder circuits, as illustrated by FIGS. 43A through 43G. FIGS. 43A and 43B are logic diagrams for the pull-up and pull-down portions, respectively, of a full adder having inverted stages. FIG. 43C shows a schematic of a serially compacted embodiment of the adder logic diagrams of FIGS. 43A and 43B. FIG. 43D shows a stick diagram layout that may be obtained for the circuit of FIG. 43C.

Figure 43E:
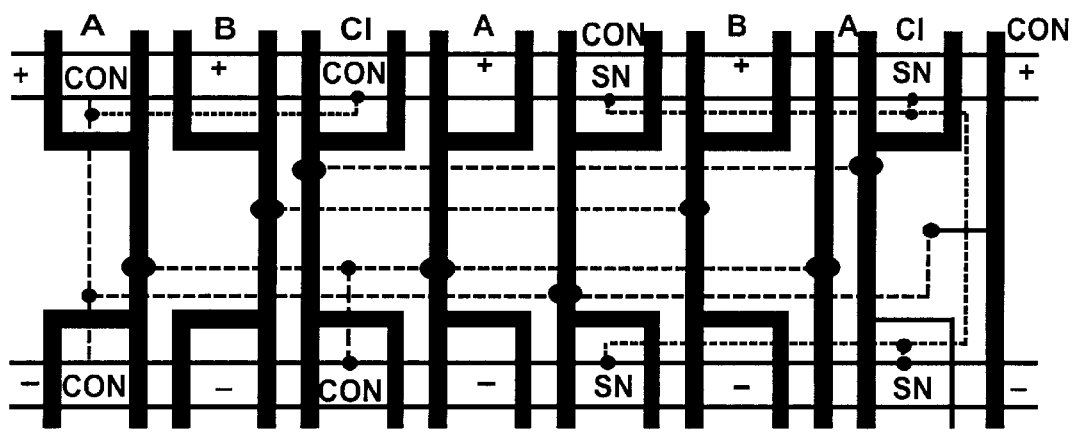
Figure 43F:
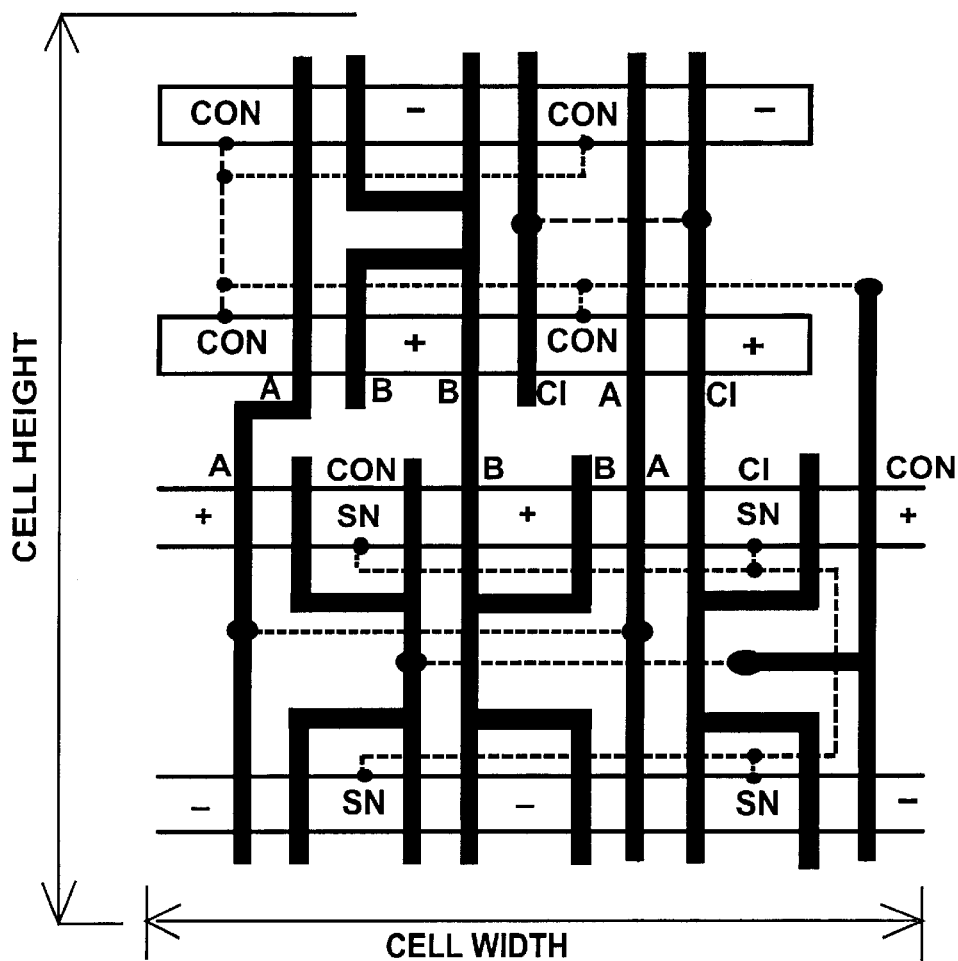

FIGS. 43E and 43F illustrate how serial device compaction can be used to develop a full adder bus structure. Specifically, FIG. 43E shows a layout similar to that of FIG. 43D, but with the addition of an extra finger of poly for the A input and added power contacts at the left side of the layout for sharing power with adjacent cells. This configuration also facilitates modification to the layout of FIG. 43F, in which the left and right halves of the FIG. 43E layout have been stacked on top of one another. Thus, the height of the cell has been essentially doubled while the pitch (cell width) has been narrowed for bus structures. It can be seen that symmetry resulting from serial device compaction provides pass-through poly connection and yields minimal cell height for this arrangement.

Figure 43G:
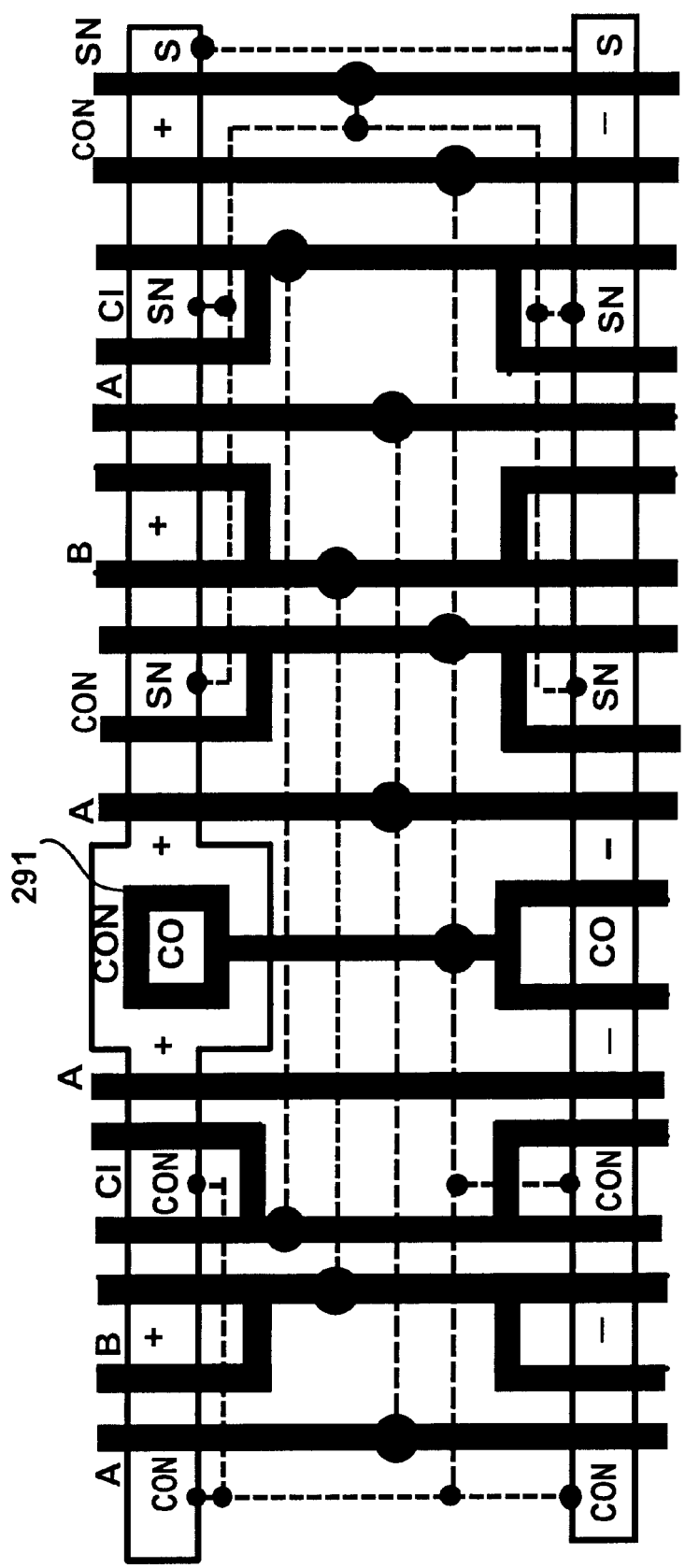
Figure 44A:
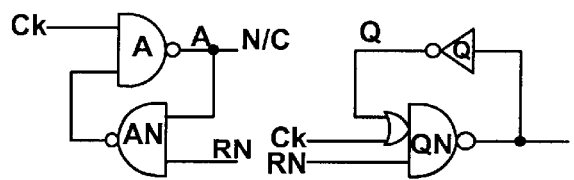
FIGS. 44A through 44D show, respectively, the p-channel gate logic, a transistor schematic, the n-channel gate logic, and a layout stick diagram, for a D flip-flop configured as a one-shot (D=1)
Figure 44B:
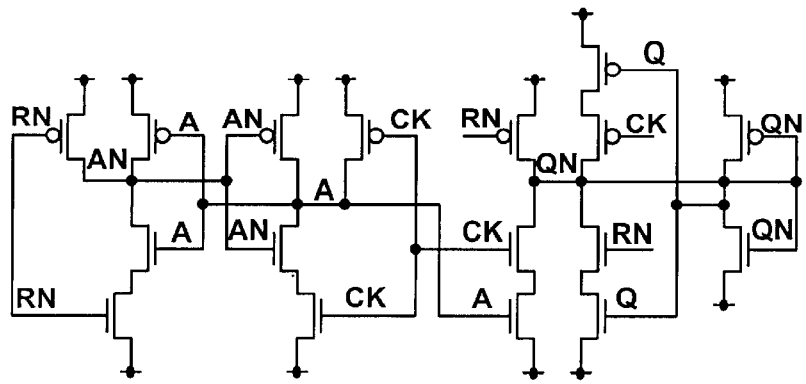
Figure 44C:
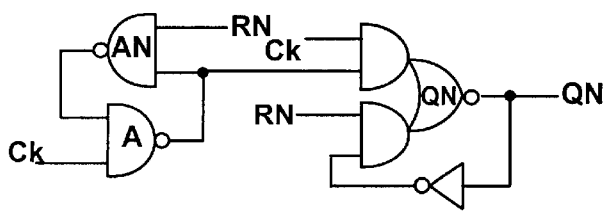
Figure 44D:
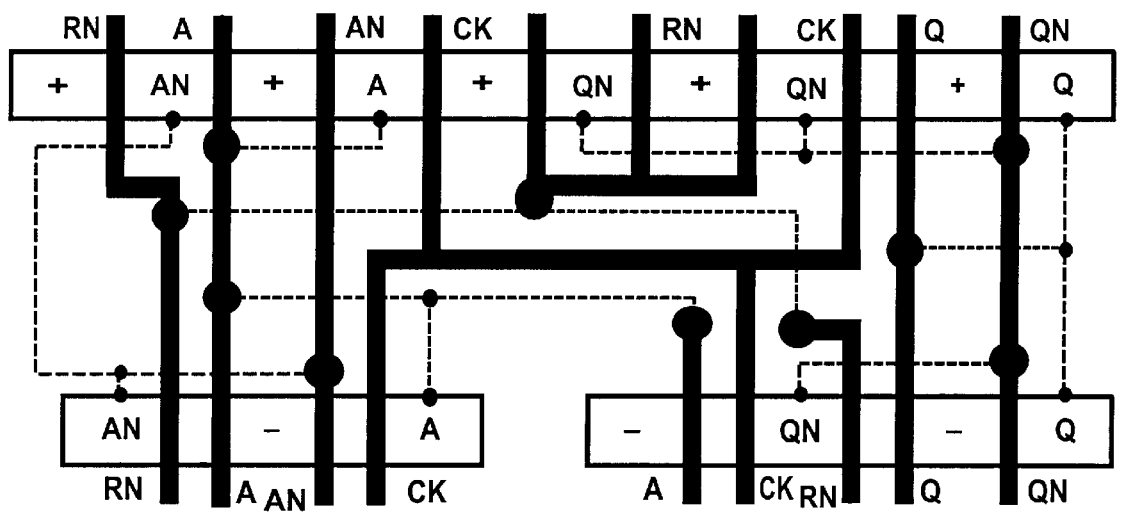
Figure 45A:
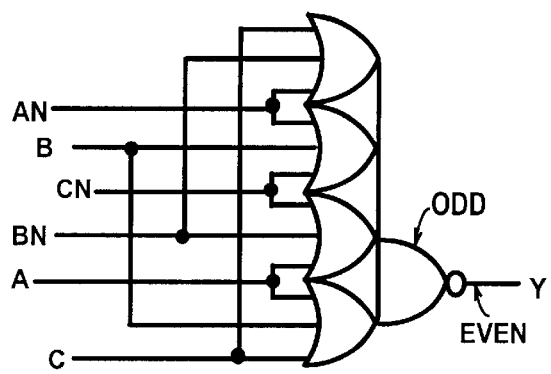
FIGS. 45A through 45D show, respectively, the p-channel gate logic, the n-channel gate logic, a transistor schematic diagram, and a layout stick diagram, of a serially compacted three-input parity gate.
Figure 45B:
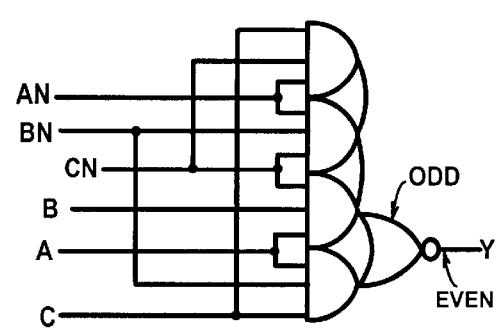
Figure 45C:
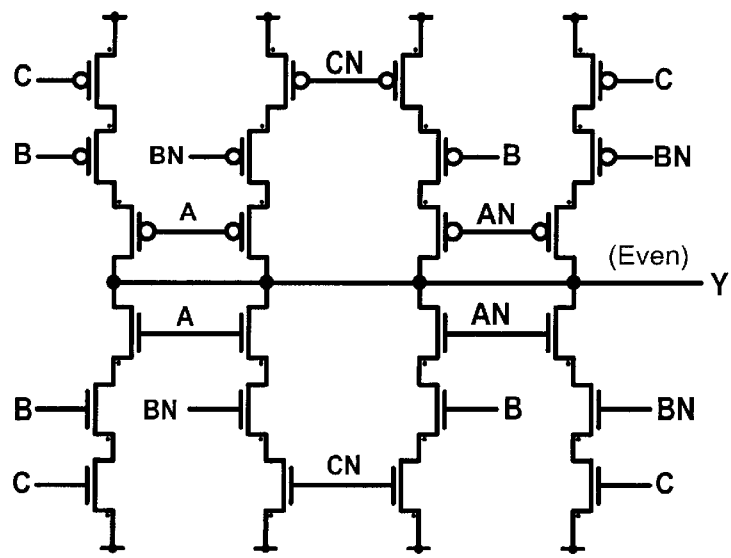
Figure 45D:
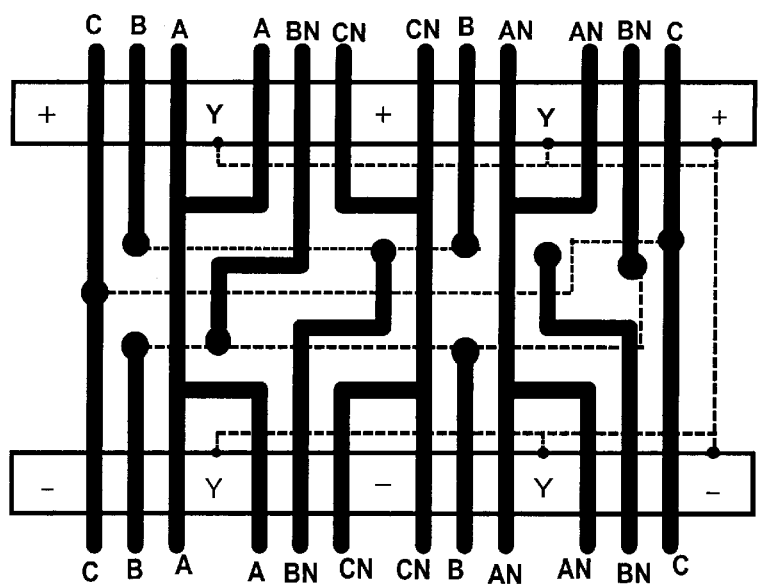

FIG. 43G shows a variation of the above adder layouts which has built-in inverters. Note the "donut" transistor 291 shown at the center for the CO signal, for a high-speed carry out signal.

While the invention is described in terms of preferred embodiments in a specific system environment, those of ordinary skill in the art will recognize that the invention can be practiced, with modification, in other and different hardware and software environments.

What is claimed is:

1. A scan flip-flop comprising:
  a master latch and a slave latch, the slave latch coupled to receive an output of the master latch and to provide an output of the flip-flop, the master latch including an input sample stack, a scan input stack, and a hold stack, the input sample stack including a first plurality of transistors having source-to-drain paths coupled in series between a first supply node and a second supply node, wherein two transistors of the first plurality of transistors share a common source-drain node as an output of the master latch, wherein one of said two transistors is controlled by a scan control input for placing the flip-flop into a scan mode, and the other of said two transistors is controlled by a complement of the scan control input, and wherein another two transistors of the first plurality of transistors are controlled by a first data input of the flip-flop,
  the scan input stack including a second plurality of transistors having source-to-drain paths coupled in series between the first supply node and the second supply node, wherein two transistors of the second plurality of transistors share a common source-drain node as said output of the master latch, wherein one of said two transistors of the second plurality of transistors is controlled by the scan control input, and the other of said two transistors of the second plurality of transistors is controlled by a complement of the scan control input, and wherein another two transistors of the second plurality of transistors are controlled by a second data input of the flip-flop, and
  the hold stack coupled to the output of the master latch.

2. A scan flip-flop comprising:
  a slave latch; and
  a master latch coupled to the slave latch, the master latch including a first plurality of transistors having source-to-drain paths coupled in series in a path from a first supply node to a second supply node, said path including only said first plurality of transistors, a connection between two of the first plurality of transistors forming an output of the master latch, wherein at least one of the first plurality of transistors is controlled by a scan control input for placing the flip-flop into a scan mode and at least one other of the first plurality of transistors is controlled by a first data input of the flip-flop.

3. A scan flip-flop as recited in claim 2, further comprising a hold stack coupled to the output of the master latch, wherein the master latch further comprises a second plurality of transistors having source-to-drain paths coupled in series between the first supply node and the second supply node, a connection between two of the second plurality of transistors forming the output of the master latch, wherein at least one of the second plurality of transistors is controlled by the scan control input and at least one other of the second plurality of transistors is controlled by a second data input of the flip-flop.

4. A scan flip-flop as recited in claim 3, wherein the first plurality of transistors and the second plurality of transistors are mutually exclusive.

5. A scan flip-flop as recited in claim 4, wherein at least one of the first plurality of transistors and at least one of the second plurality of transistors is controlled by a complement of the scan control input.

* * * * *